(12) United States Patent
Yamazaki et al.

(10) Patent No.: US 11,450,691 B2
(45) Date of Patent: Sep. 20, 2022

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi (JP)

(72) Inventors: Shunpei Yamazaki, Tokyo (JP); Kenichi Okazaki, Tochigi (JP); Daisuke Kurosaki, Tochigi (JP); Yasutaka Nakazawa, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 19 days.

(21) Appl. No.: 16/671,223

(22) Filed: Nov. 1, 2019

(65) Prior Publication Data

US 2020/0144305 A1 May 7, 2020

Related U.S. Application Data

(63) Continuation of application No. 15/471,368, filed on Mar. 28, 2017, now abandoned.

(30) Foreign Application Priority Data

Apr. 13, 2016 (JP) .................................. 2016-080066
Apr. 13, 2016 (JP) .................................. 2016-080137

(51) Int. Cl.
  *H01L 27/12* (2006.01)
  *H01L 29/786* (2006.01)
(52) U.S. Cl.
  CPC ........ *H01L 27/1225* (2013.01); *H01L 27/124* (2013.01); *H01L 27/1255* (2013.01);
  (Continued)

(58) Field of Classification Search
  CPC ........... H01L 21/02565; H01L 29/7869; H01L 29/78693
  See application file for complete search history.

(56) References Cited

U.S. PATENT DOCUMENTS

| 5,365,080 A | 11/1994 | Yamazaki et al. |
| 8,330,156 B2 | 12/2012 | Yamazaki et al. |

(Continued)

FOREIGN PATENT DOCUMENTS

| CN | 101783368 A | 7/2010 |
| CN | 102194887 A | 9/2011 |

(Continued)

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(Continued)

*Primary Examiner* — Peter M Albrecht
(74) *Attorney, Agent, or Firm* — Fish & Richardson P.C.

(57) ABSTRACT

To improve field-effect mobility and reliability of a transistor including an oxide semiconductor film. A semiconductor device includes an oxide semiconductor film, a gate electrode, an insulating film over the gate electrode, the oxide semiconductor film over the insulating film, and a pair of electrodes over the oxide semiconductor film. The oxide semiconductor film includes a first oxide semiconductor film and a second oxide semiconductor film over the first oxide semiconductor film. The first oxide semiconductor film and the second oxide semiconductor film, include the same element. The first oxide semiconductor film includes a region having lower crystallinity than the second oxide semiconductor film.

21 Claims, 38 Drawing Sheets

(52) U.S. Cl.
CPC .... *H01L 29/7869* (2013.01); *H01L 29/78696* (2013.01); *H01L 29/78648* (2013.01)

(56) References Cited

U.S. PATENT DOCUMENTS

| | | | |
|---|---|---|---|
| 8,344,387 B2 | 1/2013 | Akimoto et al. | |
| 8,367,489 B2 | 2/2013 | Yamazaki | |
| 8,546,182 B2 | 10/2013 | Akimoto et al. | |
| 8,552,434 B2 | 10/2013 | Akimoto et al. | |
| 8,664,036 B2 | 3/2014 | Yamazaki et al. | |
| 8,785,928 B2 | 7/2014 | Yamazaki et al. | |
| 8,901,557 B2 | 12/2014 | Yamazaki | |
| 8,981,372 B2 | 3/2015 | Yamazaki | |
| 9,035,301 B2 | 5/2015 | Takahashi et al. | |
| 9,064,966 B2 | 6/2015 | Yamazaki et al. | |
| 9,087,726 B2 | 7/2015 | Sato et al. | |
| 9,178,076 B2 | 11/2015 | Tsuruma et al. | |
| 9,184,245 B2 | 11/2015 | Yamazaki | |
| 9,190,527 B2 | 11/2015 | Tezuka et al. | |
| 9,219,165 B2 | 12/2015 | Sato et al. | |
| 9,224,758 B2 | 12/2015 | Yamazaki et al. | |
| 9,245,958 B2 | 1/2016 | Yamazaki | |
| 9,246,011 B2 | 1/2016 | Yamazaki et al. | |
| 9,252,287 B2 | 2/2016 | Yamazaki | |
| 9,293,541 B2 | 3/2016 | Yamazaki et al. | |
| 9,412,876 B2 | 8/2016 | Koezuka et al. | |
| 9,449,819 B2 | 9/2016 | Sato et al. | |
| 9,490,369 B2 | 11/2016 | Yamazaki | |
| 9,496,408 B2 | 11/2016 | Yamazaki et al. | |
| 9,583,601 B2 | 2/2017 | Yamazaki et al. | |
| 9,691,906 B2 | 6/2017 | Takeda et al. | |
| 9,722,054 B2 | 8/2017 | Akimoto et al. | |
| 9,799,290 B2 | 10/2017 | Yamazaki et al. | |
| 9,847,430 B2 | 12/2017 | Yamazaki | |
| 9,881,954 B2 | 1/2018 | Takahashi et al. | |
| 10,014,414 B2 | 7/2018 | Tokunaga et al. | |
| 10,121,903 B2 | 11/2018 | Yamazaki et al. | |
| 10,483,406 B2 | 11/2019 | Yamazaki | |
| 2010/0109003 A1* | 5/2010 | Akimoto | H01L 27/1259 257/43 |
| 2010/0163867 A1 | 7/2010 | Yamazaki et al. | |
| 2011/0141076 A1* | 6/2011 | Fukuhara | H01L 29/78696 345/205 |
| 2011/0215328 A1 | 9/2011 | Morosawa et al. | |
| 2012/0168743 A1* | 7/2012 | Lee | H01L 29/7869 257/43 |
| 2012/0250403 A1 | 10/2012 | Wang et al. | |
| 2013/0161611 A1 | 6/2013 | Yamazaki et al. | |
| 2013/0320337 A1 | 12/2013 | Yamazaki et al. | |
| 2013/0334523 A1 | 12/2013 | Yamazaki | |
| 2014/0034946 A1 | 2/2014 | Yamazaki et al. | |
| 2014/0042434 A1* | 2/2014 | Yamazaki | H01L 29/7869 257/43 |
| 2014/0042436 A1 | 2/2014 | Yamazaki | |
| 2014/0070224 A1 | 3/2014 | Yamazaki | |
| 2014/0113405 A1 | 4/2014 | Tsubuku et al. | |
| 2014/0138674 A1 | 5/2014 | Sato et al. | |
| 2014/0206133 A1 | 7/2014 | Koezuka et al. | |
| 2015/0001533 A1 | 1/2015 | Kuwabara et al. | |
| 2015/0060990 A1* | 3/2015 | Kim | H01L 29/1033 257/324 |
| 2015/0084043 A1 | 3/2015 | Ishihara et al. | |
| 2015/0084044 A1* | 3/2015 | Tanaka | H01L 29/66969 257/43 |
| 2015/0153599 A1 | 6/2015 | Yamazaki et al. | |
| 2015/0187574 A1* | 7/2015 | Le | H01L 29/7869 438/104 |
| 2015/0243738 A1 | 8/2015 | Shimomura et al. | |
| 2016/0079430 A1 | 3/2016 | Yamazaki | |
| 2016/0190232 A1 | 6/2016 | Yamazaki et al. | |
| 2016/0260837 A1 | 9/2016 | Koezuka et al. | |
| 2016/0293641 A1 | 10/2016 | Sato et al. | |
| 2017/0025548 A1 | 1/2017 | Yamazaki | |
| 2017/0033229 A1 | 2/2017 | Yamazaki et al. | |
| 2017/0033238 A1 | 2/2017 | Koezuka et al. | |
| 2017/0256654 A1 | 9/2017 | Yamazaki et al. | |
| 2018/0246257 A1* | 8/2018 | Genier | C03C 3/06 |
| 2019/0326443 A1* | 10/2019 | Suzuki | H01L 29/78693 |

FOREIGN PATENT DOCUMENTS

| | | |
|---|---|---|
| CN | 103681874 A | 3/2014 |
| CN | 103824886 A | 5/2014 |
| CN | 104867981 A | 8/2015 |
| JP | 2011-187506 A | 9/2011 |
| JP | 2013-041944 A | 2/2013 |
| JP | 2014-007396 A | 1/2014 |
| JP | 2014-007399 A | 1/2014 |
| JP | 2014-017477 A | 1/2014 |
| JP | 2014-116588 A | 6/2014 |
| JP | 2014-195058 A | 10/2014 |
| JP | 2014-197664 A | 10/2014 |
| JP | 2014-199918 A | 10/2014 |
| JP | 2015-019094 A | 1/2015 |
| JP | 2015-026828 A | 2/2015 |
| JP | 2015-029087 A | 2/2015 |
| JP | 2015-130466 A | 7/2015 |
| JP | 2016-015485 A | 1/2016 |
| JP | 2016-074580 A | 5/2016 |
| KR | 2011-0100580 A | 9/2011 |
| KR | 2014-0063444 A | 5/2014 |
| KR | 2014-0094448 A | 7/2014 |
| KR | 2015-0099467 A | 8/2015 |
| TW | 201427014 | 7/2014 |
| TW | 201430962 | 8/2014 |
| TW | 201544458 | 12/2015 |
| WO | WO-2013/021632 | 2/2013 |
| WO | WO-2013/024646 | 2/2013 |
| WO | WO-2015/059850 | 4/2015 |

OTHER PUBLICATIONS

International Search Report (Application No. PCT/IB2017/051751) dated Jul. 4, 2017.
Written Opinion (Application No. PCT/IB2017/051751) dated Jul. 4, 2017.
Chinese Office Action (Application No. 201780022620.7) dated Jun. 8, 2021 .
Chinese Office Action (Application No. 201780022620.7) dated Dec. 21, 2021.

* cited by examiner

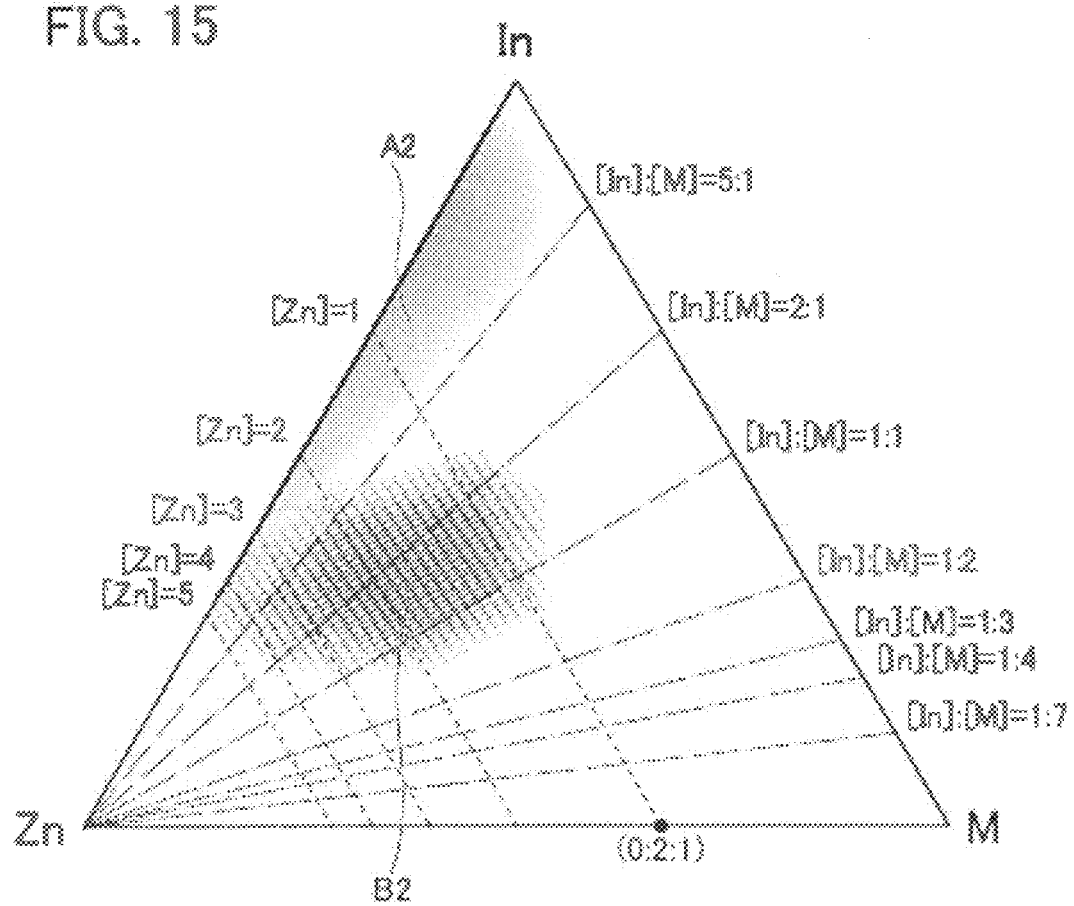

Sample A1

Sample A2

SEMICONDUCTOR DEVICE AND DISPLAY DEVICE INCLUDING THE SEMICONDUCTOR DEVICE

CROSS-REFERENCE TO RELATED APPLICATIONS

This application is a continuation of U.S. application Ser. No. 15/471,368, filed Mar. 28, 2017, now pending, which claims the benefit of foreign priority applications filed in Japan as Serial No. 2016-080066 and Serial No. 2016-080137, both filed on Apr. 13, 2016, all of which are incorporated by reference.

TECHNICAL FIELD

One embodiment of the present invention relates to a semiconductor device including an oxide semiconductor film Another embodiment of the present invention relates to a display device including the semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, and a composition of matter. In particular, one embodiment of the present invention relates to a semiconductor device, a display device, a light-emitting device, a power storage device, a storage device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are embodiments of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

BACKGROUND ART

As a semiconductor material that can be used in a transistor, an oxide semiconductor has been attracting attention. For example, Patent Document 1 discloses a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range of a homologous series. For example, in the solid solution range of the homologous series when m=1, x ranges from −0.33 to 0.08. In the solid solution range of the homologous series when m=2, x ranges from −0.68 to 0.32.

REFERENCE

Patent Document

[Patent Document 1] Japanese Published Patent Application No. 2014-007399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315.

DISCLOSURE OF INVENTION

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and current flows through the transistor.

Furthermore, in a transistor that uses an oxide semiconductor film in a channel region, oxygen vacancies which are formed in the oxide semiconductor film adversely affect the transistor characteristics. For example, oxygen vacancies formed in the oxide semiconductor film are bonded with hydrogen to serve as carrier supply sources. The carrier supply sources generated in the oxide semiconductor film cause a change in the electrical characteristics, typically, shift in the threshold voltage, of the transistor including the oxide semiconductor film.

When the amount of oxygen vacancies in the oxide semiconductor film is too large, for example, the threshold voltage of the transistor is shifted in the negative direction, and the transistor has normally-on characteristics. Thus, especially in the channel region of the oxide semiconductor film, the amount of oxygen vacancies is preferably small or the amount with which the normally-on characteristics are not exhibited.

In view of the foregoing problems, an object of one embodiment of the present invention is to improve field-effect mobility and reliability of a transistor including an oxide semiconductor film Another object of one embodiment of the present invention is to prevent a change in electrical characteristics of a transistor including an oxide semiconductor film and to improve reliability of the transistor. Another object of one embodiment of the present invention is to provide a semiconductor device with reduced power consumption. Another object of one embodiment of the present invention is to provide a novel semiconductor device. Another object of one embodiment of the present invention is to provide a novel display device.

Note that the description of the above objects does not disturb the existence of other objects. In one embodiment of the present invention, there is no need to achieve all of these objects. Objects other than the above objects will be apparent from and can be derived from the description of the specification and the like.

A first embodiment of the present invention is a semiconductor device including an oxide semiconductor film. The semiconductor device includes a gate electrode, an insulating film over the gate electrode, the oxide semiconductor film over the insulating film, and a pair of electrodes over the oxide semiconductor film. The oxide semiconductor film includes a first oxide semiconductor film and a second oxide semiconductor film over the first oxide semiconductor film. The first oxide semiconductor film and the second oxide semiconductor film include the same element. The first oxide semiconductor film includes a region having lower crystallinity than the second oxide semiconductor film.

In the first embodiment, it is preferable that the first oxide semiconductor film and the second oxide semiconductor film separately include In, M (M is Al, Ga, Y, or Sn), and Zn.

In the first embodiment, it is preferable that an atomic ratio of the M to a total sum of the In, the M, and the Zn be higher than or equal to 1.5 and lower than or equal to 2.5 when an atomic ratio of the In is 4, and that an atomic ratio of the Zn to the total sum of the In, the M, and the Zn be higher than or equal to 2 and lower than or equal to 4 when the atomic ratio of the In is 4. In addition, in this embodiment, the atomic ratio between the In, the M, and the Zn is preferably In:M:Zn=4:2:3 or in its neighborhood.

In the first embodiment, it is preferable that an atomic ratio of the M to a total sum of the In, the M, and the Zn be higher than or equal to 0.5 and lower than or equal to 1.5 when an atomic ratio of the In is 5, and that an atomic ratio of the Zn to the total sum of the In, the M, and the Zn be higher than or equal to 5 and lower than or equal to 7 when the atomic ratio of the In is 5. In addition, in this embodiment, the atomic ratio between the In, the M, and the Zn is preferably In:M:Zn=5:1:6 or in its neighborhood.

A second embodiment of the present invention is a semiconductor device including an oxide semiconductor film. The semiconductor device includes a gate electrode, an insulating film over the gate electrode, the oxide semiconductor film over the insulating film, and a pair of electrodes over the oxide semiconductor film. The oxide semiconductor film includes a first oxide semiconductor film and a second oxide semiconductor film over the first oxide semiconductor film. The first oxide semiconductor film and the second oxide semiconductor film include the same element. An electron affinity of the first oxide semiconductor film is larger than an electron affinity of the second oxide semiconductor film. A difference between the electron affinity of the first oxide semiconductor film and the electron affinity of the second oxide semiconductor film is more than or equal to 0.15 eV and less than or equal to 2.0 eV. The first oxide semiconductor film includes a region having lower crystallinity than the second oxide semiconductor film.

A third embodiment of the present invention is a semiconductor device including an oxide semiconductor film. The semiconductor device includes a gate electrode, an insulating film over the gate electrode, the oxide semiconductor film over the insulating film, and a pair of electrodes over the oxide semiconductor film. The oxide semiconductor film includes a first oxide semiconductor film and a second oxide semiconductor film over the first oxide semiconductor film. The first oxide semiconductor film and the second oxide semiconductor film each independently include In, M (M is Al, Ga, Y, or Sn), and Zn. An atomic ratio of the In to the Zn in the first oxide semiconductor film is higher than an atomic ratio of the In to the Zn in the second oxide semiconductor film. The first oxide semiconductor film includes a region having lower crystallinity than the second oxide semiconductor film.

In the second embodiment and the third embodiment, it is preferable that the first oxide semiconductor film and the second oxide semiconductor film separately include In, M (M is Al, Ga, Y, or Sn), and Zn.

In the second embodiment and the third embodiment, it is preferable that an atomic ratio of the M to a total sum of the In, the M, and the Zn in the first oxide semiconductor film be higher than or equal to 1.5 and lower than or equal to 2.5 when an atomic ratio of the In is 4, and that an atomic ratio of the Zn to the total sum of the In, the M, and the Zn be higher than or equal to 2 and lower than or equal to 4 when the atomic ratio of the In is 4. In addition, in this embodiment, the atomic ratio between the In, the M, and the Zn is preferably In:M:Zn=4:2:3 or in its neighborhood. It is preferable that an atomic ratio of the M to a total sum of the In, the M, and the Zn in the second oxide semiconductor film be higher than or equal to 0.5 and lower than or equal to 1.5 when an atomic ratio of the In is 1, and that an atomic ratio of the Zn to the total sum of the In, the M, and the Zn be higher than or equal to 0.1 and lower than or equal to 2 when the atomic ratio of the In is 1. In addition, in this embodiment, the atomic ratio between the In, the M, and the Zn is preferably In:M:Zn=1:1:1 or in its neighborhood.

In the second embodiment and the third embodiment, it is preferable that an atomic ratio of the M to a total sum of the In, the M, and the Zn in the first oxide semiconductor film be higher than or equal to 1.5 and lower than or equal to 2.5 when an atomic ratio of the In is 4, and that an atomic ratio of the Zn to the total sum of the In, the M, and the Zn be higher than or equal to 2 and lower than or equal to 4 when the atomic ratio of the In is 4. In addition, in this embodiment, the atomic ratio between the In, the M, and the Zn is preferably In:M:Zn=4:2:3 or in its neighborhood. It is preferable that an atomic ratio of the M to a total sum of the In, the M, and the Zn in the second oxide semiconductor film be higher than or equal to 0.5 and lower than or equal to 1.5 when an atomic ratio of the In is 5, and that an atomic ratio of the Zn to the total sum of the In, the M, and the Zn be higher than or equal to 5 and lower than or equal to 7 when the atomic ratio of the In is 5. In addition, in this embodiment, the atomic ratio between the In, the M, and the Zn is preferably In:M:Zn=5:1:6 or in its neighborhood.

In each of the first to third embodiments, it is preferable that the first oxide semiconductor film include a composite oxide semiconductor including a first region and a second region. The first region preferably includes a plurality of first clusters including one or more selected from indium, zinc, and oxygen as its main component. The second region preferably includes a plurality of second clusters including one or more selected from indium, M (M is Al, Ga, Y, or Sn), zinc, and oxygen as its main component. The plurality of first clusters is preferably connected to each other. The plurality of second clusters is preferably connected to each other.

In each of the first to third embodiments, the second oxide semiconductor film preferably includes a crystal part. The crystal part preferably has a c-axis alignment.

Another embodiment of the present invention is a display device including a display element and the semiconductor device according to any one of the above-mentioned embodiments. Another embodiment of the present invention is a display module including the display device and a touch sensor. Another embodiment of the present invention is an electronic device including the semiconductor device according to any one of the above-mentioned embodiments, the display device, or the display module. The electronic device includes an operation key or a battery.

According to one embodiment of the present invention, the field-effect mobility and reliability of a transistor including an oxide semiconductor film can be improved. According to one embodiment of the present invention, a change in electrical characteristics of a transistor including an oxide semiconductor film can be suppressed and the reliability of the transistor can be improved. According to one embodiment of the present invention, a semiconductor device with low power consumption can be provided. According to one embodiment of the present invention, a novel semiconductor device can be provided. According to one embodiment of the present invention, a novel display device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 15 illustrates an atomic ratio of a composite oxide semiconductor.

BEST MODE FOR CARRYING OUT THE INVENTION

Figure 1A:
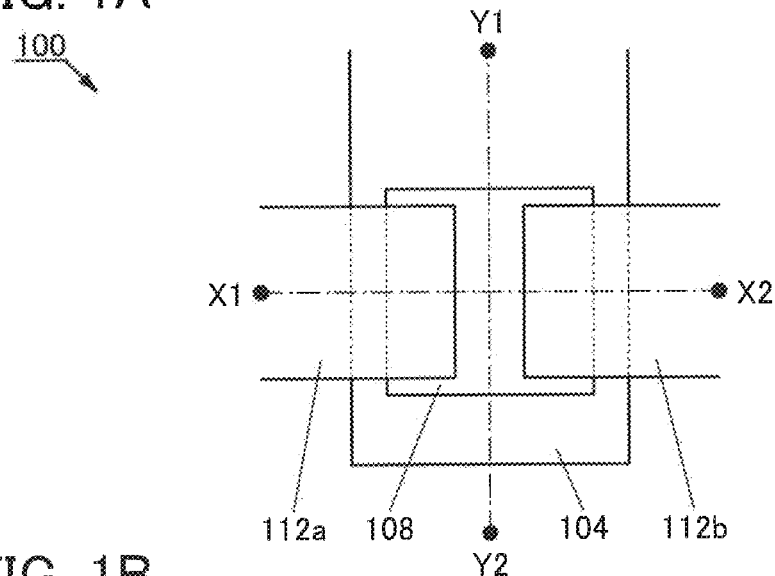
FIGS. 1A to 1C are a top view and cross-sectional views illustrating a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow between the drain and the source through the channel region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in an off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1V, 1.2V, 1.8 V, 2.5 V, 3 V, 3.3 V, 10V, 12V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to current that flows through a source of a transistor in an off state.

In this specification and the like, the term "leakage current" sometimes expresses the same meaning as off-state current. In this specification and the like, the off-state current sometimes refers to current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0=0 A) and an extrapolated straight line that is tangent with the highest inclination to a plotted curve ($V_g$-√$I_d$ characteristics). Alternatively, the threshold voltage of a transistor may refer to a gate voltage ($V_g$) at which the value of $I_d$ [A]×L [μm] is $1\times10^{-9}$ [A] where L is channel length and W is channel width.

In this specification and the like, a "semiconductor" can have characteristics of an "insulator" when the conductivity is sufficiently low, for example. Further, a "semiconductor"

and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

Embodiment 1

In this embodiment, a semiconductor device of one embodiment of the present invention and a manufacturing method thereof are described with reference to FIGS. 1A to 1C to FIGS. 11A and 11B.

<1-1. Structure Example 1 of Semiconductor Device>

Figure 1B:
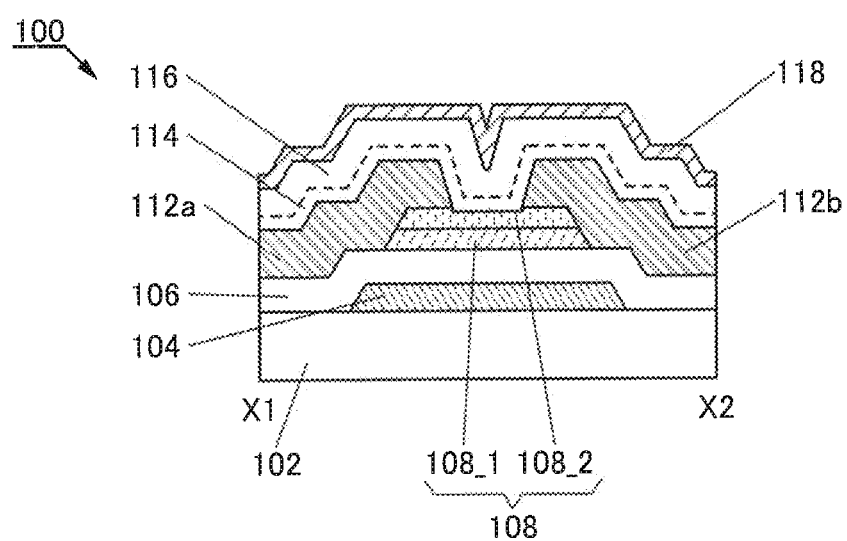
Figure 1C:
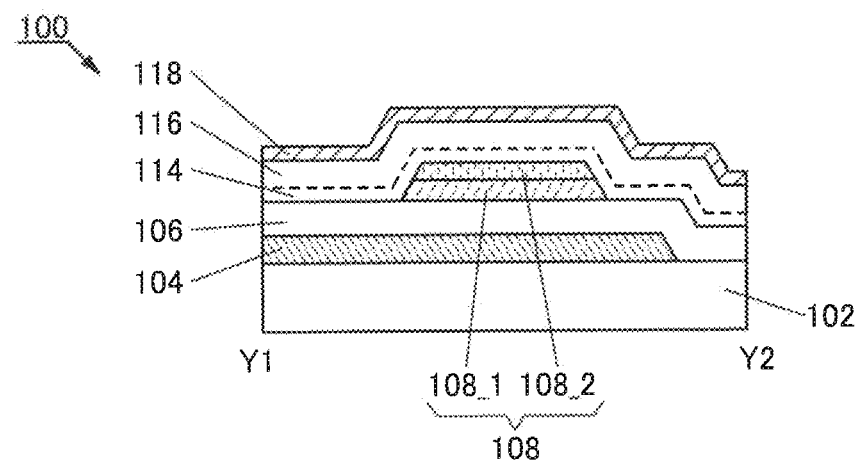

FIG. 1A is a top view of a transistor 100 that is a semiconductor device of one embodiment of the present invention. FIG. 1B is a cross-sectional view taken along a dashed dotted line X1-X2 in FIG. 1A. FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. Furthermore, the direction of the dashed dotted line X1-X2 may be referred to as a channel length direction, and the direction of the dashed dotted line Y1-Y2 may be referred to as a channel width direction. As in FIG. 1A, some components are not illustrated in some cases in top views of transistors described below.

The transistor 100 includes a conductive film 104 over a substrate 102, an insulating film 106 over the substrate 102 and the conductive film 104, an oxide semiconductor film 108 over the insulating film 106, a conductive film 112a over the oxide semiconductor film 108, and a conductive film 112b over the oxide semiconductor film 108. Furthermore, an insulating film 114, an insulating film 116 over the insulating film 114, and an insulating film 118 over the insulating film 116 are formed over the transistor 100, specifically over the oxide semiconductor film 108, the conductive film 112a, and the conductive film 112b.

Note that the transistor 100 is what is called a channel-etched transistor.

Furthermore, the oxide semiconductor film 108 includes an oxide semiconductor film 108_1 over the insulating film 106, and an oxide semiconductor film 108_2 over the oxide semiconductor film 108_1. Note that the oxide semiconductor film 108_1 and the oxide semiconductor film 108_2 include the same element. For example, it is preferable that the oxide semiconductor films 108_1 and 108_2 each independently contain In, M (M is Al, Ga, Y, or Sn), and Zn.

The oxide semiconductor film 108_1 and the oxide semiconductor film 108_2 preferably each independently include a region in which the atomic proportion of In is higher than the atomic proportion of M. For example, the atomic ratio of In to M to Zn in the oxide semiconductor film 108_1 is preferably In:M:Zn=4:2:3 or in the neighborhood thereof. The atomic ratio of In to M to Z in the oxide semiconductor film 108_2 is preferably In:M:Zn=4:2:3 or in the neighborhood thereof. The term "neighborhood" includes the following: when In is 4, M is greater than or equal to 1.5 and less than or equal to 2.5, and Zn is greater than or equal to 2 and less than or equal to 4. When the compositions of the oxide semiconductor film 108_1 and the oxide semiconductor film 108_2 are substantially the same as described above, they can be formed using the same sputtering target and the manufacturing cost can be thus reduced. Since the same sputtering target is used, the oxide semiconductor film 108_1 and the oxide semiconductor film 108_2 can be formed successively in the same vacuum chamber. This can suppress entry of impurities into the interface between the oxide semiconductor film 108_1 and the oxide semiconductor film 108_2.

When the oxide semiconductor film 108_1 and the oxide semiconductor film 108_2 each independently include a region in which the atomic proportion of In is higher than the atomic proportion of M, the transistor 100 can have high field-effect mobility. Specifically, the field-effect mobility of the transistor 100 can be higher than 50 cm$^2$/Vs, preferably higher than 100 cm$^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Even when the oxide semiconductor film 108_1 and the oxide semiconductor film 108_2 each independently include a region in which the atomic proportion of In is higher than the atomic proportion of M, the field-effect mobility might be low if the oxide semiconductor film 108_1 and the oxide semiconductor film 108_2 have high crystallinity.

However, in the semiconductor device of one embodiment of the present invention, the oxide semiconductor film 108_1 includes a region having lower crystallinity than the oxide semiconductor film 108_2. Note that the crystallinity of the oxide semiconductor film 108 can be determined by analysis by X-ray diffraction (XRD) or with a transmission electron microscope (TEM).

In the case where the oxide semiconductor film 108_1 has a region with low crystallinity, the following effects can be achieved.

First, oxygen vacancies that might be formed in the oxide semiconductor film 108 will be described.

Oxygen vacancies formed in the oxide semiconductor film 108 adversely affect the transistor characteristics and therefore cause a problem. For example, oxygen vacancies formed in the oxide semiconductor film 108 are bonded to hydrogen to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the amount of oxygen vacancies in the oxide semiconductor film 108 be as small as possible.

In view of this, one embodiment of the present invention is a structure in which insulating films in the vicinity of the oxide semiconductor film 108, specifically the insulating films 114 and 116 formed over the oxide semiconductor film 108, include excess oxygen. Oxygen or excess oxygen is transferred from the insulating film 114 and the insulating films 116 to the oxide semiconductor film 108, whereby the oxygen vacancies in the oxide semiconductor film can be reduced.

Figure 11A:
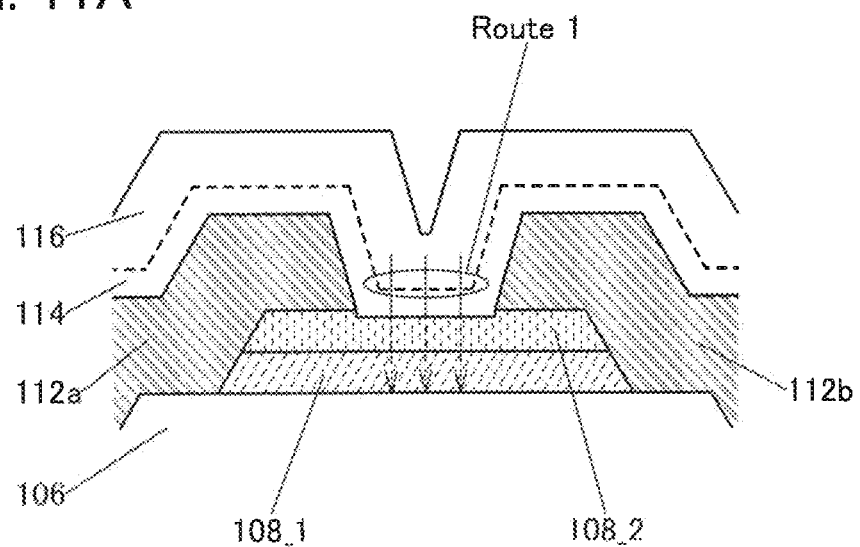
FIGS. 11A and 11B are schematic views illustrating diffusion paths of oxygen or excess oxygen diffused into an oxide semiconductor film.
Figure 11B:
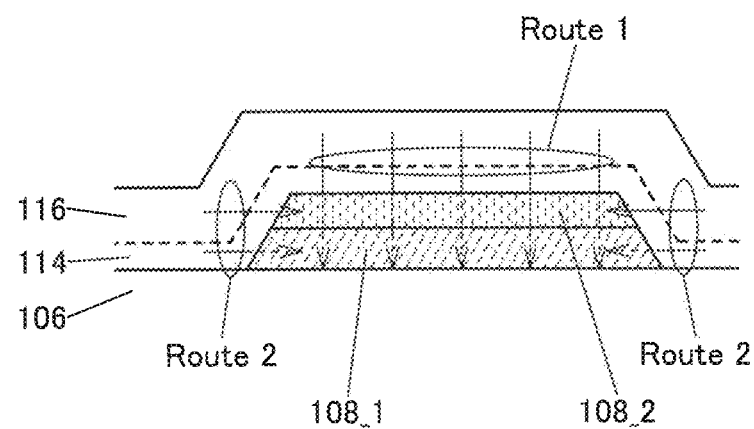

Here, the path of oxygen or excess oxygen diffused into the oxide semiconductor film 108 will be described with reference to FIGS. 11A and 11B. FIGS. 11A and 11B are schematic views illustrating the diffusion paths of oxygen or excess oxygen diffused into the oxide semiconductor film 108. FIG. 11A is the schematic view in the channel length direction and FIG. 11B is that in the channel width direction.

Oxygen or excess oxygen of the insulating films 114 and 116 is diffused to the oxide semiconductor film 108_1 from above, i.e., through the oxide semiconductor film 108_2 (Route 1 in FIGS. 11A and 11B).

In another case, oxygen or excess oxygen of the insulating films 114 and 116 is diffused into the oxide semiconductor film 108 through the side surfaces of the oxide semiconductor film 108_1 and the oxide semiconductor film 108_2 (Route 2 in FIG. 11B).

For example, diffusion of oxygen or excess oxygen by Route 1 shown in FIGS. 11A and 11B is sometimes prevented when the oxide semiconductor film 108_2 has high crystallinity. In contrast, oxygen or excess oxygen can be diffused to the oxide semiconductor film 108_1 and the oxide semiconductor film 108_2 through the side surfaces of the oxide semiconductor film 108_1 and the oxide semiconductor film 108_2 by Route 2 shown in FIG. 11B.

The oxide semiconductor film 108_1 includes a region having lower crystallinity than the oxide semiconductor film 108_2, and the region serves as a diffusion path of excess oxygen. Thus, excess oxygen can be diffused to the oxide semiconductor film 108_2 that have higher crystallinity than the oxide semiconductor film 108_1 by Route 2 shown in FIG. 11B. Although not shown in FIGS. 11A and 11B, when the insulating film 106 contains oxygen or excess oxygen, the oxygen or excess oxygen might be diffused also from the insulating film 106 into the oxide semiconductor film 108.

As described above, a stacked-layer structure that includes the oxide semiconductor films having different crystal structures is formed in a semiconductor device of one embodiment of the present invention and the region with low crystallinity serves as a diffusion path of excess oxygen, whereby the semiconductor device can be highly reliable.

Note that in the case where the oxide semiconductor film 108 consists only of an oxide semiconductor film with low crystallinity, the reliability might be lowered because of attachment or entry of impurities (e.g., hydrogen or moisture) to the back channel side of the oxide semiconductor film, i.e., a region corresponding to the oxide semiconductor film 108_2.

Impurities such as hydrogen or moisture entering the channel region of the oxide semiconductor film 108 adversely affect the transistor characteristics and therefore cause a problem. Therefore, it is preferable that the amount of impurities such as hydrogen or moisture in the oxide semiconductor film 108 be as small as possible.

In view of this, the crystallinity of oxide semiconductor films over the oxide semiconductor film is increased in one embodiment of the present invention. Owing to this, impurities that might enter the oxide semiconductor film 108 can be suppressed. In particular, the higher crystallinity of the oxide semiconductor film 108_2 can inhibit damage at the time of processing the conductive films 112a and 112b. The surface of the oxide semiconductor film 108, i.e., the surface of the oxide semiconductor film 108_2 is exposed to an etchant or an etching gas at the time of processing the conductive films 112a and 112b. The oxide semiconductor film 108_2 has etching resistance superior to the oxide semiconductor film 108_1 owing to its region with higher crystallinity than the oxide semiconductor film 108_1. Thus, the oxide semiconductor film 108_2 serves as an etching stopper.

Note that it is preferable to use, as the oxide semiconductor film 108, an oxide semiconductor film in which the impurity concentration is low and the density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". Note that impurities in an oxide semiconductor film are typically water, hydrogen, and the like. In this specification and the like, to decrease or remove water and hydrogen from an oxide semiconductor film is referred to as dehydration or dehydrogenation in some cases. To add oxygen to an oxide semiconductor film or an oxide insulating film is referred to as oxygen addition in some cases. A state containing more oxygen than that in the stoichiometric composition due to the oxygen addition is referred to as an oxygen-excess state in some cases.

A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V.

By including a region having lower crystallinity than the oxide semiconductor film 108_2, the oxide semiconductor film 108_1 sometimes has a high carrier density.

When the oxide semiconductor film 108_1 has a high carrier density, the Fermi level is sometimes high relative to the conduction band of the oxide semiconductor film 108_1. This lowers the conduction band minimum of the oxide semiconductor film 108_1, so that the energy difference between the conduction band minimum of the oxide semiconductor film 108_1 and the trap level, which might be formed in a gate insulating film (here, the insulating film 106), is increased in some cases. The increase of the energy difference can reduce trap of charges in the gate insulating film and reduce variation in the threshold voltage of the transistor, in some cases. In addition, when the oxide semiconductor film 108_1 has a high carrier density, the oxide semiconductor film 108 can have high field-effect mobility.

It is favorable to use a composite oxide semiconductor as the oxide semiconductor film 108_1. The details of the composite oxide semiconductor will be described in Embodiment 2.

In the transistor 100 illustrated in FIGS. 1A to 1C, the insulating film 106 functions as a gate insulating film of the transistor 100, and the insulating films 114, 116, and 118 function as protective insulating films of the transistor 100. Furthermore, in the transistor 100, the conductive film 104 functions as a gate electrode, the conductive film 112a functions as a source electrode, and the conductive film 112b functions as a drain electrode. Note that in this specification and the like, in some cases, the insulating film 106 is referred to as a first insulating film, the insulating films 114 and 116 are collectively referred to as a second insulating film, and the insulating film 118 is referred to as a third insulating film.

<1-2. Components of Semiconductor Device>

Next, components of the semiconductor device in this embodiment are described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Film]

The conductive film 104 functioning as a gate electrode and the conductive films 112a and 112b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112a, and 112b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

A Cu—X alloy film (X is Mn, Ni, Cr, Fe, Co, Mo, Ta, or Ti) may be used for the conductive films 104, 112a, and 112b. The use of a Cu—X alloy film results in lower manufacturing costs because the film can be processed by wet etching.

Among the above-mentioned metal elements, any one or more elements selected from copper, titanium, tungsten, tantalum, and molybdenum are preferably included in the conductive films 112a and 112b. In particular, a tantalum nitride film is preferably used for the conductive films 112a and 112b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108. It is favorable to use a copper film for the conductive films 112a and 112b because the resistance of the conductive films 112a and 112b can be reduced.

The conductive films 112a and 112b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Insulating Film Functioning as Gate Insulating Film]

As the insulating film 106 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film Note that the insulating film 106 may have a stacked-layer structure or a stacked layer structure of three or more layers.

The insulating film 106 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 106 is an insulating film capable of releasing oxygen. In order to provide the oxygen-excess region in the insulating film 106, the insulating film 106 is formed in an oxygen atmosphere, or the deposited insulating film 106 is subjected to heat treatment in an oxygen atmosphere, for example.

In the case where hafnium oxide is used for the insulating film 106, the following effect is attained. Hafnium oxide has higher dielectric constant than silicon oxide and silicon oxynitride. Therefore, the insulating film 106 using hafnium oxide can have a larger thickness than the insulating film 106 using silicon oxide, so that leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to provide a transistor with a low off-state current. Examples of the crystal structure include a monoclinic crystal structure and a cubic crystal structure. Note that one embodiment of the present invention is not limited to the above examples.

In this embodiment, a layered film of a silicon nitride film and a silicon oxide film is formed as the insulating film 106. The silicon nitride film has a higher dielectric constant than a silicon oxide film and needs a larger thickness for capacitance equivalent to that of the silicon oxide film Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

[Oxide Semiconductor Film]

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In >M. The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, or the like.

In the case where the oxide semiconductor film 108_2 includes In-M-Zn oxide in <1-1-2. Structure example 2 of semiconductor device> described above, it is preferable that the atomic ratio of metal elements of a sputtering target used for forming the In-M-Zn oxide satisfy In M or Zn M. As the atomic ratio of the metal elements of such a sputtering target, In:M:Zn=1:1:1, In:M:Zn=1:1:1.2, In:M:Zn=1:3:2, In:M:Zn=1:3:4, In:M:Zn=1:3:6, and the like are given.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratio of metal elements in the formed oxide semiconductor film 108 varies from the above atomic ratios of metal elements of the sputtering targets in a range of ±40%. For example, when a sputtering target with an atomic ratio of In to Ga to Zn of 4:2:4.1 is used, the atomic ratio of In to Ga to Zn in the formed oxide semiconductor film 108 may be 4:2:3 or in the neighborhood of 4:2:3.

The energy gap of the oxide semiconductor film 108 is 2 eV or more, preferably 2.5 eV or more. With the use of an oxide semiconductor having such a wide energy gap, the off-state current of the transistor 100 can be reduced.

Furthermore, the oxide semiconductor film 108 preferably has a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect states, whereas the CAAC-OS has the lowest density of defect states.

[Insulating Film 1 Functioning as Protective Insulating Film]

The insulating films 114 and 116 function as protective insulating films for the transistor 100. In addition, the insulating films 114 and 116 each have a function of supplying oxygen to the oxide semiconductor film 108. That is, the insulating films 114 and 116 contain oxygen. The insulating film 114 is an insulating film that allows oxygen to pass therethrough. Note that the insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the property of transmitting oxygen of the insulating film 114 is lowered.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1\times10^{18}/cm^3$ and less than or equal to $5\times10^{19}/cm^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/$cm^3$, typically higher than or equal to $1\times10^{17}$ spins/$cm^3$ and lower than $1\times10^{18}$ spins/$cm^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/$cm^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is an oxide insulating film which contains oxygen at a higher proportion than the stoichiometric composition. Part of oxygen is released from the above oxide insulating film by heating. The amount of oxygen released from the oxide insulating film in TDS is more than or equal to $1.0\times10^{19}$ atoms/$cm^3$, preferably more than or equal to $3.0\times10^{20}$ atoms/$cm^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal that appears at g=2.001 due to a dangling bond of silicon be lower than $1.5\times10^{18}$ spins/$cm^3$, preferably lower than or equal to $1\times10^{18}$ spins/$cm^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of only the insulating film 114 or a layered structure of three or more layers may be employed.

[Insulating Film 2 Functioning as Protective Insulating Film]

The insulating film 118 functions as a protective insulating film for the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. The provision of the insulating film 118 makes it possible to prevent outward diffusion of oxygen from the oxide semiconductor film 108, outward diffusion of oxygen included in the insulating films 114 and 116, and entry of hydrogen, water, or the like into the oxide semiconductor film 108 from the outside.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, the oxide semiconductor film, and the metal film which are described above can be formed by a sputtering method or a PECVD method, such films may be formed by another method, e.g., a thermal chemical vapor deposition (CVD) method. A metal organic chemical vapor deposition (MOCVD) method and an atomic layer deposition (ALD) method can be given as examples of a thermal CVD method.

A thermal CVD method has an advantage that no defect due to plasma damage is generated since it does not utilize plasma for forming a film. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

<1-3. Structure Example 2 of Semiconductor Device>

Next, variations of the transistor 100 illustrated in in FIGS. 1A to 1C are described with reference to FIGS. 2A to 2C to FIGS. 6A to 6C.

Figure 2A:
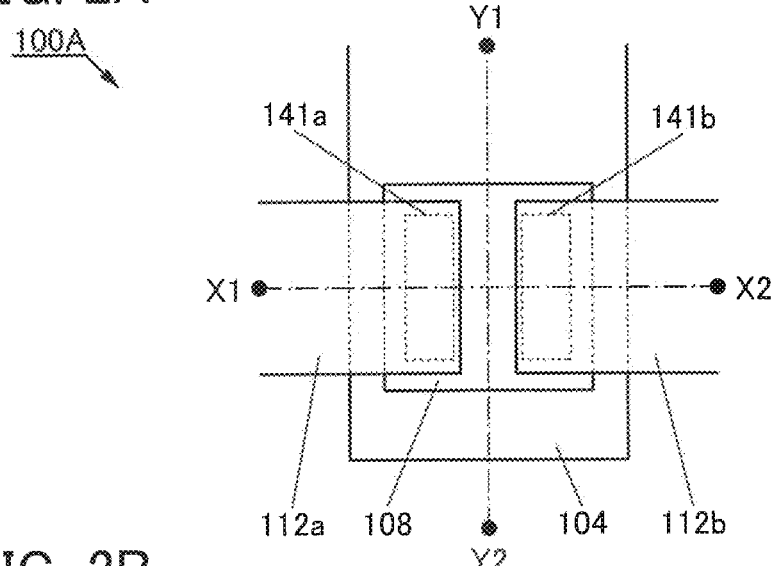
FIGS. 2A to 2C are a top view and cross-sectional views illustrating a semiconductor device.
Figure 2B:
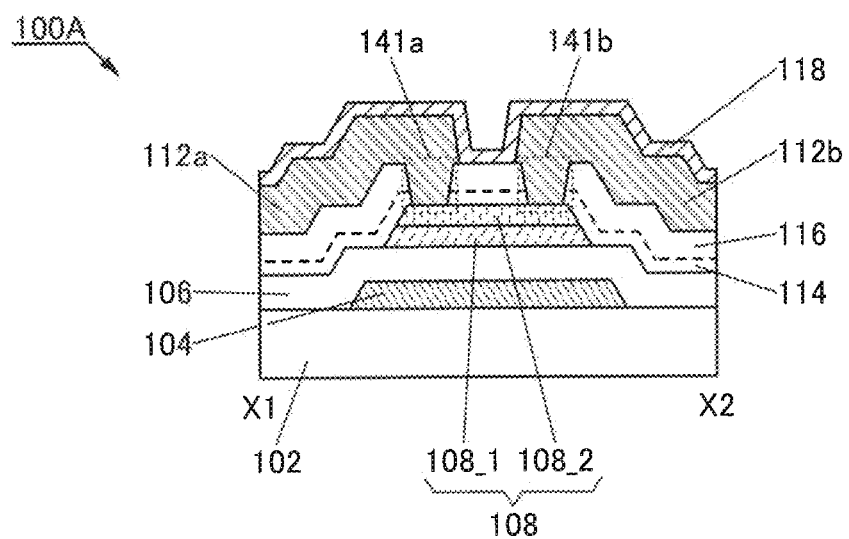
Figure 2C:
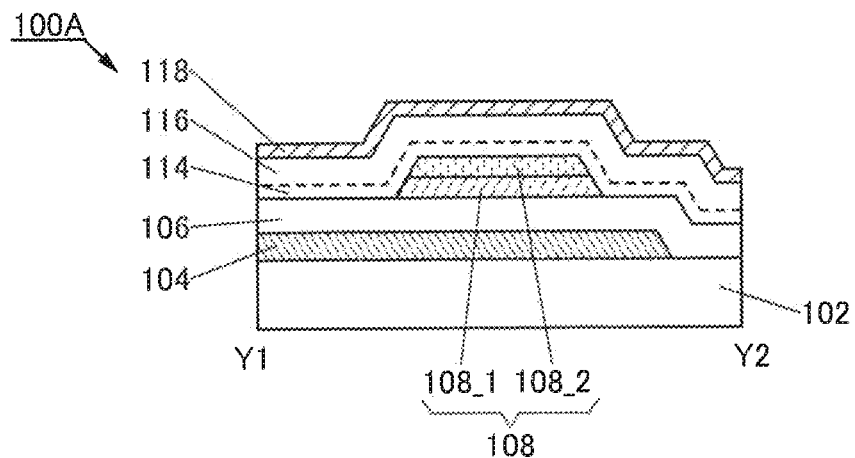

FIG. 2A is a top view of a transistor 100A that is a semiconductor device of one embodiment of the present invention. FIG. 2B is a cross-sectional view taken along a dashed dotted line X1-X2 in FIG. 2A. FIG. 2C is a cross-sectional view taken along a dashed dotted line Y1-Y2 in FIG. 2A.

Note that the transistor 100A illustrated in FIGS. 2A to 2C is what is called a channel-protective transistor. Thus, the semiconductor device of one embodiment of the present invention can have either the channel-etched structure or the channel-protective structure.

In the transistor 100A, the insulating films 114 and 116 have an opening 141a and an opening 141b. The oxide semiconductor film 108 is connected to the conductive films 112a and 112b through the openings 141a and 141b. Furthermore, the insulating film 118 is formed over the conductive films 112a and 112b. The insulating films 114 and 116 function as channel protective films. Note that the other components of the transistor 100A are similar to those of the transistor 100 described above, and an effect similar to that of the transistor 100 can be obtained.

Figure 3A:
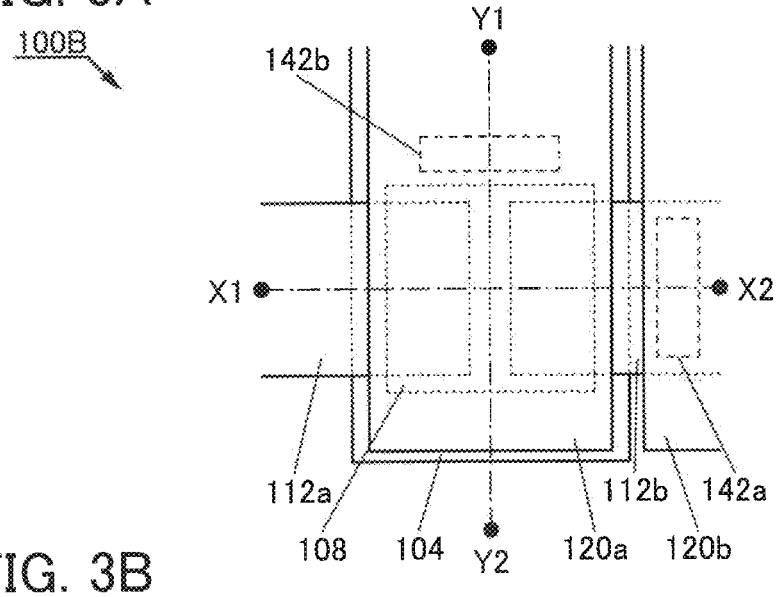
FIGS. 3A to 3C are a top view and cross-sectional views illustrating a semiconductor device.
Figure 3B:
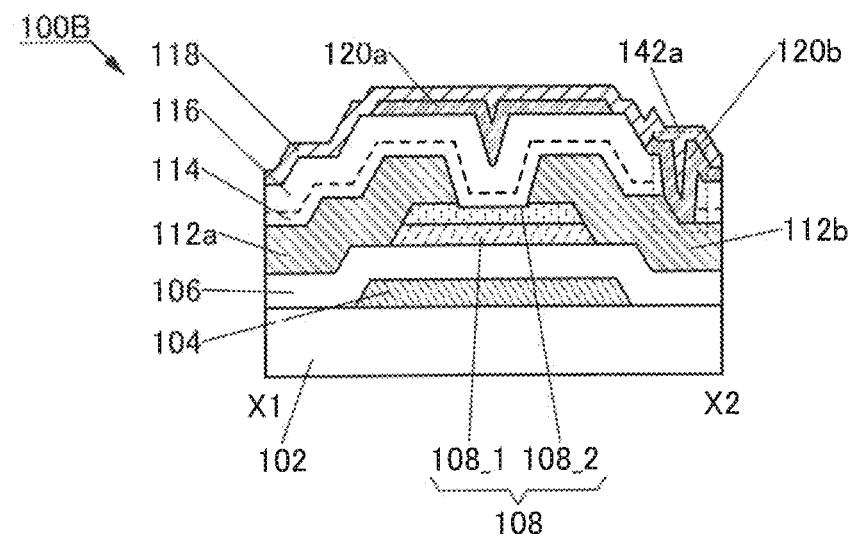
Figure 3C:
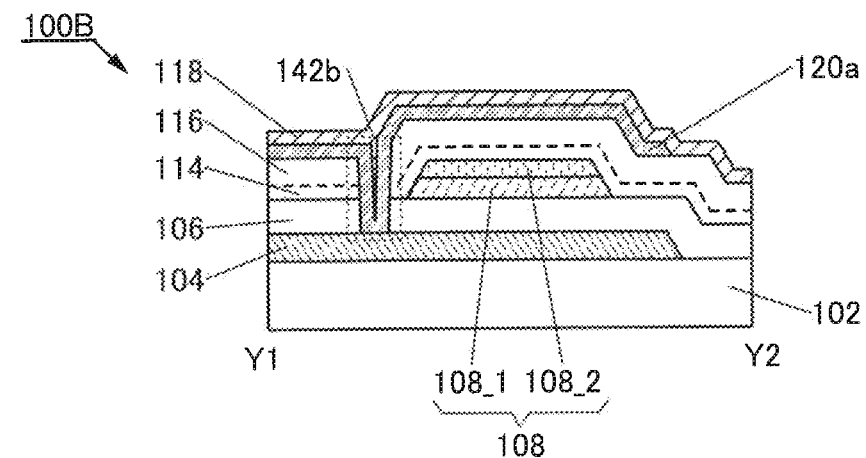

FIG. 3A is a top view of a transistor 100B that is a semiconductor device of one embodiment of the present invention. FIG. 3B is a cross-sectional view taken along a dashed dotted line X1-X2 in FIG. 3A, and FIG. 3C is a cross-sectional view taken along a dashed dotted line Y1-Y2 in FIG. 3A.

The transistor 100B includes the conductive film 104 over the substrate 102, the insulating film 106 over the substrate 102 and the conductive film 104, the oxide semiconductor film 108 over the insulating film 106, the conductive film 112a over the oxide semiconductor film 108, the conductive film 112b over the oxide semiconductor film 108, the insulating film 114 over the oxide semiconductor film 108, the conductive film 112a, and the conductive film 112b, the insulating film 116 over the insulating film 114, a conductive film 120a over the insulating film 116, a conductive film 120b over the insulating film 116, and the insulating film 118 over the insulating film 116 and the conductive films 120a and 120b.

The insulating films 114 and 116 have an opening 142a. The insulating films 106, 114, and 116 have an opening 142b. The conductive film 120a is electrically connected to the conductive film 104 through the opening 142b. Furthermore, the conductive film 120b is electrically connected to the conductive film 112b through the opening 142a.

Note that in the transistor 100B, the insulating film 106 functions as a first gate insulating film of the transistor 100B, the insulating films 114 and 116 function as a second gate insulating film of the transistor 100B, and the insulating film 118 functions as a protective insulating film of the transistor 100B. In the transistor 100B, the conductive film 104 functions as a first gate electrode, the conductive film 112a functions as a source electrode, and the conductive film 112b functions as a drain electrode. In the transistor 100B, the conductive film 120a functions as a second gate electrode, and the conductive film 120b functions as a pixel electrode of a display device.

As illustrated in FIG. 3C, the conductive film 120a is electrically connected to the conductive film 104 through the opening 142b. Accordingly, the conductive film 104 and the conductive film 120a are supplied with the same potential.

As illustrated in FIG. 3C, the oxide semiconductor film 108 is positioned so as to face the conductive film 104 and the conductive film 120a, and is sandwiched between the two conductive films functioning as the gate electrodes. The length in the channel length direction and the length in the channel width direction of the conductive film 120a are longer than the length in the channel length direction and the length in the channel width direction of the oxide semiconductor film 108, respectively. The whole oxide semiconductor film 108 is covered with the conductive film 120a with the insulating films 114 and 116 positioned therebetween.

In other words, the conductive film 104 and the conductive film 120a are connected through the opening provided in the insulating films 106, 114, and 116, and each include a region positioned outside an edge portion of the oxide semiconductor film 108.

With this structure, the oxide semiconductor film 108 included in the transistor 100B can be electrically surrounded by electric fields of the conductive films 104 and 120a. A device structure of a transistor, like that of the transistor 100B, in which electric fields of a first gate electrode and a second gate electrode electrically surround an oxide semiconductor film where a channel region is formed can be referred to as a surrounded channel (s-channel) structure.

Since the transistor 100B has the s-channel structure, an electric field for inducing a channel can be effectively applied to the oxide semiconductor film 108 by the conductive film 104 functioning as a first gate electrode; therefore, the current drive capability of the transistor 100B can be improved and high on-state current characteristics can be obtained. Since the on-state current can be increased, the size of the transistor 100B can be reduced. In addition, since the transistor 100B has a structure in which the oxide semiconductor film 108 is surrounded by the conductive film 104 functioning as the first gate electrode and the conductive film 120a functioning as the second gate electrode, the mechanical strength of the transistor 100B can be increased.

Note that for the conductive films 120a and 120b, materials similar to those described as the materials of the above-described conductive films 104, 112a, and 112b can be used. In particular, oxide conductor films (OC) are preferable as the conductive films 120a and 120b. When the conductive films 120a and 120b are formed using an oxide conductive film, oxygen can be added to the insulating films 114 and 116.

The other components of the transistor 100B are similar to those of the transistor 100 described above and have similar effects.

Figure 4A:
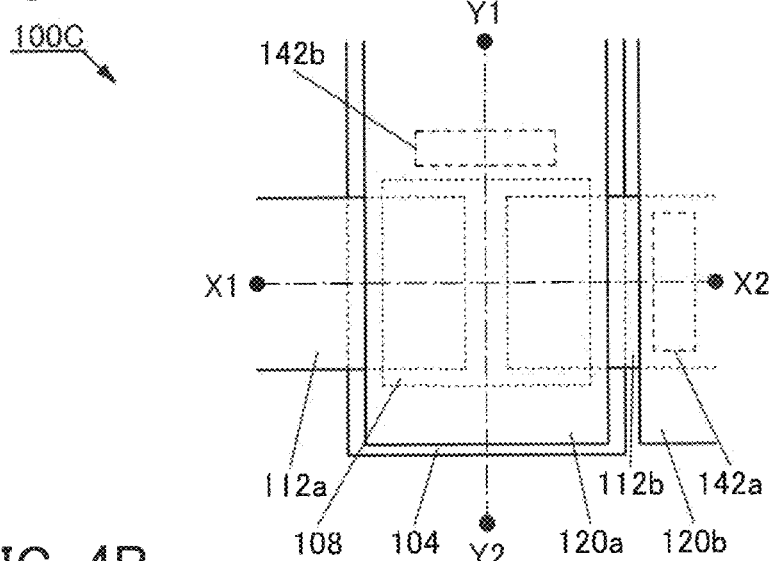
FIGS. 4A to 4C are a top view and cross-sectional views illustrating a semiconductor device.
Figure 4B:
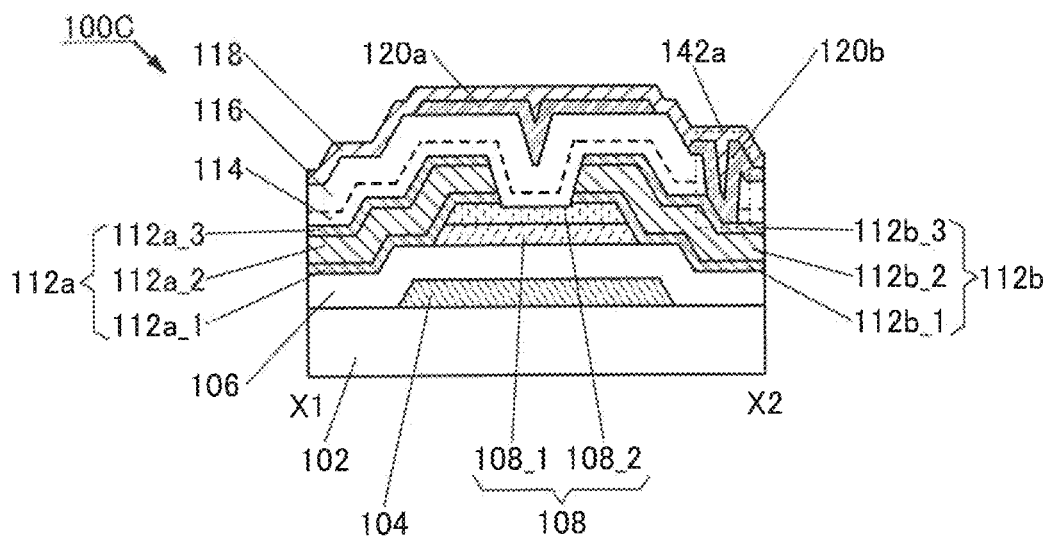
Figure 4C:
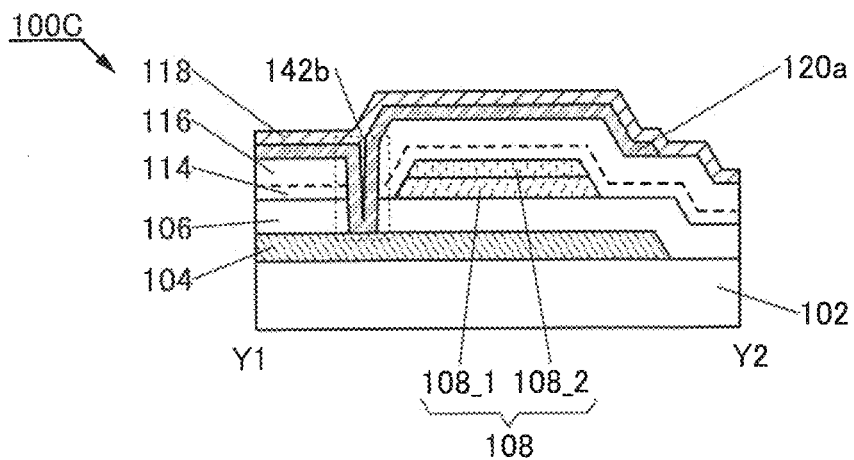

FIG. 4A is a top view of a transistor 100C that is a semiconductor device of one embodiment of the present invention. FIG. 4B is a cross-sectional view taken along a dashed dotted line X1-X2 in FIG. 4A, and FIG. 4C is a cross-sectional view taken along a dashed dotted line Y1-Y2 in FIG. 4A.

The transistor 100C is different from the above-described transistor 100B in that the conductive films 112a and 112b each have a three-layer structure.

The conductive film 112a of the transistor 100C includes a conductive film 112a_1, a conductive film 112a_2 over the conductive film 112a_1, and a conductive film 112a_3 over the conductive film 112a_2. The conductive film 112b of the transistor 100C includes a conductive film 112b_1, a conductive film 112b_2 over the conductive film 112b_1, and a conductive film 112b_3 over the conductive film 112b_2.

For example, it is preferable that the conductive film 112a_1, the conductive film 112b_1, the conductive film 112a_3, and the conductive film 112b_3 contain one or more elements selected from titanium, tungsten, tantalum, molybdenum, indium, gallium, tin, and zinc. Furthermore, it is preferable that the conductive film 112a_2 and the conductive film 112b_2 contain one or more elements selected from copper, aluminum, and silver.

Specifically, the conductive film 112a_1, the conductive film 112b_1, the conductive film 112a_3, and the conductive film 112b_3 can be formed using an In—Sn oxide or an In—Zn oxide and the conductive film 112a_2 and the conductive film 112b_2 can be formed using copper.

The above structure is preferred because the wiring resistance of the conductive films 112a and 112b can be reduced and diffusion of copper to the oxide semiconductor film 108 can be inhibited. The above structure is preferred also because the contact resistance between the conductive film 112b and the conductive film 120b can be low. The other components of the transistor 100C are similar to those of the transistor 100 described above and have similar effects.

Figure 5A:
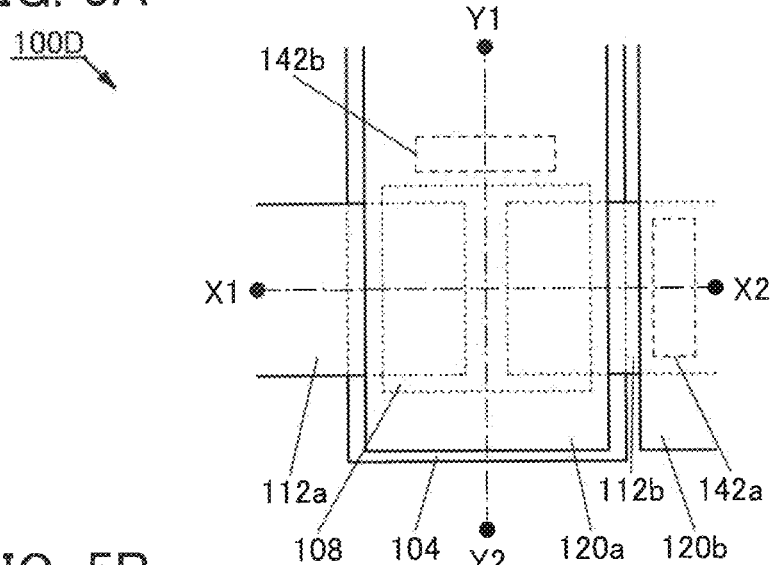
FIGS. 5A to 5C are a top view and cross-sectional views illustrating a semiconductor device.
Figure 5B:
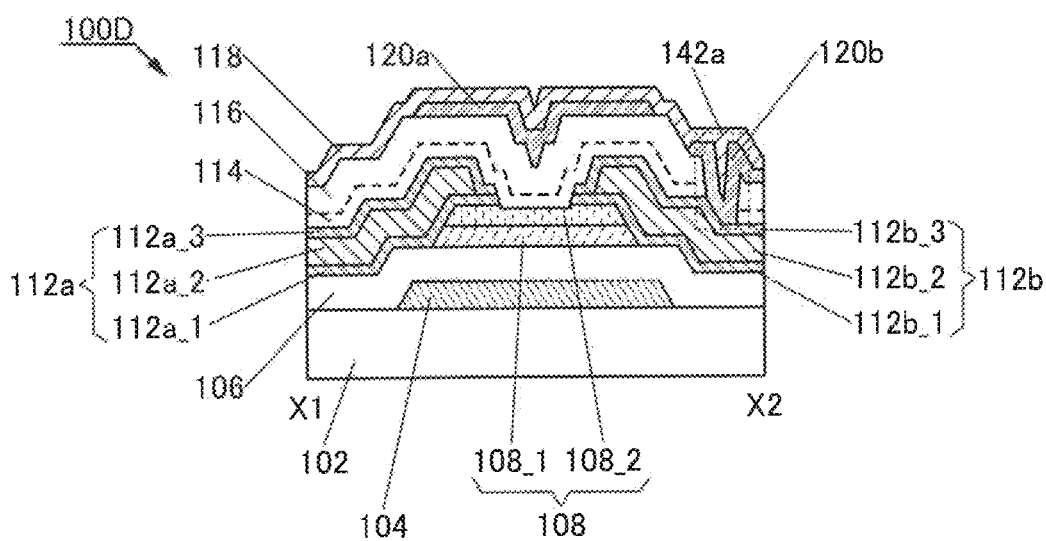
Figure 5C:
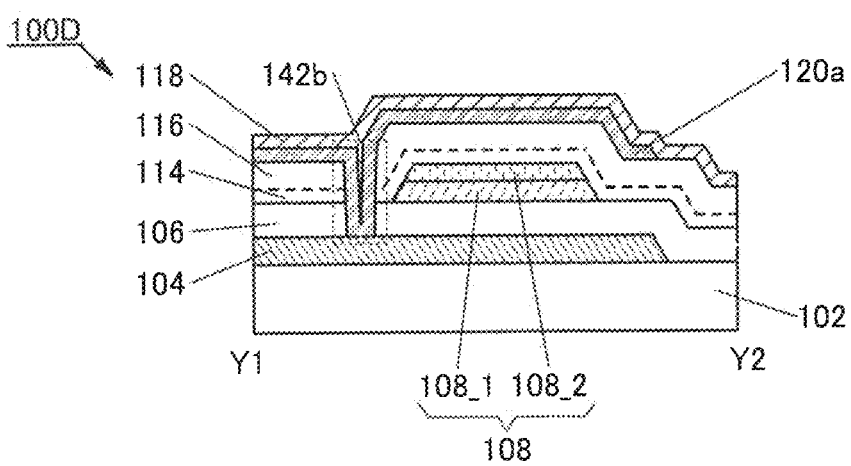

FIG. 5A is a top view of a transistor 100D that is a semiconductor device of one embodiment of the present invention. FIG. 5B is a cross-sectional view taken along a dashed dotted line X1-X2 in FIG. 5A, and FIG. 5C is a cross-sectional view taken along a dashed dotted line Y1-Y2 in FIG. 5A.

The transistor 100D is different from the above-described transistor 100B in that the conductive films 112a and 112b each have a three-layer structure. In addition, the transistor 100D is different from the above-described transistor 100C in the shapes of the conductive films 112a and 112b.

The conductive film 112a of the transistor 100D includes the conductive film 112a_1, the conductive film 112a_2 over the conductive film 112a_1, and the conductive film 112a_3 over the conductive film 112a_2. The conductive film 112b of the transistor 100C includes the conductive film 112b_1, the conductive film 112b_2 over the conductive film 112b_1, and the conductive film 112b_3 over the conductive film 112b_2. Note that the conductive film 112a_1, the conductive film 112a_2, the conductive film 112a_3, the conductive film 112b_1, the conductive film 112b_2, and the conductive film 112b_3 can be formed using any of the above-described materials.

An end portion of the conductive film 112a_1 has a region located outward from an end portion of the conductive film 112a_2. The conductive film 112a_3 covers a top surface and a side surface of the conductive film 112a_2 and has a region that is in contact with the conductive film 112a_1. An end portion of the conductive film 112b_1 has a region located outward from an end portion of the conductive film 112b_2. The conductive film 112b_3 covers a top surface and a side surface of the conductive film 112b_2 and has a region that is in contact with the conductive film 112b_1.

The above structure is preferred because the wiring resistance of the conductive films 112a and 112b can be reduced and diffusion of copper to the oxide semiconductor film 108 can be inhibited. Note that diffusion of copper can be more effectively inhibited in the transistor 100D than in the above-described transistor 100C. The above structure is preferred also because the contact resistance between the conductive film 112b and the conductive film 120b can be low. The other components of the transistor 100D are similar to those of the transistor 100 described above and have similar effects.

Figure 6A:
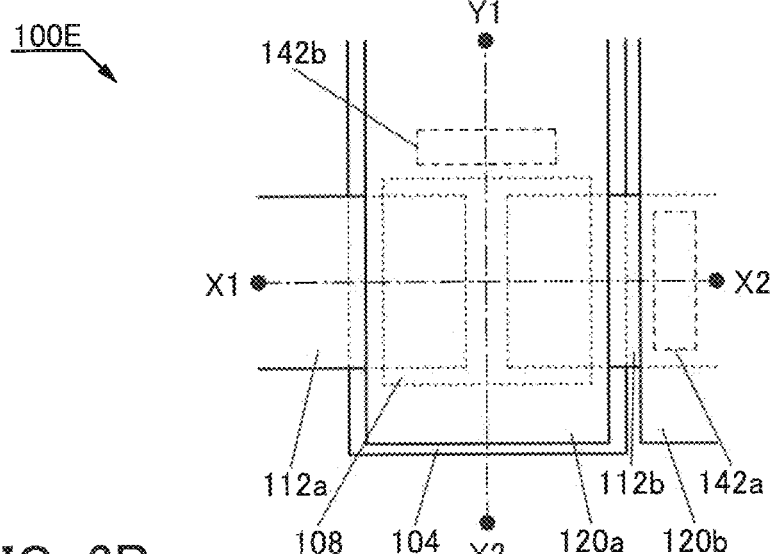
FIGS. 6A to 6C are a top view and cross-sectional views illustrating a semiconductor device.
Figure 6B:
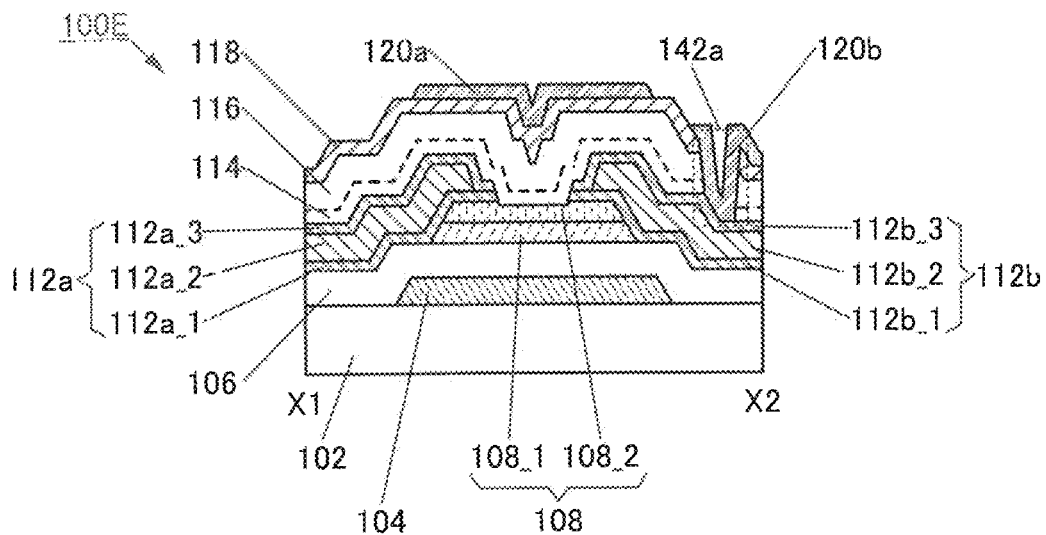
Figure 6C:
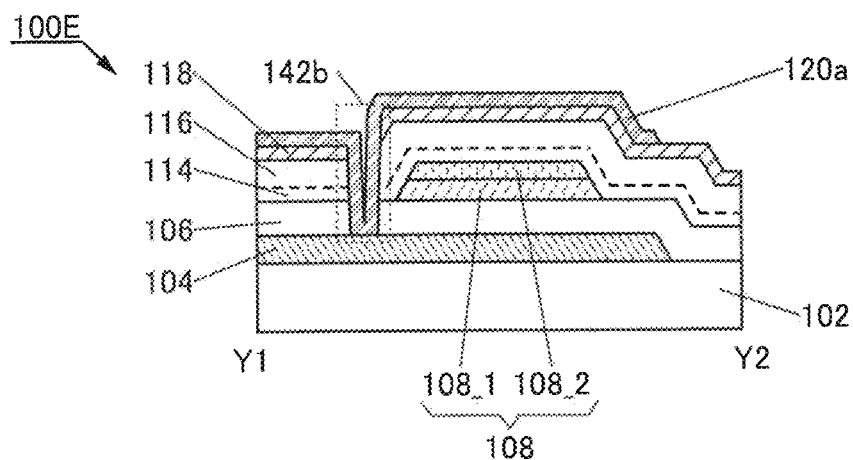

FIG. 6A is a top view of a transistor 100E that is a semiconductor device of one embodiment of the present invention. FIG. 6B is a cross-sectional view taken along the dashed-dotted line X1-X2 in FIG. 6A. FIG. 6C is a cross-sectional view taken along the dashed-dotted line Y1-Y2 in FIG. 6A.

The transistor 100E is different from the transistor 100D described above in the position of the conductive films 120a and 120b. Specifically, the conductive films 120a and 120b of the transistor 100E are positioned over the insulating film 118. Note that the other components of the transistor 100E are similar to those of the transistor 100D described above, and an effect similar to that of the transistor 100D can be obtained.

The structures of the transistors of this embodiment can be freely combined with each other.

<1-4. Structure Example 3 of Semiconductor Device>

Another embodiment of the transistors 100, 100A, 100B, 100C, 100D, and 100E shown in FIGS. 1A to 1C to FIGS. 6A to 6C will be described.

In each of the transistors 100, 100A, 100B, 100C, 100D, and 100E described above, the atomic ratio of In to Zn of the oxide semiconductor film 108_1 may be higher than the atomic ratio of In to Zn of the oxide semiconductor film 108_2. The atomic ratio of metal elements of the oxide semiconductor film 108_1 and the oxide semiconductor film 108_2 satisfying such conditions is described below.

For example, the atomic ratio of In to M to Zn in the oxide semiconductor film 108_1 is preferably In:M:Zn=4:2:3 or in its neighborhood. The atomic ratio of In, M, and Z in the oxide semiconductor film 108_2 is preferably In:M:Zn=1:1:1 or in its neighborhood. The term "neighborhood" includes the following: when In is 1, M is greater than or equal to 0.5 and less than or equal to 1.5, and Zn is greater than or equal to 0.1 and less than or equal to 2. The atomic ratio of In, M, and Zn in the oxide semiconductor film 108_2 is preferably In:M:Zn=5:1:6 or in its neighborhood. The term "neighborhood" includes the following: when In is 5, M is greater than or equal to 0.5 and less than or equal to 1.5, and Zn is greater than or equal to 5 and less than or equal to 7.

The electron affinity of the oxide semiconductor film 108_1 is higher than that of the oxide semiconductor films 108_2. The difference between the electron affinity of the oxide semiconductor film 108_1 and the electron affinity of the oxide semiconductor film 108_2 is preferably 0.15 eV or more or 0.5 eV or more and 2 eV or less or 1 eV or less. In other words, the energy level of the conduction band minimum of the oxide semiconductor films 108_2 is closer to the vacuum level than that of the oxide semiconductor film 108_1. Typically, a difference in energy level between the conduction band minimum of the oxide semiconductor film 108_1 and the conduction band minimum of the oxide semiconductor film 108_2 is preferably 0.15 eV or more or 0.5 eV or more and 2 eV or less or 1 eV or less.

In such a structure, the oxide semiconductor film 108_1 serves as a main path of current in the transistor 100. In other word, the oxide semiconductor film 108_1 has a function of a channel region. In addition, the oxide semiconductor film 108_2 is formed of an oxide semiconductor film consisting of the same metal elements as those of the oxide semiconductor film 108_1 where a channel region is formed. Owing to such a structure, interface scattering is unlikely to occur at the interface between the oxide semiconductor film 108_1 and the oxide semiconductor film 108_2. Thus, moving of carriers is not inhibited at the interface, and the field-effect mobility of the transistor is high.

In addition, in such a structure, variation in threshold voltage which depends on the level of a drain voltage can be prevented in the transistor 100, and the reliability of the transistor can be increased.

When the oxide semiconductor film 108_1 and the oxide semiconductor film 108_2 each independently include a region in which the atomic proportion of In is higher than the atomic proportion of M, the transistor 100 can have high field-effect mobility. Specifically, the field-effect mobility of the transistor 100 can be higher than 50 cm$^2$/Vs, preferably higher than 100 cm$^2$/Vs. When an oxide semiconductor in which the atomic ratio of In to Zn is larger than that of the oxide semiconductor film 108_2 is used as the oxide semiconductor film 108_1, the oxide semiconductor film 108_1 serves as a channel and becomes a main current path. The current path can be apart from the back channel; thus, the number of electron traps in the channel region can be reduced. As a result, variation in electrical characteristics of the transistor can be reduced.

When the atomic proportion of Zn is higher than the total proportion of In, M, and Zn, the crystallinity of the oxide semiconductor film can be higher. Impurities, for example, hydrogen, water, or constituent elements used in the conductive films 112a and 112b, are not easily diffused into the oxide semiconductor film with high crystallinity. This is an advantage of a CAAC-OS described below. When the atomic ratio of the metal elements contained in the oxide semiconductor film 108_2 is within the range, the amount of impurities in the oxide semiconductor film 108_1 and the oxide semiconductor film 108_2 can be reduced. Since the oxide semiconductor film 108_2 can serve as an etching stopper, variation in thickness of the oxide semiconductor film 108 between different transistors which might be caused by the etching of the conductive films 122a and 112b can be reduced. In this manner, by changing the atomic proportions of the metal elements contained in each of the oxide semiconductor film 108_1 and the oxide semiconductor film 108_2 (at least the proportions of In and Zn), the field effect mobility of the transistor 100 and the reliability of the of the transistor 100 can be increased.

<1-5-1. Manufacturing Method of Semiconductor Device>

Next, a manufacturing method of the transistor 100B that is a semiconductor device of one embodiment of the present invention is described with reference to FIGS. 7A to 7C, FIGS. 8A to 8C, FIGS. 9A to 9C and FIGS. 10A to 10C.

FIGS. 7A to 7C, FIGS. 8A to 8C, FIGS. 9A to 9C and FIGS. 10A to 10C are cross-sectional views illustrating a manufacturing method of the semiconductor device. In each of FIGS. 7A to 7C, FIGS. 8A to 8C, FIGS. 9A to 9C and FIGS. 10A to 10C, the left part is a cross-sectional view in the channel length direction, and the right part is a cross-sectional view in the channel width direction.

First, a conductive film is formed over the substrate 102 and processed through a lithography process and an etching process, whereby the conductive film 104 functioning as the first gate electrode is formed. Then, the insulating film 106 functioning as the first gate insulating film is formed over the conductive film 104 (see FIG. 7A).

In this embodiment, a glass substrate is used as the substrate 102, and as the conductive film 104 functioning as the first gate electrode, a 50-nm-thick titanium film and a 200-nm-thick copper film are each formed by a sputtering method. A 400-nm-thick silicon nitride film and a 50-nm-thick silicon oxynitride film as the insulating film 106 are formed by a PECVD method.

Note that the above-described silicon nitride film has a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the silicon nitride film has the above-described three-layer structure, for example, in the case where a conductive film including copper is used as the conductive film 104, the following effect can be obtained.

The first silicon nitride film can inhibit diffusion of copper from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 7A:
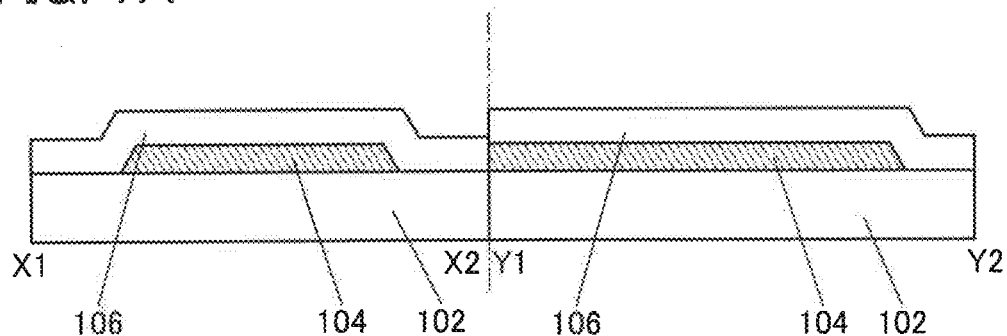
FIGS. 7A to 7C are cross-sectional views illustrating a method for manufacturing a semiconductor device.
Figure 7B:
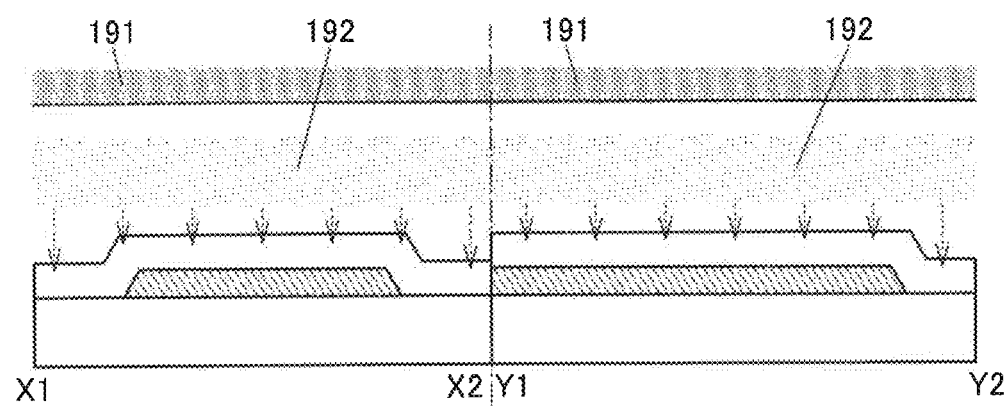
Figure 7C:
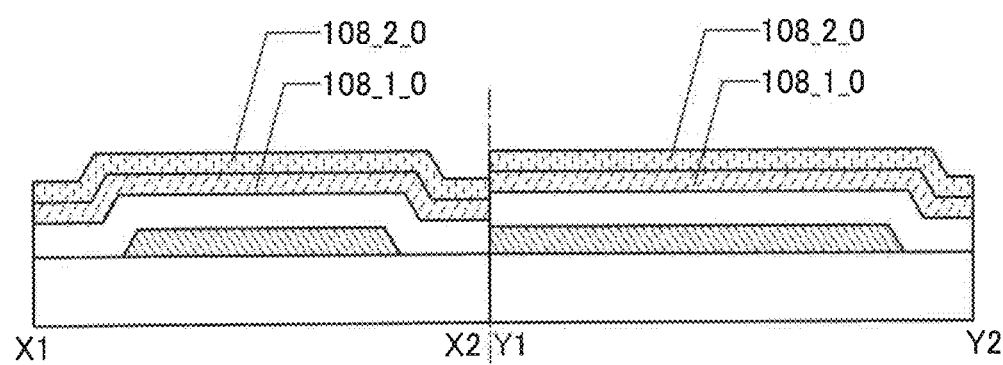

Next, an oxide semiconductor film 108_1_0 and an oxide semiconductor film 108_2_0 are formed over the insulating film 106 (see FIGS. 7B and 7C).

Note that FIG. 7B is a schematic cross-sectional view illustrating the inside of a deposition apparatus when the oxide semiconductor film 108_1_0 and the oxide semiconductor film 108_2_0 are formed over the insulating film 106. In FIG. 7B, a sputtering apparatus is used as the deposition apparatus, and a target 191 placed inside the sputtering apparatus and plasma 192 formed under the target 191 are schematically illustrated.

Note that in FIG. 7B, oxygen or excess oxygen added to the insulating film 106 is schematically shown by arrows of broken lines. When an oxygen gas is used in forming the oxide semiconductor film 108_1_0, oxygen can be suitably added to the insulating film 106.

First, the oxide semiconductor film 108_1_0 is formed over the insulating film 106. The thickness of the oxide semiconductor film 108_1_0 is greater than or equal to 1 nm and less than 25 nm, preferably greater than or equal to 5 nm and less than or equal to 20 nm. The oxide semiconductor film 108_1_0 is formed using one or both of an inert gas (typically, Ar gas) and an oxygen gas. Note that the proportion of the oxygen gas in the deposition gas for forming the oxide semiconductor film 108_1_0 (hereinafter also referred to as oxygen flow rate) is higher than or equal to 0% and lower than 30%, preferably higher than or equal to 5% and lower than or equal to 15%.

When the oxygen flow rate for forming the oxide semiconductor film 108_1_0 is set in the above range, the oxide semiconductor film 108_1_0 can have lower crystallinity than the oxide semiconductor film 108_2_0.

Next, the oxide semiconductor film 108_2_0 is formed over the oxide semiconductor film 108_1_0. Note that when the oxide semiconductor film 108_2_0 is formed, plasma discharge is performed in an atmosphere containing an oxygen gas. At this time, oxygen is added into the oxide semiconductor film 108_1_0 over which the oxide semiconductor film 108_2_0 is to be formed. The oxygen flow rate in forming the oxide semiconductor film 108_2_0 is higher than or equal to 30% and lower than or equal to 100%, preferably higher than or equal to 50% and lower than or equal to 100%, further preferably higher than or equal to 70% and lower than or equal to 100%.

The thickness of the oxide semiconductor film 108_2_0 is greater than or equal to 20 nm and less than or equal to 100 nm, preferably greater than or equal to 20 nm and less than or equal to 50 nm.

Note that the percentage of oxygen flow rate for forming the oxide semiconductor film 108_2_0 is preferably higher than the percentage of oxygen flow rate for forming the oxide semiconductor film 108_1_0 as described above. In other words, the oxide semiconductor film 108_1_0 is preferably formed under a lower oxygen partial pressure than the oxide semiconductor film 108_2_0.

The substrate temperature in forming the oxide semiconductor film 108_1_0 and the oxide semiconductor film 108_2_0 is set at higher than or equal to room temperature (25° C.) and lower than or equal to 200° C., preferably higher than or equal to room temperature and lower than or equal to 130° C. The substrate temperature in the above range is suitable in use of large glass substrates (e.g., the above-described 8th- to 10th-generation glass substrates). Specifically, when the substrate temperature in forming the oxide semiconductor film 108_1_0 and the oxide semiconductor film 108_2_0 is set at room temperature, bending or distortion of the substrate can be inhibited. To further increase the crystallinity of the oxide semiconductor film 108_2_0, the substrate temperature in forming the oxide semiconductor film 108_2_0 is preferably increased.

Note that it is more favorable to successively form the oxide semiconductor film 108_1_0 and the oxide semiconductor film 108_2_0 in a vacuum because impurities can be prevented from being caught at the interfaces.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the oxide semiconductor film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably $5\times10^{-5}$ Pa.

In this embodiment, the oxide semiconductor film 108_1_0 is formed by a sputtering method using an In—Ga—Zn metal oxide target (In:Ga:Zn=4:2:4.1 in an atomic ratio). The substrate temperature during the formation of the oxide semiconductor film 108_1_0 is room temperature, and an argon gas at a flow rate of 180 sccm and an oxygen gas at a flow rate of 20 sccm is used as a deposition gas (percentage of oxygen flow rate: 10%).

The oxide semiconductor film 108_2_0 is formed by a sputtering method using an In—Ga—Zn metal oxide target (In:Ga:Zn=4:2:4.1 in an atomic ratio). The substrate temperature during the formation of the oxide semiconductor film 108_2_0 is room temperature, and an oxygen gas at a flow rate of 200 sccm is used as a deposition gas (percentage of oxygen flow rate: 100%).

When the percentage of oxygen flow rate in forming the oxide semiconductor film 108_1_0 is different from that in forming the oxide semiconductor film 108_2_0, a layered film having a plurality of kinds of crystallinity can be formed.

Next, the oxide semiconductor film 108_1_0 and the oxide semiconductor film 108_2_0 are processed into desired shapes, so that the island-shaped oxide semiconductor film 108_1 and the island-shaped oxide semiconductor film 108_2 are formed. In this embodiment, the oxide semiconductor film 108_1 and the oxide semiconductor film 108_2 constitute the oxide semiconductor film 108 (see FIG. 8A).

Heat treatment (hereinafter referred to as first heat treatment) is preferably performed after the oxide semiconductor film 108 is formed. By the first heat treatment, water, hydrogen, or the like contained in the oxide semiconductor film 108 can be reduced. The heat treatment for the purpose of reducing hydrogen, water, and the like may be performed before the oxide semiconductor film 108 is processed into an island shape. Note that the first heat treatment is one kind of treatment for increasing the purity of the oxide semiconductor film.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate if the heating time is short. Therefore, the heat treatment time can be shortened. The first heat treatment may be performed under an atmosphere of nitrogen, oxygen, ultra-dry air (air with a water content of 20 ppm or less, preferably 1 ppm or less, further preferably 10 ppb or less), or a rare gas (e.g., argon, helium). It is preferable that hydrogen, water, and the like not be contained in the nitrogen, oxygen, ultra-dry air, or rare gas. Furthermore, after heat treatment is performed under a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the number of oxygen vacancies in the oxide semiconductor film can be reduced.

Figure 8A:
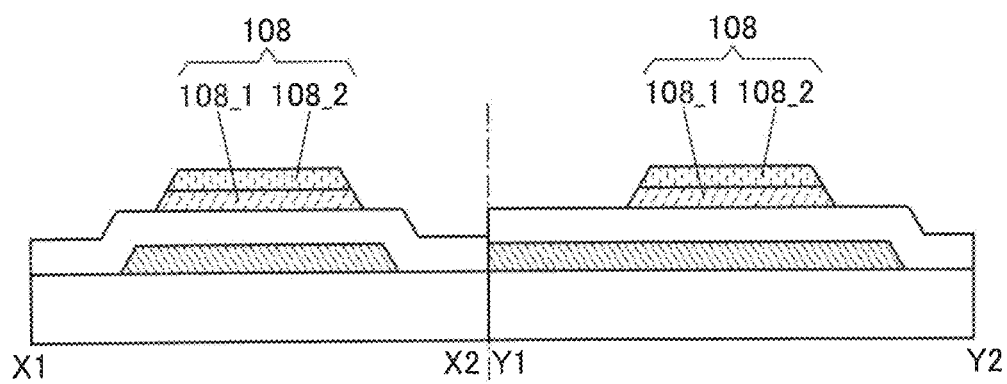
FIGS. 8A to 8C are cross-sectional views illustrating a method for manufacturing a semiconductor device.
Figure 8B:
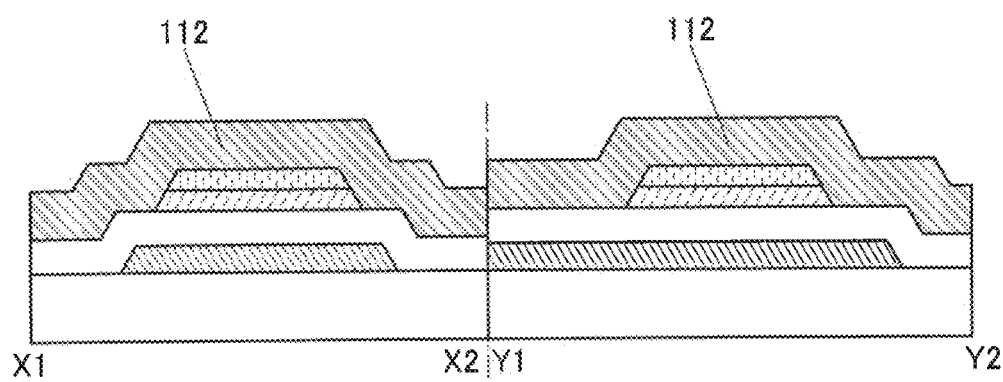

Next, a conductive film 112 is formed over the insulating film 106 and the oxide semiconductor film 108 (see FIG. 8B).

In this embodiment, as the conductive film 112, a 30-nm-thick titanium film, a 200-nm-thick copper film, and a 10-nm-thick titanium film are formed in this order by a sputtering method.

Figure 8C:
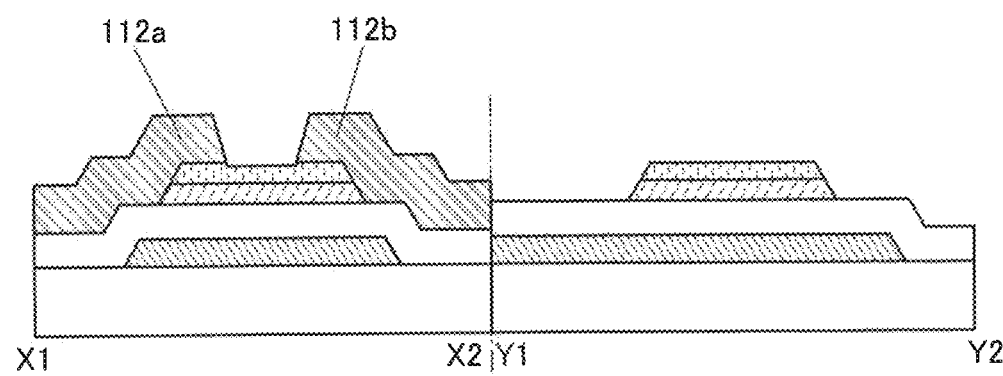

Next, the conductive film 112 is processed into a desired shape, so that the island-shaped conductive film 112a and the island-shaped conductive film 112b are formed (see FIG. 8C).

In this embodiment, the conductive film 112 is processed with a wet etching apparatus. Note that the method for processing the conductive film 112 is not limited to the above-described method, and a dry etching apparatus may be used, for example.

After the conductive films 112a and 112b are formed, a surface (on the back channel side) of the oxide semiconductor film 108 (specifically, the oxide semiconductor film 108_2) may be cleaned. The cleaning may be performed, for example, using a chemical solution such as a phosphoric acid. The cleaning using a chemical solution such as a phosphoric acid can remove impurities (e.g., an element included in the conductive films 112a and 112b) attached to the surface of the oxide semiconductor film 108_2. Note that the cleaning is not necessarily performed; in some cases, the cleaning is not performed.

In the step of forming the conductive films 112a and 112b and/or the cleaning step, the thickness of a region of the oxide semiconductor film 108 which is not covered with the conductive films 112a and 112b might be reduced.

Note that in the semiconductor device of one embodiment of the present invention, the region not covered with the conductive films 112a and 112b, i.e., an oxide semiconductor film 1092 is an oxide semiconductor film with improved crystallinity. Impurities (in particular, constituent elements used in the conductive films 112a and 112b) are not easily diffused into an oxide semiconductor film with high crystallinity. Accordingly, a highly reliable semiconductor device can be provided.

Although FIG. 8C illustrates an example in which the surface of the oxide semiconductor film 108 not covered with the conductive films 112a and 112b, i.e., the surface of the oxide semiconductor film 108_3 has a depression, one embodiment of the present invention is not limited to this example and the surface of the oxide semiconductor film 108 not covered with the conductive films 112a and 112b does not necessarily have a depression.

Figure 9A:
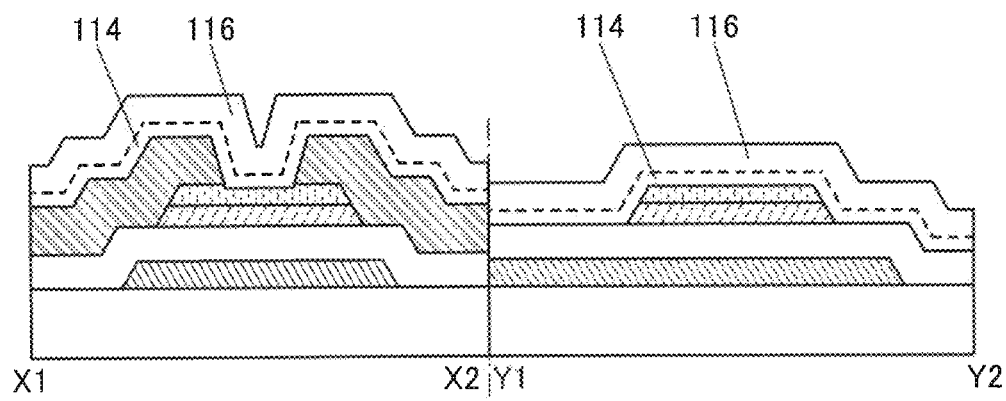
FIGS. 9A to 9C are cross-sectional views illustrating a method for manufacturing a semiconductor device.

Next, the insulating film 114 and the insulating film 116 are formed over the oxide semiconductor film 108 and the conductive films 112a and 112b (see FIG. 9A).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

For example, as the insulating film 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. The flow rate of the oxidizing gas is more than or equal to 20 times and less than or equal to 500 times, preferably more than or equal to 40 times and less than or equal to 100 times, that of the deposition gas.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor 100 can be improved.

Heat treatment (hereinafter referred to as second heat treatment) is preferably performed after the insulating films 114 and 116 are formed. The second heat treatment can reduce nitrogen oxide included in the insulating films 114 and 116. By the second heat treatment, part of oxygen contained in the insulating films 114 and 116 can be transferred to the oxide semiconductor film 108, so that the amount of oxygen vacancies included in the oxide semiconductor film 108 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. An electric furnace, RTA, or the like can be used for the heat treatment.

Figure 9B:
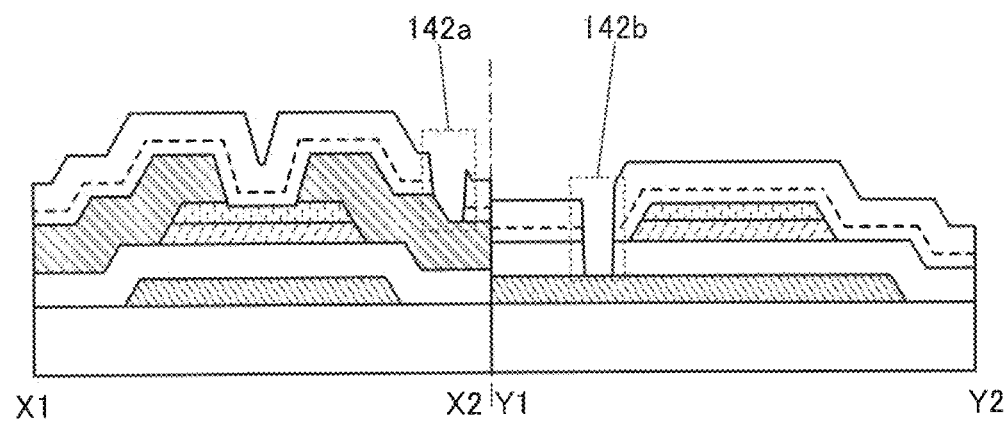

Next, the openings 142a and 142b are formed in desired regions in the insulating films 114 and 116 (see FIG. 9B).

In this embodiment, the openings 142a and 142b are formed with a dry etching apparatus. Note that the opening 142a reaches the conductive film 112b, and the opening 142b reaches the conductive film 104.

Figure 9C:
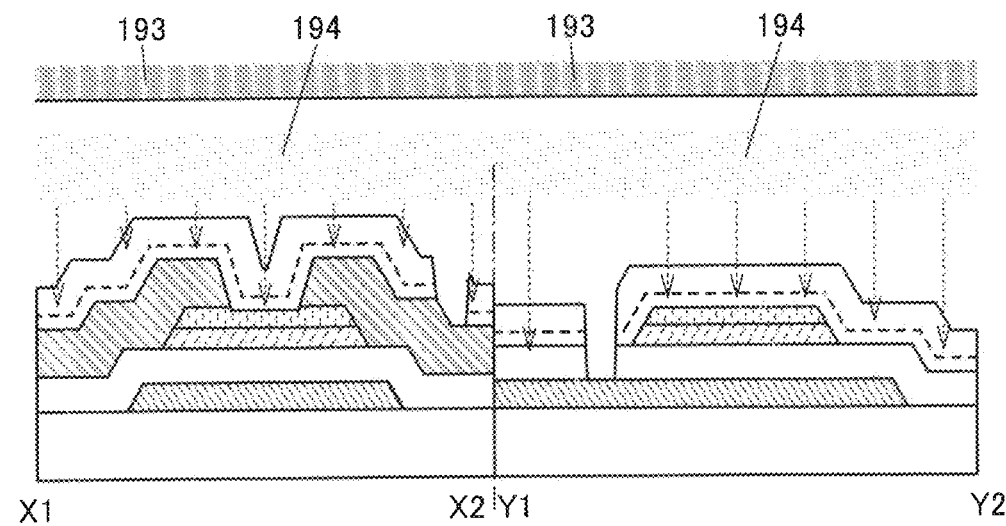
Figure 10A:
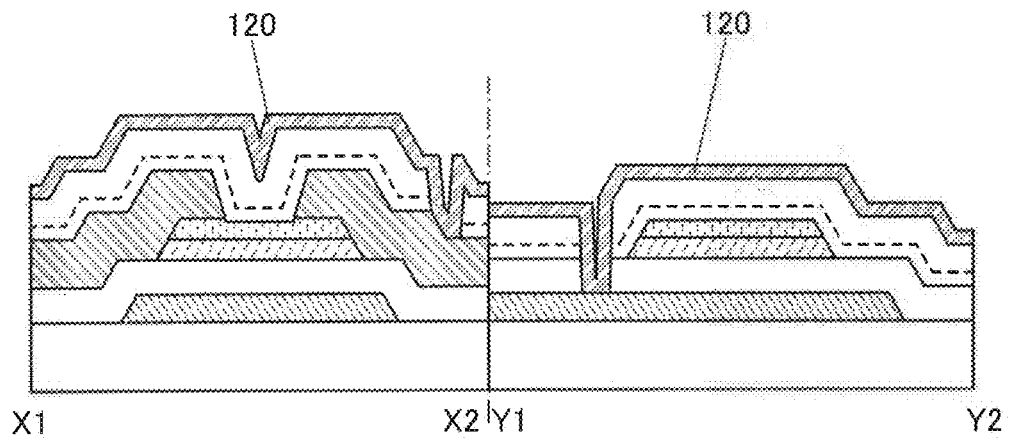
FIGS. 10A to 10C are cross-sectional views illustrating a method for manufacturing a semiconductor device.

Next, a conductive film 120 is formed over the insulating film 116 (see FIG. 9C and FIG. 10A).

FIG. 9C is a schematic cross-sectional view illustrating the inside of a deposition apparatus when the conductive film 120 is formed over the insulating film 116. In FIG. 9C, a sputtering apparatus is used as the deposition apparatus, and a target 193 placed inside the sputtering apparatus and plasma 194 formed under the target 193 are schematically illustrated.

When the conductive film 120 is formed, plasma discharge is performed in an atmosphere containing an oxygen gas. At this time, oxygen is added to the insulating film 116 over which the conductive film 120 is to be formed. When the conductive film 120 is formed, an inert gas (e.g., a helium gas, an argon gas, or a xenon gas) and the oxygen gas may be mixed.

The oxygen gas is mixed at least when the conductive film 120 is formed. The proportion of the oxygen gas in a deposition gas for forming the conductive film 120 is higher than 0% and lower than or equal to 100%, preferably higher than or equal to 10% and lower than or equal to 100%, further preferably higher than or equal to 30% and lower than or equal to 100%.

In FIG. 9C, oxygen or excess oxygen added to the insulating film 116 is schematically shown by arrows of broken lines.

In this embodiment, the conductive film 120 is formed by a sputtering method using an In—Ga—Zn metal oxide target (In:Ga:Zn=4:2:4.1 in an atomic ratio).

Note that although oxygen is added to the insulating film 116 when the conductive film 120 is formed in this embodiment, the method for adding oxygen is not limited to this example. For example, oxygen may be further added to the insulating film 116 after the conductive film 120 is formed.

As the method for adding oxygen to the insulating film 116, an ITSO film with a thickness of 5 nm may be formed using a target of an oxide including indium, tin, and silicon (an In—Sn—Si oxide, also referred to as ITSO) (In$_2$O$_3$:SnO$_2$:SiO$_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Figure 10B:
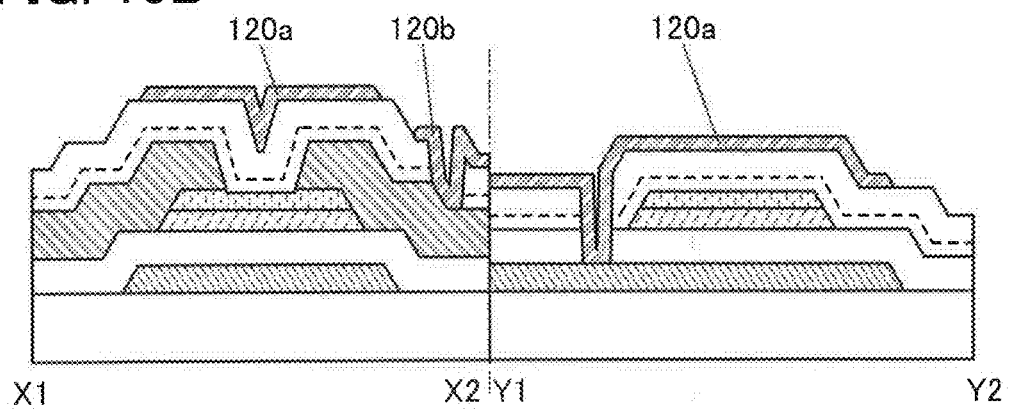

Next, the conductive film 120 is processed into a desired shape, so that the island-shaped conductive films 120a and 120b are formed (see FIG. 10B).

In this embodiment, the conductive film 120 is processed with a wet etching apparatus.

Figure 10C:
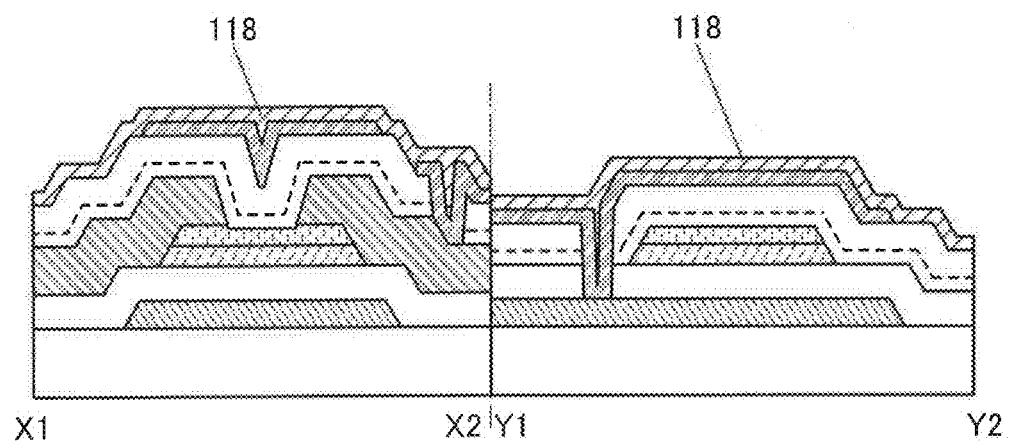

Next, the insulating film 118 is formed over the insulating film 116 and the conductive films 120a and 120b (see FIG. 10C).

The insulating film 118 includes either or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

In the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen are few, can be formed. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

In the case where the conductive films 120a and 120b are formed using an In—Ga—Zn metal oxide target (In:Ga:Zn=4:2:4.1 in an atomic ratio), either or both of hydrogen and nitrogen included in the insulating film 118 might enter the conductive films 120a and 120b. In this case, either or both of hydrogen and nitrogen might be bonded to oxygen vacancies in the conductive films 120a and 120b to cause a reduction in the resistance of the conductive films 120a and 120b.

After the insulating film 118 is formed, heat treatment similar to the first heat treatment or the second heat treatment (hereinafter referred to as third heat treatment) may be performed.

By the third heat treatment, oxygen included in the insulating film 116 moves into the oxide semiconductor film 108 to fill the oxygen vacancies in the oxide semiconductor film 108.

Through the above process, the transistor 100B illustrated in FIGS. 3A to 3C can be manufactured.

The transistor 100 illustrated in FIGS. 1A to 1C can be manufactured by forming the insulating film 118 after the step of FIG. 9A. The transistor 100A illustrated in FIGS. 2A to 2C can be manufactured by changing the formation order of the conductive films 112a and 112b and the insulating films 114 and 116 and, in addition, adding a step for forming the openings 141a and 141b in the insulating films 114 and 116.

<1-5-2. Manufacturing Method 2 of Semiconductor Device>

Another manufacturing method of the transistor 100B that is a semiconductor device of one embodiment of the present invention is described. Different points are the structure and the manufacturing method of oxide semiconductor films. Described here is a manufacturing method of the transistor 100B in which the atomic ratio of In to Zn in the oxide semiconductor film 108_1 is larger than the atomic ratio of In to Zn in the oxide semiconductor film 108_2 as described in <1-4. Structure example 3 of semiconductor device>.

The oxide semiconductor film 108_1_0 is formed by a sputtering method using an In—Ga—Zn metal oxide target (In:Ga:Zn=4:2:4.1 in an atomic ratio). When the oxide semiconductor film 108_1_0 is formed, the substrate temperature is room temperature, and an argon gas at a flow rate of 180 sccm and an oxygen gas at a flow rate of 20 sccm are used as the deposition gas (oxygen flow rate is 10%).

In addition, the oxide semiconductor film 108_2_0 is formed by a sputtering method using an In—Ga—Zn metal oxide target (In:Ga:Zn=1:1:1 [atomic ratio]). When the oxide semiconductor film 108_2_0 is formed, the substrate temperature is 170° C., and an argon gas at a flow rate of 100 sccm and an oxygen gas at a flow rate of 100 sccm are used as the deposition gas (oxygen flow rate is 50%).

Since the oxygen flow rate in forming the oxide semiconductor film 108_1_0 is different from that in forming the oxide semiconductor film 108_2_0, a stacked-layer film having different crystallinity can be formed. In addition, since the temperature in forming the oxide semiconductor film 108_1_0 is different from that in forming the oxide semiconductor film 108_2_0, a stacked-layer film having different crystallinity can be formed.

To make the crystallinity of the oxide semiconductor film 108_2_0 much higher than that of the oxide semiconductor film 108_1_0, the substrate temperature in forming the oxide semiconductor film 108_2_0 is preferably set higher than that in forming the oxide semiconductor film 108_1_0.

<1-5-1. Manufacturing Method 1 of Semiconductor Device> can be Referred to for Other Steps as Appropriate.

Through the above-described process, the transistor described in <1-4. Structure example 3 of semiconductor device> can be manufactured.

At least part of this embodiment can be implemented in combination with any of the other embodiments and the other examples described in this specification as appropriate.

Embodiment 2

In this embodiment, an oxide semiconductor film of one embodiment of the present invention is described with reference to FIGS. 12A and 12B to FIGS. 18A to 18C.

<2-1. Oxide Semiconductor Film>

The oxide semiconductor film preferably contains at least indium. In particular, indium and zinc are preferably contained. In addition, aluminum, gallium, yttrium, tin, or the like is preferably contained. One or more elements selected from boron, silicon, titanium, iron, nickel, germanium, zirconium, molybdenum, lanthanum, cerium, neodymium, hafnium, tantalum, tungsten, magnesium, or the like may be contained.

Here, the oxide semiconductor film is assumed to contain indium, an element M, and zinc. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M In the description below, the terms of the atomic ratio of indium to the element M and zinc contained in the oxide semiconductor film are denoted by [In], [M], and [Zn], respectively, in some cases.

<2-2. Structure of Oxide Semiconductor Film>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion in the CAAC-OS is a portion where the direction of a lattice arrangement changes between a region with a regular lattice arrangement and another region with a regular lattice arrangement in a region in which nanocrystals are connected.

The shape of the nanocrystal is basically hexagon; however, the shape is not always a regular hexagon and is a non-regular hexagon in some cases. At the distortion, a polygonal nanocrystal such as a pentagonal nanocrystal or a heptagonal nanocrystal is included in some cases. Note that a clear grain boundary cannot be observed even in the vicinity of distortion in the CAAC-OS. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

The a-like OS has a structure between those of the nc-OS and the amorphous oxide semiconductor. The a-like OS contains a void or a low-density region. That is, the a-like OS has an unstable structure as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

The oxide semiconductor film of one embodiment of the present invention includes a composite oxide semiconductor. Therefore, an oxide semiconductor film may be referred to as a composite oxide semiconductor in the description below. The use of a composite oxide semiconductor can provide a transistor having high field effect mobility. FIGS. 12A and 12B to FIG. 14A to 14B are conceptual diagrams of an oxide semiconductor film including a composite oxide semiconductor.

Figure 12A:
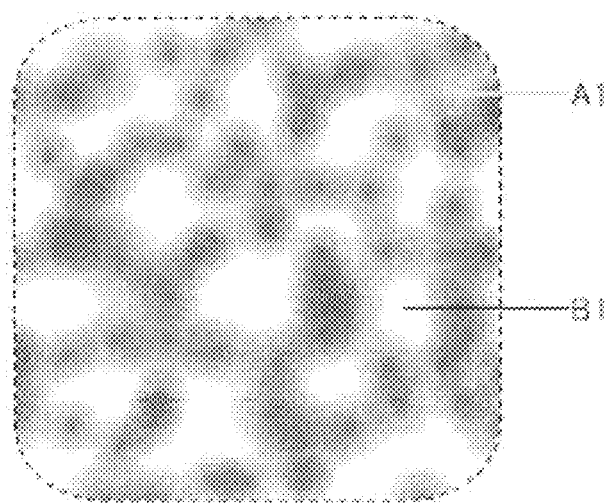
FIGS. 12A and 12B are a schematic top view and a schematic cross-sectional view illustrating a composite oxide semiconductor.
Figure 12B:
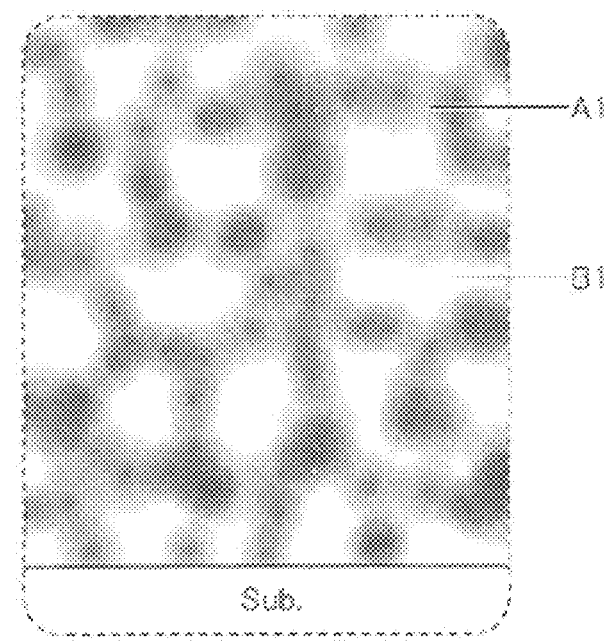

FIG. 12A is a conceptual diagram of an upper surface (here, referred to as a-b plane direction) of an oxide semiconductor film FIG. 12B is a conceptual diagram of a cross section (here, referred to as c-axis direction) of the oxide semiconductor formed over a substrate Sub.

Note that FIGS. 12A and 12B illustrate an example in which the oxide semiconductor film is formed over the substrate; however, one embodiment of the present invention is not limited to this example and an insulating film such as a base film or an interlayer film or another semiconductor film such as an oxide semiconductor film may be formed between the substrate and the oxide semiconductor film.

The oxide semiconductor film of one embodiment of the present invention is a composite oxide semiconductor including Region A1 and Region B1 as illustrated in FIGS. 12A and 12B.

Region A1 shown in FIGS. 12A and 12B is high in In with [In]:[M]:[Zn]=x:y:z (x>0, y≥0, z≥0). In contrast, Region B1 is low in In with [In]:[M]:[Zn]=a:b:c (a>0, b>0, c>0).

Note that in this specification, when the atomic ratio of In to the element M in Region A1 is greater than the atomic ratio of In to the element M in Region B1, Region A1 has a higher In concentration than Region B1. Therefore, in this specification, Region A1 is also referred to as an In-rich region, and Region B1 is also referred to as an In-poor region.

For example, the In concentration in Region A1 is 1.1 or more times, preferably 2 to 10 times that in Region B1. The region A1 is an oxide containing at least In and does not necessarily contain the element M and Zn.

In the oxide semiconductor film of one embodiment of the present invention, Region A1 and Region B1 form a composite. That is, carrier movement occurs easily in Region A1, whereas carrier movement does not occur easily in Region B1. Therefore, the oxide semiconductor of one embodiment of the present invention can be used as a material with high carrier mobility, excellent switching characteristics, and favorable semiconductor characteristics.

In other words, Region A1 has a lower semiconductor property and higher conductivity than Region B1. Conversely, Region B1 has a higher semiconductor property and lower conductivity than Region A1. Here, a high semiconductor property means a wide band gap, favorable switching characteristics, being close to an i-type semiconductor, or the like.

For example, as shown in FIGS. 12A and 12B, a plurality of Regions A1 are present in particulate form (in cluster form) in the a-b plane direction and the c-axis direction. Note that clusters may be distributed unevenly and irregularly. A plurality of clusters overlaps each other or is connected to each other in some cases. For example, in some cases, shapes each including a cluster overlapping with another cluster are connected to each other, so that Region A1 is observed to extend in a cloud-like manner.

In other words, the clusters contained in Region A1 (also referred to as first clusters) have a lower semiconductor property and higher conductivity than the clusters contained in Region B1 (also referred to as second clusters). Conversely, the clusters contained in Region B1 have a higher semiconductor property and lower conductivity than the clusters contained in Region A1. In this structure, Region B1 includes a plurality of second clusters and has a portion where the plurality of second clusters is connected to each other. In other words, the plurality of first clusters included in Region A1 includes a portion where the first cluster and another first cluster are connected to each other in a cloud-like manner, and the plurality of second clusters included in Region B1 includes a portion where the second cluster and another second cluster are connected to each other in a cloud-like manner.

In other words, in the composite oxide semiconductor of one embodiment of the present invention, a first region (Region A1) with a high In concentration and a second region (Region B1) with a low In concentration are connected in a cloud-like manner. Alternatively, in the composite oxide semiconductor of one embodiment of the present invention, the first region where In is distributed at a high concentration and the second region where In is not distributed at a high concentration are connected in a cloud-like manner.

As shown in FIGS. 12A and 12B, Regions A1 are connected to each other in the a-b plane direction, so that Regions A1 can serve as a current path. Accordingly, the oxide semiconductor film can have increased conductivity and a transistor using this oxide semiconductor film can have increased field-effect mobility.

In other words, Regions B1 shown in FIGS. 12A and 12B are scattered in Regions A1. Therefore, Region B1 can exist in a state of being sandwiched three-dimensionally by Regions A1. In other words, Region B1 can exist in a state of being surrounded by Region A1. That is, Region B1 is enclosed by Region A1.

Note that the proportion of scattered Regions A1 can be adjusted by changing, for example, the formation conditions or composition of the composite oxide semiconductor. For example, it is possible to form a composite oxide semiconductor with a low proportion of Regions A1 or a composite oxide semiconductor with a high proportion of Regions A1. In a composite oxide semiconductor of one embodiment of the present invention, the proportion of Regions A1 is not always lower than that of Regions B1. In a composite oxide semiconductor with an extremely high proportion of Regions A1, depending on the observation range, Region B1 is sometimes formed in Region A1. The size of the particulate region of Region A1 can be appropriately adjusted by changing, for example, the formation conditions or composition of the composite oxide semiconductor.

Figure 13A:
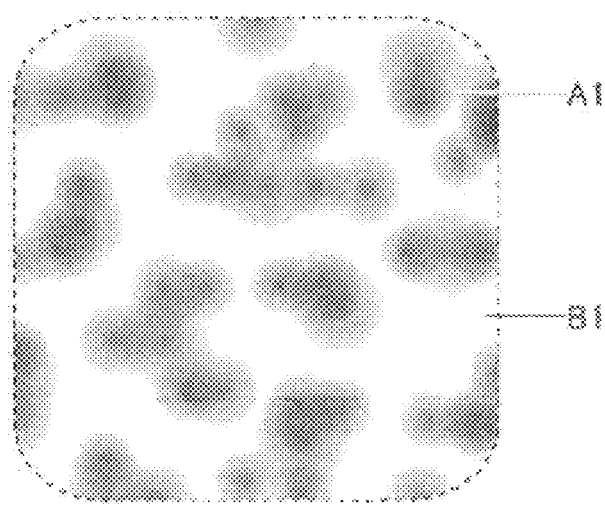
FIGS. 13A and 13B are a schematic top view and a schematic cross-sectional view illustrating a composite oxide semiconductor.
Figure 13B:
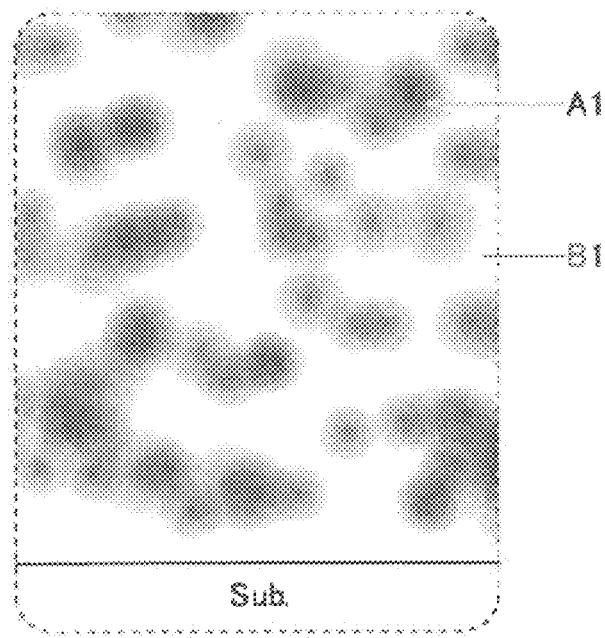

FIGS. 13A and 13B show a composite oxide semiconductor that has a lower proportion of Regions A1 and a higher proportion of Regions B1 than the composite oxide semiconductor shown in FIGS. 12A and 12B.

Note that by changing the formation conditions or composition of the composite oxide semiconductor, it is possible to form a composite oxide semiconductor that has a higher proportion of Regions A1 and a lower proportion of Regions B1 than the composite oxide semiconductor shown in FIGS. 12A and 12B.

Here, when all of Regions A1 are connected in the a-b plane direction, the switching characteristics of a transistor deteriorate in some cases. For example, the off-state current of the transistor might increase. It is thus preferable that as shown in FIGS. 13A and 13B, Regions A1 be scattered in Regions B1. Therefore, Region A1 can exist in a state of being sandwiched three-dimensionally by Regions B1. In other words, Region A1 can exist in a state of being surrounded by Region B1. That is, Region A1 is enclosed by Region B1. As a result, the switching characteristics of the transistor can be improved. Specifically, the off-state current can be reduced.

In some cases, the boundary between Region A1 and Region B1 is not clearly observed. The sizes of Region A1 and Region B1 can be measured with energy dispersive X-ray spectroscopy (EDX) mapping images obtained by EDX. For example, the diameter of a cluster in Region A1 is greater than or equal to 0.1 nm and less than or equal to 2.5 nm in the EDX mapping image of a cross-sectional photograph or a plan-view photograph in some cases. Note that the diameter of the cluster is preferably greater than or equal to 0.5 nm and less than or equal to 1.5 nm.

As described above, an oxide semiconductor of one embodiment of the present invention is a composite oxide semiconductor in which Region A1 and Region B1 are mixed and have different functions that are complementary to each other. For example, when an oxide semiconductor of one embodiment of the present invention is an In—Ga—Zn oxide (hereinafter referred to as IGZO), in which Ga is used as the element M, the oxide semiconductor can be called complementary IGZO (abbreviation: C/IGZO).

In contrast, when Region A1 and Region B1 are stacked in a layered manner, for example, interaction does not take place or is unlikely to take place between Region A1 and Region B1, so that the function of Region A1 and that of Region B1 are independently performed in some cases. In that case, even when the carrier mobility is increased owing to Region A1, the off-state current of the transistor might be increased. Therefore, in the case where the above-described composite oxide semiconductor or C/IGZO is used, a function of achieving high carrier mobility and a function of achieving excellent switching characteristics can be obtained at the same time. This is an advantageous effect obtained by using the composite oxide semiconductor of the present invention.

Note that Region B1 may be a region having crystallinity. For example, Region B1 includes the CAAC-OS or a plurality of nanocrystals.

Figure 14A:
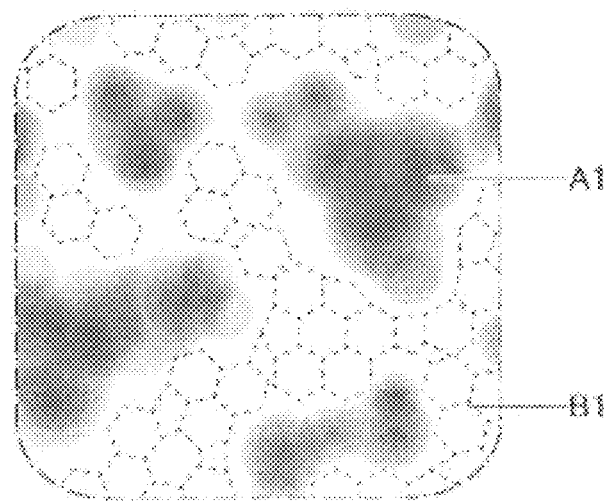
FIGS. 14A and 14B are a schematic top view and a schematic cross-sectional view illustrating a composite oxide semiconductor.

In FIG. 14A, a plurality of nanocrystals contained in Region B1 are schematically shown by dashed lines. The shape of the nanocrystal is basically hexagon. However, the shape is not always a regular hexagon and is a non-regular hexagon in some cases. At the distortion in the hexagon, a polygonal nanocrystal such as a pentagonal nanocrystal or a heptagonal nanocrystal is included in some cases.

Figure 14B:
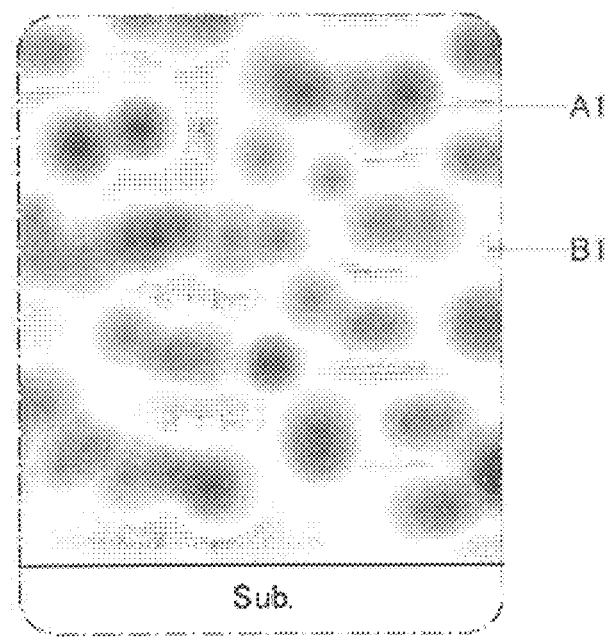

Furthermore, FIG. 14B schematically show that nanocrystals have c-axis alignment and the c-axes are aligned in a direction substantially perpendicular to a surface over which the CAAC-OS film is formed (also referred to as a formation surface) or the top surface of the CAAC-OS film. The CAAC-OS has a layered crystal structure (also referred to as a layered structure) having c-axis alignment and includes a layer containing indium and oxygen (hereinafter referred to as an In layer) and a layer containing the element M, zinc, and oxygen (hereinafter referred to as an (M,Zn) layer) that are stacked.

Note that indium and the element M are replaced with each other in some cases. Therefore, when the element M in the (M,Zn) layer is replaced with indium, the layer can also be referred to as an (In,M,Zn) layer. In that case, the In layer and the (In,M,Zn) layer are stacked in the layered structure.

<2-3. Atomic Ratio of Composite Oxide Semiconductor>

The atomic ratio of elements included in the composite oxide semiconductor of one embodiment of the present invention will be described here.

A phase diagram in FIG. 15 can be used to show the atomic ratio of elements in the case where Region A1 in the composite oxide semiconductor contains In, the element M, and Zn. The atomic ratio of In to the element M and Zn is denoted by x:y:z. This atomic ratio can be shown as coordinates (x:y:z) in FIG. 15. Note that the proportion of oxygen atoms is not illustrated in FIG. 15.

In FIG. 15, dashed lines correspond to a line representing the atomic ratio of $[In]:[M]:[Zn]=(1+\alpha):(1-\alpha):1$ ($-1\leq\alpha\leq1$), a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Dashed-dotted lines correspond to a line representing the atomic ratio of $[In]:[M]:[Zn]=1:1:\beta$ ($\beta\geq0$), a line representing the atomic ratio of [In]:[M]:[Zn]=1:2:13, a line representing the atomic ratio of [In]:[M]:[Zn]=1:3: β, a line representing the atomic ratio of [In]:[M]:[Zn]=1:4: β, a line representing the atomic ratio of [In]:[M]:[Zn]=1:7: β, a line representing the atomic ratio of [In]:[M]:[Zn]=2:1: β, and a line representing the atomic ratio of [In]:[M]:[Zn]=5:1:β.

An oxide semiconductor having the atomic ratio of [In]:[M]:[Zn]=0:2:1 or a neighborhood thereof in FIG. 15 tends to have a spinel crystal structure.

Region A2 in FIG. 15 represents an example of a preferred range of atomic ratios of indium to the element M and zinc contained in Region A1. Note that Region A2 includes atomic ratios on a line representing the atomic ratio of [In]:[M]:[Zn]=(1+γ):0:(1−γ)(−1≤γ≤1).

Region B2 in FIG. 15 represents an example of a preferred range of atomic ratios of indium to the element M and zinc contained in Region B1. Note that Region B2 includes atomic ratios from [In]:[M]:[Zn]=4:2:3 to [In]:[M]:[Zn]=4:2:4.1 and a neighborhood thereof. The neighborhood includes an atomic ratio of [In]:[M]:[Zn]=5:3:4. Region B2 includes an atomic ratio of [In]:[M]:[Zn]=5:1:6 and a neighborhood thereof.

Region A2 with high In concentrations provides a higher conductivity than Region B2 and has a function of increasing carrier mobility (field-effect mobility). Therefore, the on-state current and carrier mobility of a transistor using an oxide semiconductor film including Region A1 can be increased.

In contrast, Region B2 with low In concentrations provides a lower conductivity than Region A2 and has a function of decreasing leakage current. Therefore, the off-state current of a transistor using an oxide semiconductor film including Region B1 can be decreased.

For example, Region A1 is preferably a non-single-crystal. Note that in the case where Region A1 has crystallinity, when Region A1 is formed of indium, Region A1 tends to have a tetragonal crystal structure. Furthermore, when Region A1 is formed of indium oxide ([In]:[M]:[Zn]=x:0:0 (x>0)), Region A1 tends to have a bixbyite crystal structure. Furthermore, when Region A1 is formed of an In—Zn oxide ([In]:[M]:[Zn]=x:0:z (x>0, z>0)), Region A1 tends to have a layered crystal structure.

For example, Region B1 is preferably a non-crystal and includes a CAAC-OS. Note that Region B1 does not necessarily include only a CAAC-OS and may also include a region of a polycrystalline oxide semiconductor, an nc-OS, or the like.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, with the CAAC-OS, a composite oxide semiconductor is physically stable; thus, a composite oxide semiconductor which is resistant to heat and has high reliability can be provided.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Note that characteristics of the composite oxide semiconductor of one embodiment of the present invention are not uniquely determined by the atomic ratio. Therefore, the illustrated regions represent preferred atomic ratios of Region A1 and Region B1 of the composite oxide semiconductor; a boundary therebetween is not clear.

<2-4. Method for Manufacturing Composite Oxide Semiconductor>

An example of a method for manufacturing the composite oxide semiconductor shown in FIGS. 12A and 12B and the like is described. A composite oxide semiconductor of one embodiment of the present invention can be formed with a sputtering apparatus.

[Sputtering Apparatus]

Figure 16A:
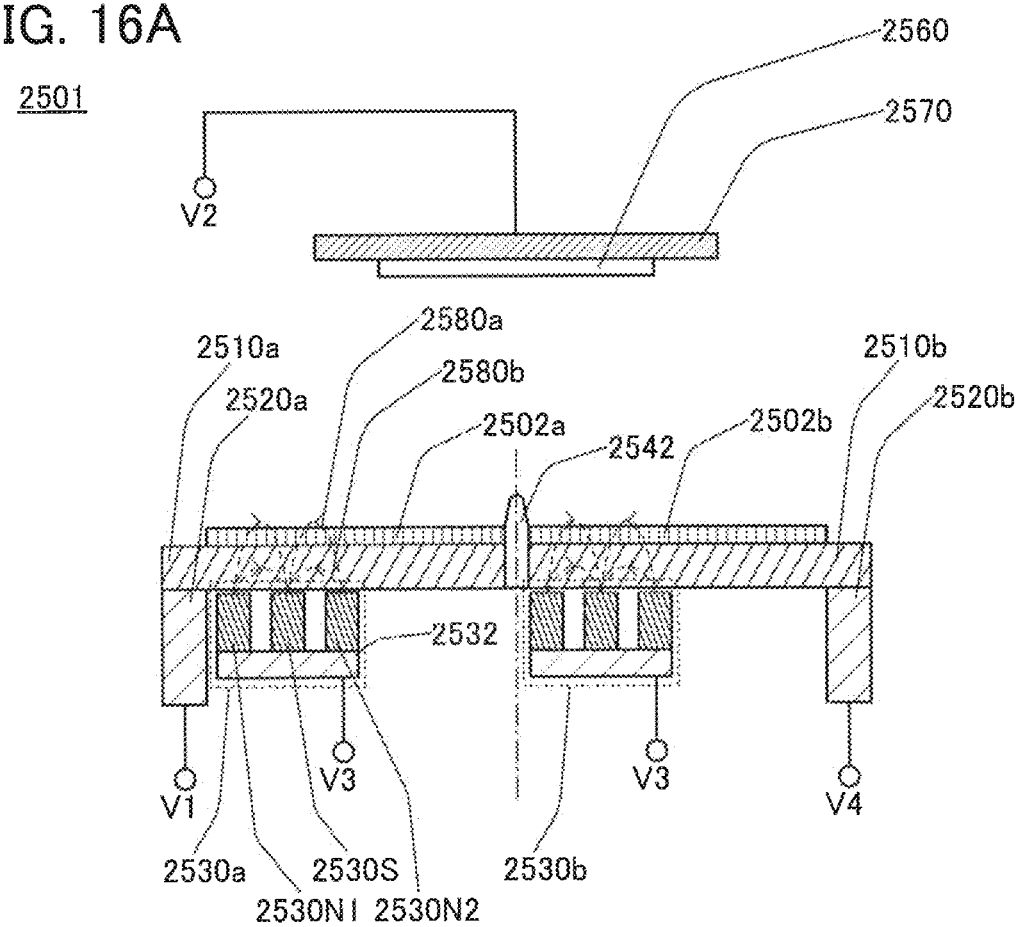
FIGS. 16A and 16B illustrate a sputtering apparatus.
Figure 16B:
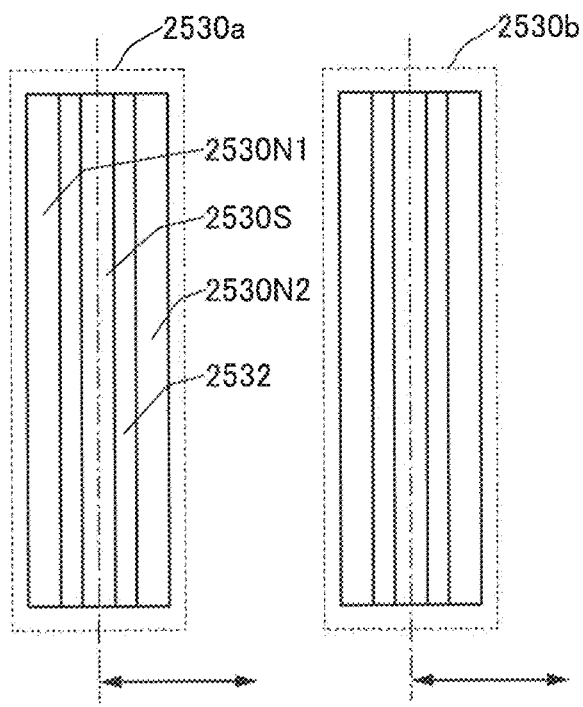

FIG. 16A is a cross-sectional view of a deposition chamber 2501 of the sputtering apparatus. FIG. 16B is a plan view of a magnet unit 2530a and a magnet unit 2530b of the sputtering apparatus.

The deposition chamber 2501 illustrated in FIG. 16A includes a target holder 2520a, a target holder 2520b, a backing plate 2510a, a backing plate 2510b, a target 2502a, a target 2502b, a member 2542, and a substrate holder 2570. Note that the target 2502a is placed over the backing plate 2510a. The backing plate 2510a is placed over the target holder 2520a. The magnet unit 2530a is placed under the target 2502a with the backing plate 2510a therebetween. The target 2502b is placed over the backing plate 2510b. The backing plate 2510b is placed over the target holder 2520b. The magnet unit 2530b is placed under the target 2502b with the backing plate 2510b therebetween.

As illustrated in FIGS. 16A and 16B, the magnet unit 2530a includes a magnet 2530N1, a magnet 2530N2, a magnet 2530S, and a magnet holder 2532. The magnet 2530N1, the magnet 2530N2, and the magnet 2530S are placed over the magnet holder 2532 in the magnet unit 2530a. The magnet 2530N1, the magnet 2530N2, and the magnet 2530S are spaced. Note that the magnet unit 2530b has a structure similar to that of the magnet unit 2530a. When the substrate 2560 is transferred into the deposition chamber 2501, the substrate 2560 is placed in contact with the substrate holder 2570.

The target 2502a, the backing plate 2510a, and the target holder 2520a are separated from the target 2502b, the backing plate 2510b, and the target holder 2520b by the member 2542. Note that the member 2542 is preferably an insulator. The member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2502a with the backing plate 2510a positioned therebetween. The target holder 2520b and the backing plate 2510b are fixed to each other with a screw (e.g., a bolt) and have the same potential. The target holder 2520b has a function of supporting the target 2502b with the backing plate 2510b positioned therebetween.

The backing plate 2510a has a function of fixing the target 2502a. The backing plate 2510b has a function of fixing the target 2502b.

Magnetic lines of force 2580a and 2580b formed by the magnet unit 2530a are illustrated in FIG. 16A.

As illustrated in FIG. 16B, the magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown by an arrow in FIG. 16B. For example, the magnet unit 2530a may be oscillated with a beat of greater than or equal to 0.1 Hz and less than or equal to 1 kHz.

The magnetic field over the target 2502a changes in accordance with oscillation of the magnet unit 2530a. The region with an intense magnetic field is a high-density plasma region; thus, sputtering of the target 2502a easily occurs in the vicinity of the region. The same applies to the magnet unit 2530b.

<2-5. Formation Method Composite Oxide Semiconductor>

Figure 17:
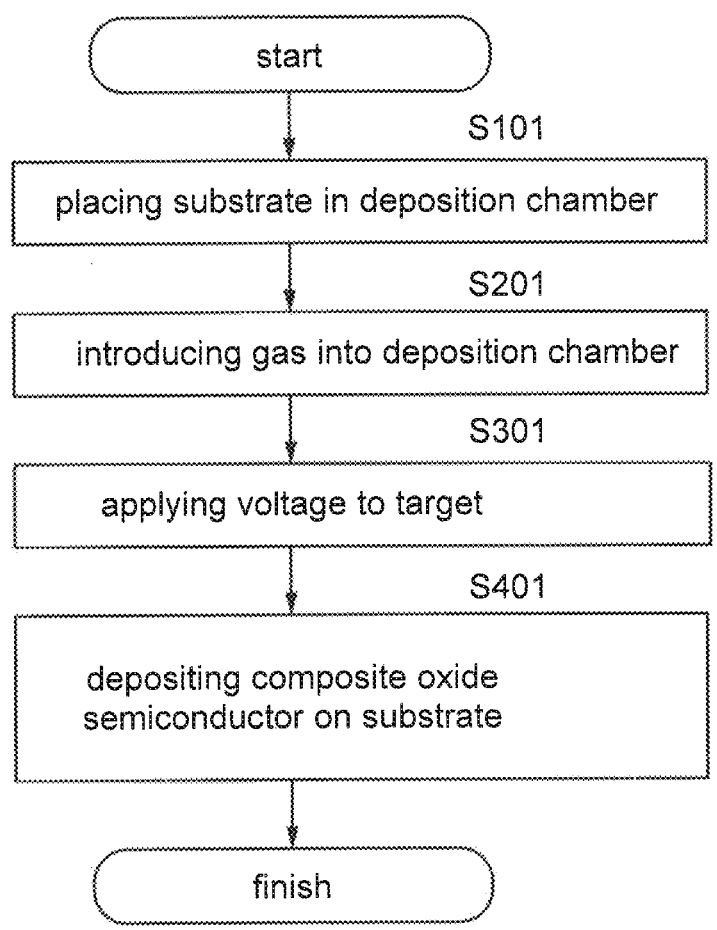
FIG. 17 is a process flow chart showing a method for manufacturing a composite oxide semiconductor.

Next, a formation method of a composite oxide semiconductor is described. FIG. 17 is a process flow chart showing the manufacturing method of a composite oxide semiconductor.

A composite oxide semiconductor shown in FIGS. 12A and 12B and the like are formed through at least first to fourth steps shown in FIG. 17.

[First Process: Process of Placing Substrate in Deposition Chamber]

The first process includes a step of placing a substrate in a deposition chamber (see Step S101 in FIG. 17).

In the first process, for example, the substrate 2560 is placed on the substrate holder 2570 of the deposition chamber 2501 shown in FIG. 16A.

The temperature of the substrate 2560 in deposition influences the electrical properties of a composite oxide semiconductor. The higher the substrate temperature is, the higher the crystallinity and reliability of the composite oxide semiconductor can be. In contrast, the lower the substrate temperature is, the lower the crystallinity of the composite oxide semiconductor can be and the higher the carrier mobility thereof can be. In particular, the lower the substrate temperature in deposition is, the more the field-effect mobility at a low gate voltage (e.g., higher than 0 V and lower than or equal to 2 V) is notably increased in a transistor including the composite oxide semiconductor.

The temperature of the substrate 2560 is higher than or equal to room temperature (25° C.) and lower than or equal to 200° C., preferably higher than or equal to room temperature and lower than or equal to 170° C., further preferably higher than or equal to room temperature and lower than or equal to 130° C. Setting the substrate temperature in the above range is favorable for large glass substrates (e.g., the above-described 8th- to 10th-generation glass substrates). In particular, when the substrate temperature in deposition of a composite oxide semiconductor is room temperature, i.e., the substrate is not heated intentionally, the substrate can be favorably prevented from bending or warping.

The substrate 2560 may be cooled with a cooling mechanism or the like provided for the substrate holder 2570.

When the temperature of the substrate 2560 is higher than or equal to 100° C. and lower than or equal to 130° C., water in the composite oxide semiconductor can be removed. Removing water, which is an impurity, in such a manner leads to high field-effect mobility and high reliability.

The temperature of the substrate 2560 is set to higher than or equal to 100° C. and lower than or equal to 130° C. for removal of water, whereby the sputtering apparatus can be prevented from warping due to overheat. This leads to an improvement in productivity of a semiconductor device. The productivity is stabilized, so that a large-scale production apparatus is easy to employ. Thus, a large display device manufactured using a large substrate can be easily manufactured.

When the temperature of the substrate 2560 is high, water in the composite oxide semiconductor can be more effectively removed and moreover, the composite oxide semiconductor can have increased crystallinity. For example, the temperature of the substrate 2560 is set to higher than or equal to 80° C. and lower than or equal to 200° C., preferably higher than or equal to 100° C. and lower than or equal to 170° C., whereby a composite oxide semiconductor with high crystallinity can be formed.

[Second Process: Process of Introducing Gas into Deposition Chamber]

The second step includes a step of introducing gas into the deposition chamber (see step S201 in FIG. 17).

In the second step, for example, gas is introduced into the deposition chamber 2501 shown in FIG. 16A. An argon gas and/or an oxygen gas are/is introduced as the gas. Note that instead of an argon gas, an inert gas such as helium, xenon, or krypton can be used.

The oxygen flow rate in forming a composite oxide semiconductor using an oxygen gas shows the following tendency. The higher the oxygen flow rate is, the higher the crystallinity of the composite oxide semiconductor is and the higher the reliability is. In contrast, the lower the oxygen flow rate is, the lower the crystallinity of the composite oxide semiconductor is and the higher the carrier mobility is. Specifically, in a transistor including the composite oxide semiconductor, the smaller the oxygen flow rate is, the more notably the field-effect mobility at a low gate voltage (e.g., higher than 0 V and lower than or equal to 2 V) is increased.

The oxygen flow rate ratio can be appropriately set in the range from 0% to 100% inclusive so that favorable characteristics of the composite oxide semiconductor suitable to the uses can be obtained.

For example, in the case where the composite oxide semiconductor is used for a semiconductor layer of a transistor having high field-effect mobility, the oxygen flow rate is set to higher than or equal to 0% and lower than or equal to 30%, preferably higher than or equal to 5% and lower than or equal to 30%, further preferably higher than or equal to 7% and lower than or equal to 15% in deposition of the composite oxide semiconductor.

To make both the field-effect mobility and reliability of a transistor high, the oxygen flow rate ratio in deposition of the composite oxide semiconductor is set to higher than 30% and lower than 70%, preferably higher than 30% and lower than or equal to 50%. Alternatively, the oxygen flow rate ratio in deposition of the composite oxide semiconductor is set to higher than or equal to 10% and lower than or equal to 50%, preferably higher than or equal to 30% and lower than or equal to 50%.

To make the reliability of a transistor high, the oxygen flow rate ratio in deposition of the composite oxide semiconductor is set to higher than or equal to 70% and lower than or equal to 100%.

When the substrate temperature and the oxygen flow rate ratio in deposition are controlled in this manner, a composite oxide semiconductor that provides desired electrical characteristics can be deposited. For example, a reduction (an increase) of substrate temperature and a reduction (an increase) of oxygen flow rate ratio contribute to the field-effect mobility to the same degree, in some cases. Therefore, even when the substrate temperature cannot be increased sufficiently with the constraints of an apparatus, for example, a transistor having field-effect mobility substantially the same as that when the substrate temperature is increased can be obtained by increasing the oxygen flow rate ratio.

Oxygen defects in the oxide semiconductor film or impurities in the oxide semiconductor film are reduced by the method in Embodiment 1, whereby a highly reliable transistor can be obtained.

In addition, increasing the purity of the gas in the deposition is necessary. For example, as an oxygen gas or an argon gas used as the gas, a gas which is highly purified to have a dew point of −40° C. or lower, preferably −80° C. or lower, further preferably −100° C. or lower, still further preferably −120° C. or lower is used, whereby entry of moisture or the like into the composite oxide semiconductor can be minimized.

The deposition chamber 2501 is preferably evacuated to high vacuum (about $5\times10^{-7}$ Pa to $1\times10^{-4}$ Pa) with an entrapment vacuum evacuation pump such as a cryopump so that water or the like, which is an impurity for the composite oxide semiconductor, is removed as much as possible. In particular, the partial pressure of gas molecules corresponding to $H_2O$ (gas molecules corresponding to m/z=18) in the deposition chamber 2501 in the standby mode of the sputtering apparatus is preferably lower than or equal to $1\times10^{-4}$ Pa, further preferably lower than or equal to $5\times10^{-5}$ Pa.

[Third Process: Process of Applying Voltage to Target]

The third process includes a step of applying voltage to a target (see Step S301 in FIG. 17).

In the third process, for example, voltage is applied to the target holder 2520*a* and the target holder 2520*b* in FIG. 16A. As an example, a potential applied to a terminal V1 connected to the target holder 2520*a* is lower than a potential applied to a terminal V2 connected to the substrate holder 2570. A potential applied to a terminal V4 connected to the target holder 2520*b* is lower than the potential applied to the terminal V2 connected to the substrate holder 2570. The potential applied to the terminal V2 connected to the substrate holder 2570 is a ground potential. A potential applied to a terminal V3 connected to the magnet holder 2532 is a ground potential.

Note that the potentials applied to the terminals V1, V2, V3, and V4 are not limited to the above potentials. Not all the target holder 2520, the substrate holder 2570, and the magnet holder 2532 are necessarily supplied with potentials. For example, the substrate holder 2570 may be electrically floating. Note that it is assumed that a power source capable of controlling a potential applied to the terminal V1 is electrically connected to the terminal V1. As the power source, a DC power source, an AC power source, or an RF power source may be used.

As the target 2502*a* and the target 2502*b*, a target including indium, the element M (M is Al, Ga, Y, or Sn), zinc, and oxygen is preferably used. For example, an In—Ga—Zn metal oxide target (In:Ga:Zn=4:2:4.1 [atomic ratio]) or an In—Ga—Zn metal oxide target (In:Ga:Zn=5:1:7 [atomic ratio]) can be used as the target 2502*a* and the target 2502*b*. In the following description, the case of using an In—Ga—Zn metal oxide target (In:Ga:Zn=4:2:4.1 [atomic ratio]) is described.

[Fourth Process: Process of Depositing Composite Oxide Semiconductor on Substrate]

The fourth process includes a step in which sputtered particles are ejected from the target and a composite oxide semiconductor is deposited on the substrate (see Step S401 in FIG. 17).

In the fourth process, for example, in the deposition chamber 2501 illustrated in FIG. 16A, an argon gas or an oxygen gas is ionized to be separated into cations and electrons, and plasma is created. Then, the cations in the plasma are accelerated toward the targets 2502*a* and 2502*b* by the potentials applied to the target holders 2520*a* and 2520*b*. Sputtered particles are generated when the cations collide with the In—Ga—Zn metal oxide target, and the sputtered particles are deposited on the substrate 2560.

Note that in an In—Ga—Zn metal oxide target with an atomic ratio of In:Ga:Zn=4:2:4.1 or 5:1:7 that is used as the targets 2502*a* and 2502*b*, a plurality of crystal grains with different compositions are included in some cases. In most cases, for example, the diameters of the plurality of crystal grains are each 10 μm or less. In the case where, for example, crystal grains with a high proportion of In are included in the In—Ga—Zn metal oxide target, the proportion of Region A1 described above is increased in some cases.

<2-6. Deposition Model>

Figure 18A:
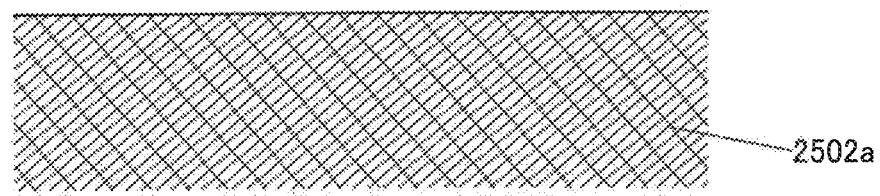
FIGS. 18A to 18C show a cross section of the vicinity of a target.
Figure 18B:
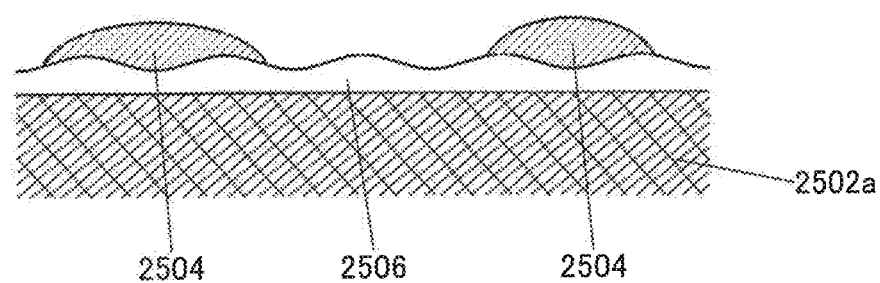
Figure 18C:
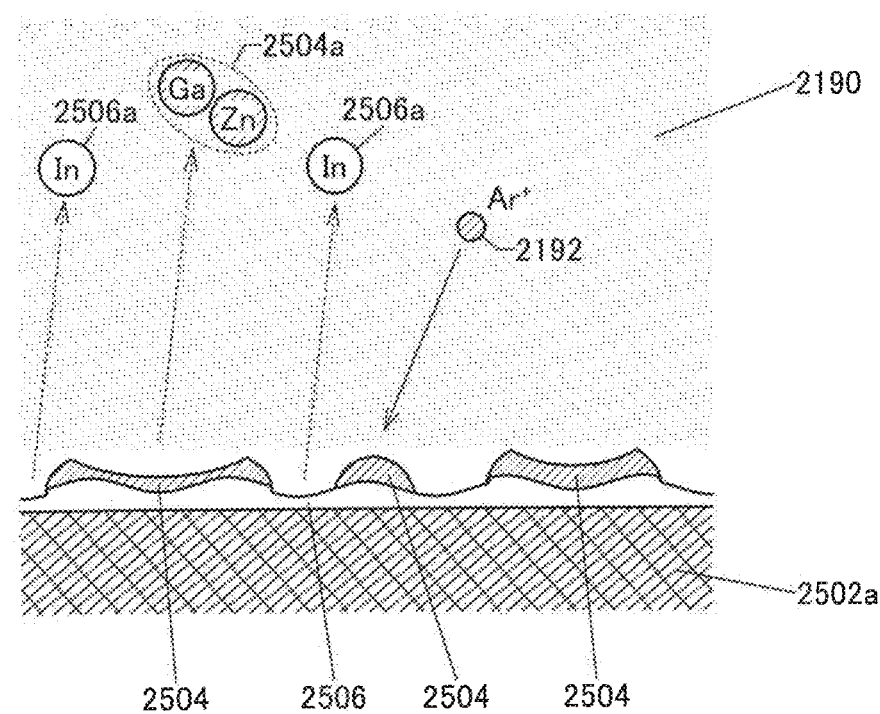

In the fourth process, a deposition model shown in FIGS. 18A to 18C can be presumed.

FIGS. 18A to 18C are cross-sectional views of the vicinity of the target 2502*a* shown in FIG. 16A. Note that FIG. 18A shows the state of the target before use, FIG. 18B shows the state of the target before deposition, and FIG. 18C shows the state of the target during the deposition. In FIGS. 18A to 18C, the target 2502*a*, plasma 2190, cations 2192, sputtered particles 2504*a* and 2506*a*, and the like are shown.

In FIG. 18A, a surface of the target 2502*a* is relatively flat and its composition (e.g., the composition ratio between In, Ga, and Zn) is uniform. In contrast, in FIG. 18B, unevenness is formed on the surface of the target 2502*a* by sputtering treatment performed in advance or the like, and compositional segregation occurs. The unevenness and the segregation can occur because of plasma (e.g., Ar plasma) generated in the sputtering treatment performed in advance. Note that FIG. 18B illustrates a segregation region 2504 and a segregation region 2506. Here, the segregation region 2504 is a region containing a large amount of Ga and a large amount of Zn (a Ga,Zn-rich region), and the segregation region 2506 is a region containing a large amount of In (an In-rich region). The segregation region 2504, which contains a large amount of Ga, is formed because the melting point of Ga lower than that of In allows part of Ga to be melted by heat applied to the target 2502*a* during the plasma treatment and aggregate.

[First Step]

In FIG. 18C, an argon gas or an oxygen gas is separated into the cation 2192 and an electron (not illustrated), and the plasma 2190 is created. After that, the cations 2192 in the plasma 2190 are accelerated toward the target 2502*a* (here, an In—Ga—Zn oxide target). The cations 2192 collide with the In—Ga—Zn oxide target, whereby the sputtered particles 2194 are generated and ejected from the In—Ga—Zn oxide target. Note that since the sputtered particles 2504*a* are ejected from the segregation region 2504, they form a Ga,Zn-rich cluster in some cases. Since the sputtered particles 2506*a* are ejected from the segregation region 2506, they form an In-rich cluster in some cases.

When an In—Ga—Zn oxide target is used, presumably, the sputtered particles 2504*a* are preferentially sputtered first from the segregation region 2504. This is because Ga and Zn, which have lower relative atomic masses than In, are preferentially ejected from the In—Ga—Zn oxide target by collision of the cation 2192 with the In—Ga—Zn oxide target. The sputtered particles 2504*a* are deposited over the substrate, thereby forming Region B1 illustrated in FIGS. 12A and 12B and other drawings.

[Second Step]

Next, as illustrated in FIG. 18C, the sputtered particles 2506*a* are sputtered from the segregation region 2506. The sputtered particles 2506a collide with Region B1 that has been formed over the substrate, thereby forming Region A1 illustrated in FIGS. 12A and 12B and other drawings.

As illustrated in FIG. 18C, the target 2502a is subjected to sputtering throughout the deposition; thus, generation of the segregation region 2504 and disappearance of the segregation region 2504 occur intermittently.

The deposition model including the first step and the second step is repeated, whereby the composite oxide semiconductor that is one embodiment of the present invention and shown in FIGS. 12A and 12B can be obtained.

That is, the sputtered particles (2506a and 2504a) are respectively ejected from the In-rich segregation region 2506 and the Ga,Zn-rich segregation region 2504 to be deposited over the substrate. The In-rich regions are connected to each other in a cloud-like manner over the substrate, so that a composite oxide semiconductor of one embodiment of the present invention as illustrated in FIGS. 12A and 12B can be formed. In a film of the composite oxide semiconductor, the In-rich regions are connected to each other in a cloud-like manner. Thanks to this, a transistor using the composite oxide semiconductor has a high on-state current ($I_{on}$) and high field-effect mobility (μFE).

In this manner, for a transistor having a high on-state current ($I_{on}$) and high field-effect mobility (μFE), In is of importance and other metals (e.g., Ga) are not always necessary.

Note that described above as an example is a model in which a composite oxide semiconductor of one embodiment of the present invention is formed with the use of an argon gas. In that case, the composite oxide semiconductor might contain many oxygen vacancies. When the composite oxide semiconductor contains many oxygen vacancies, shallow defect states (also referred to as sDOS) are formed in the composite oxide semiconductor in some cases. When sDOS is formed in the composite oxide semiconductor, the sDOS serves as a carrier trap, resulting in a reduction in on-state current and field-effect mobility.

Therefore, when a composite oxide semiconductor is formed with the use of an argon gas, it is preferable to supply oxygen into the composite oxide semiconductor after formation thereof so that oxygen vacancies in the composite oxide semiconductor are compensated and sDOS is reduced.

Such oxygen supply can be conducted by, for example, performing heat treatment in an atmosphere that contains oxygen after the formation of the composite oxide semiconductor, or performing plasma treatment in an atmosphere that contains oxygen. Alternatively, either an insulating film that is in contact with the composite oxide semiconductor of one embodiment of the present invention or an insulating film in the vicinity of the composite oxide semiconductor is made to contain excess oxygen. The mode in which such an insulating film contains excess oxygen are described in Embodiment 1.

Note that one embodiment of the present invention is not limited to the above-mentioned manufacturing method by a sputtering method. A pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of a thermal CVD method, a metal organic chemical vapor deposition (MOCVD) method can be given.

<2-7. Transistor Including Oxide Semiconductor Film>

Next, a transistor including an oxide semiconductor film is described.

Note that when the composite oxide semiconductor is used for a transistor, the transistor can have high carrier mobility and excellent switching characteristics. In addition, the transistor can have high reliability.

An oxide semiconductor film with a low carrier density is preferably used for a transistor. For example, an oxide semiconductor film whose carrier density is lower than $8\times10^{11}/cm^3$, preferably lower than $1\times10^{11}/cm^3$, or further preferably lower than $1\times10^{10}/cm^3$, and greater than or equal to $1\times10^{-9}/cm^3$ is used as the oxide semiconductor film.

In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. A highly purified intrinsic or substantially highly purified intrinsic oxide semiconductor film has few carrier generation sources, and thus can have a low carrier density. A highly purified intrinsic or substantially highly purified intrinsic oxide semiconductor film has a low density of defect states and accordingly has a low density of trap states in some cases.

Charges trapped by the trap states in the oxide semiconductor film take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor film. In order to reduce the concentration of impurities in the oxide semiconductor film, the concentration of impurities in a film that is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film will be described.

When silicon or carbon that is one of Group 14 elements is contained in the oxide semiconductor film, defect states are formed in the oxide semiconductor. Thus, the concentration of silicon or carbon in the oxide semiconductor and around an interface with the oxide semiconductor (measured by secondary ion mass spectrometry (SIMS)) is set lower than or equal to $2\times10^{18}$ atoms/$cm^3$, and preferably lower than or equal to $2\times10^{17}$ atoms/$cm^3$.

When the oxide semiconductor film contains alkali metal or alkaline earth metal, defect states are formed and carriers are generated, in some cases. Thus, a transistor including an oxide semiconductor film which contains alkali metal or alkaline earth metal is likely to be normally on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1\times10^{18}$ atoms/$cm^3$, and preferably lower than or equal to $2\times10^{16}$ atoms/$cm^3$.

When the oxide semiconductor film contains nitrogen, the oxide easily becomes n-type by generation of electrons serving as carriers and an increase of carrier density. Thus, a transistor whose semiconductor includes an oxide semiconductor that contains nitrogen is likely to be normally-on.

For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor film reacts with oxygen bonded to a metal atom to be water, and thus causes an oxygen vacancy ($V_O$), in some cases. Due to entry of hydrogen into the oxygen vacancy ($V_O$), an electron serving as a carrier is generated in some cases. In some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

Note that oxygen vacancies ($V_O$) in the oxide semiconductor film can be reduced by introduction of oxygen into the oxide semiconductor. That is, the oxygen vacancies ($V_O$) in the oxide semiconductor film disappear when the oxygen vacancies ($V_O$) are filled with oxygen. Accordingly, diffusion of oxygen into the oxide semiconductor film can reduce the amount of oxygen vacancies ($V_O$) in a transistor and improve the reliability of the transistor.

As a method for introducing oxygen into the oxide semiconductor film, for example, an oxide in which oxygen content is higher than that in the stoichiometric composition is provided in contact with the oxide semiconductor. That is, in the oxide, a region including oxygen in excess of that in the stoichiometric composition (hereinafter also referred to as an excess oxygen region) is preferably formed. In particular, in the case of using an oxide semiconductor film in a transistor, an oxide including an excess-oxygen region is provided in a base film, an interlayer film, or the like in the vicinity of the transistor, whereby oxygen vacancies in the transistor are reduced, and the reliability can be improved.

When an oxide semiconductor film with sufficiently reduced impurity concentration is used for a channel formation region in a transistor, the transistor can have stable electrical characteristics.

At least part of this embodiment can be implemented in combination with any of the other embodiments and the other examples described in this specification as appropriate.

Embodiment 3

In this embodiment, examples of a display device that includes the transistor described in the above embodiments are described below with reference to FIG. 19 to FIG. 25.

Figure 19:
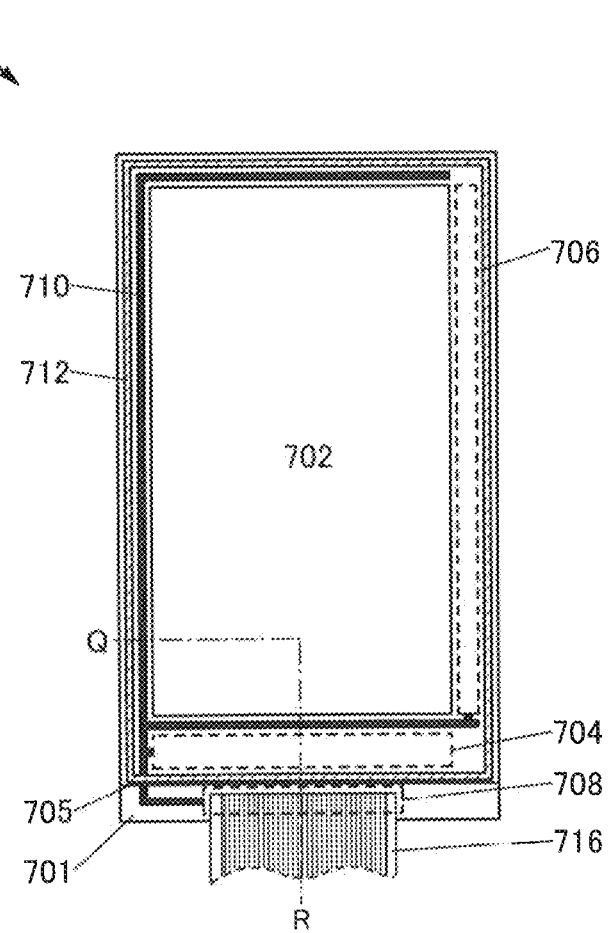
FIG. 19 is a top view illustrating one embodiment of a display device.

FIG. 19 is a top view illustrating an example of a display device. A display device 700 in FIG. 19 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 19, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. The transistor which is a semiconductor device of one embodiment of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and power consumption can be reduced by approximately 20% to 30% in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 20:
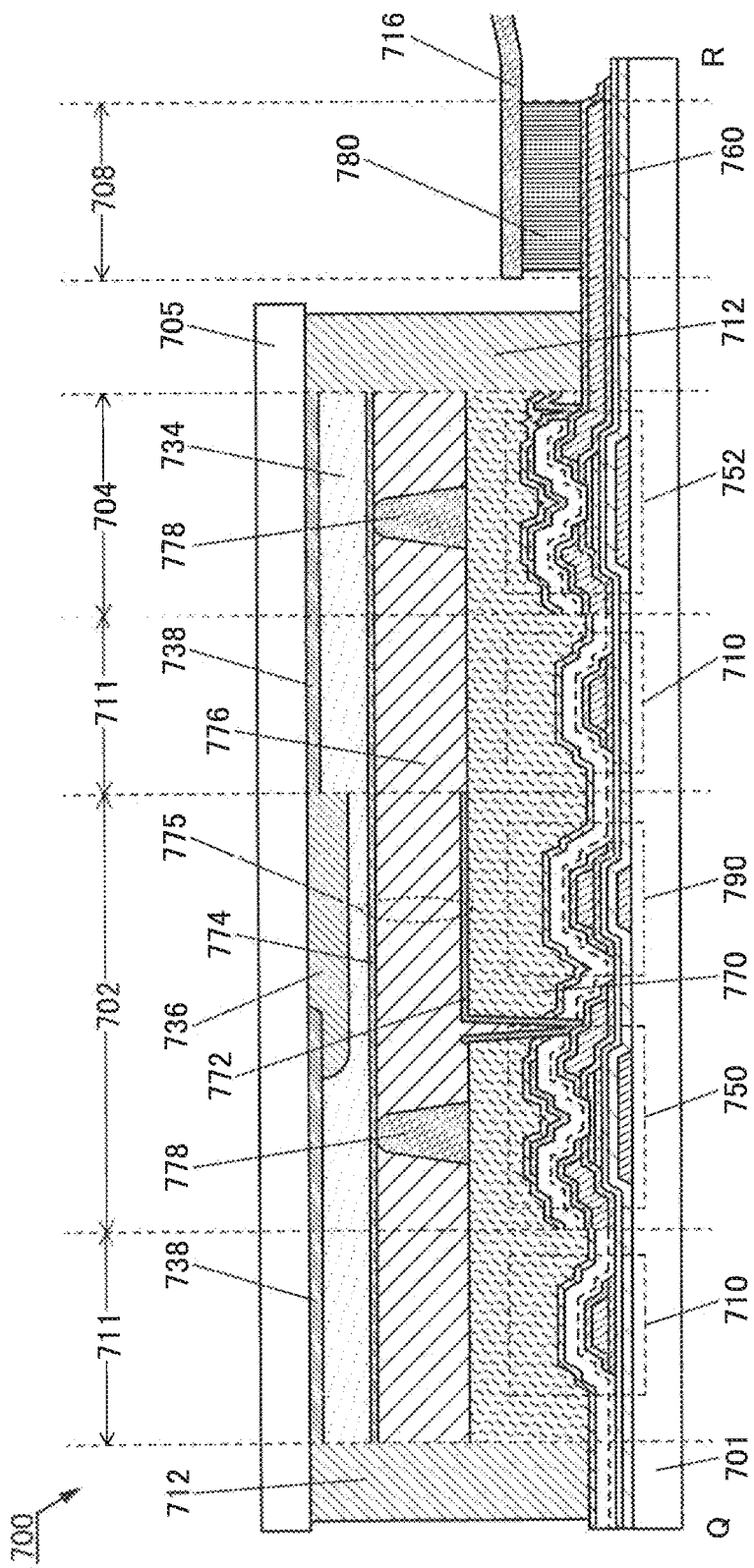
FIG. 20 is a cross-sectional view illustrating one embodiment of a display device.

In this embodiment, a structure including a liquid crystal element as a display element and a structure including an EL element as a display element are described with reference to FIGS. 20 to 22. FIG. 20 and FIG. 22 are each a cross-sectional view taken along dashed-dotted line Q-R in FIG. 19 and illustrate the structure including a liquid crystal element as a display element. FIG. 22 is a cross-sectional view taken along dashed-dotted line Q-R in FIG. 19 and illustrates the structure including an EL element as a display element.

Figure 21:
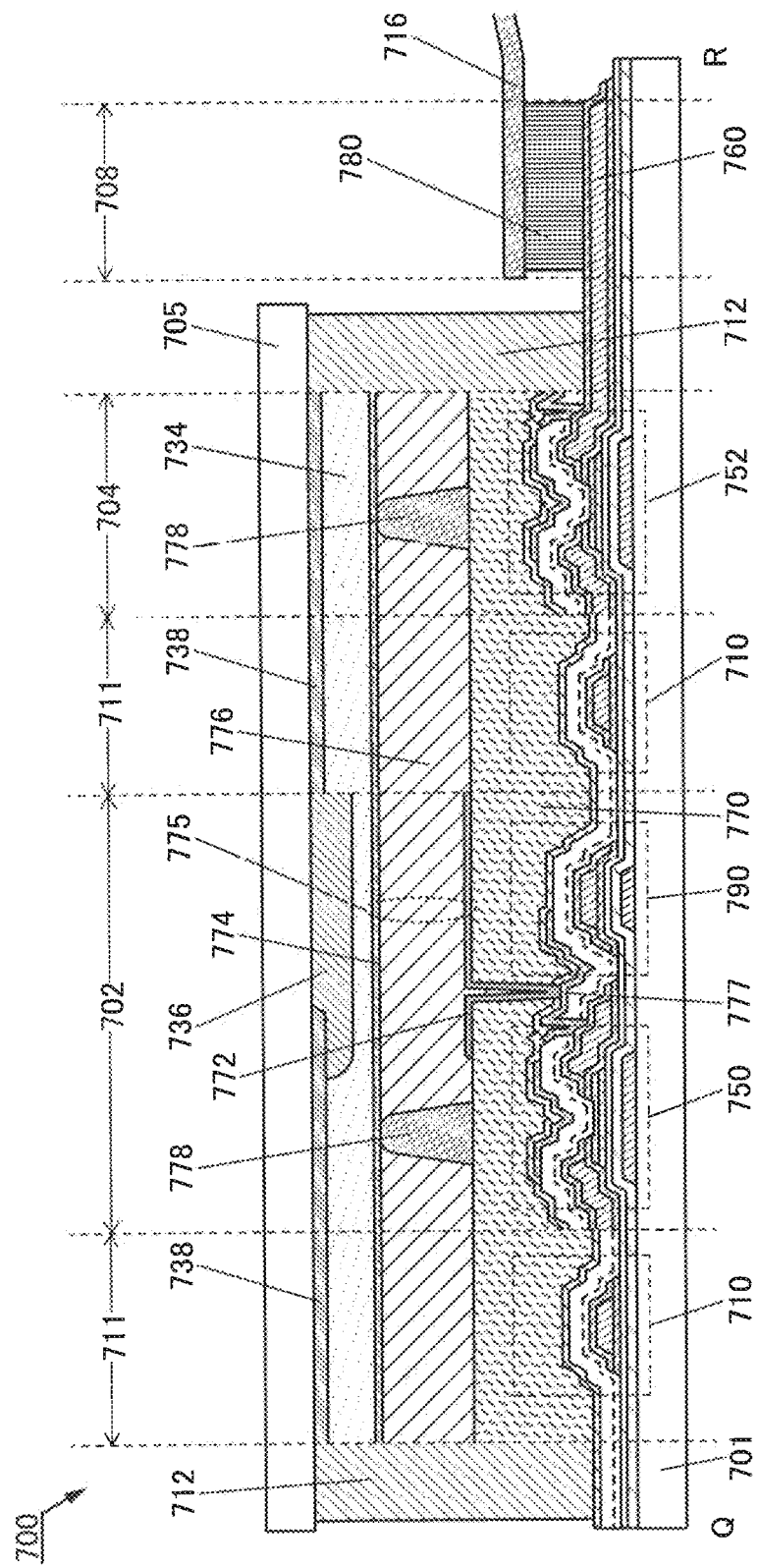
FIG. 21 is a cross-sectional view illustrating one embodiment of a display device.
Figure 22:
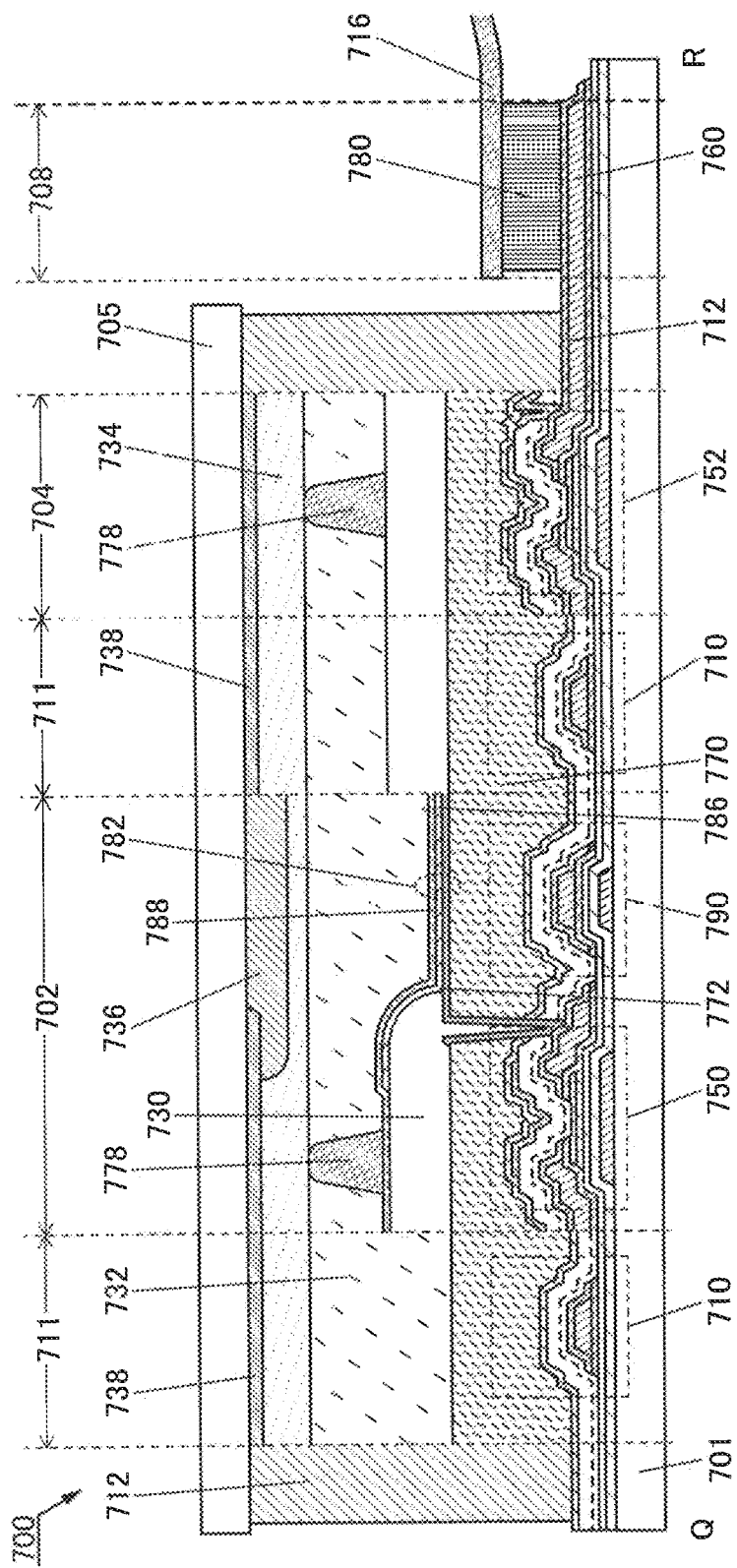
FIG. 22 is a cross-sectional view illustrating one embodiment of a display device.

Portions common to FIG. 20, FIG. 21, and FIG. 22 are described first, and then, different portions are described.

<3-1. Portions Common to Display Devices>

The display device 700 in FIG. 20, FIG. 21, and FIG. 22 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100D described above. Note that the transistor 750 and the transistor 752 may each have the structure of any of the other transistors described in the above embodiments.

The transistor used in this embodiment includes an oxide semiconductor film that is highly purified and in which formation of oxygen vacancies is inhibited. The transistor can have a low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes or a second gate electrode of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which an insulating film functioning as a dielectric film is positioned between the pair of electrodes.

In FIG. 20, FIG. 21, and FIG. 22, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 20, FIG. 21, and FIG. 22 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and an inverted-staggered transistor described in Embodiment 1 is used in the source driver circuit portion 704, or a structure in which the inverted-staggered transistor described in Embodiment 1 is used in the pixel portion 702 and the staggered transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Including Liquid Crystal Element>

The display device 700 in FIG. 20 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 20 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element. The conductive film 772 has a function of a reflective electrode. The display device 700 in FIG. 20 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, the conductive film that reflects visible light is used for the conductive film 772.

Although FIG. 20 illustrates an example in which the conductive film 772 is connected to the conductive film functioning as the drain electrode of the transistor 750, one embodiment of the present invention is not limited to this example. For example, as illustrated in FIG. 21, the conductive film 772 may be electrically connected to the conductive film functioning as the drain electrode of the transistor 750 through a conductive film 777 functioning as a connection electrode. Note that the conductive film 777 is formed by a step of processing the conductive film to be the conductive film functioning as a second gate electrode of the transistor 750 and thus can be formed without adding a manufacturing step.

Note that the display device 700 is not limited to the example in FIG. 20, which illustrates a reflective color liquid crystal display device, and may be a transmissive color liquid crystal display device in which a conductive film that transmits visible light is used as the conductive film 772. Alternatively, the display device 700 may be what is called a transflective color liquid crystal display device in which a reflective color liquid crystal display device and a transmissive color liquid crystal display device are combined.

Figure 23:
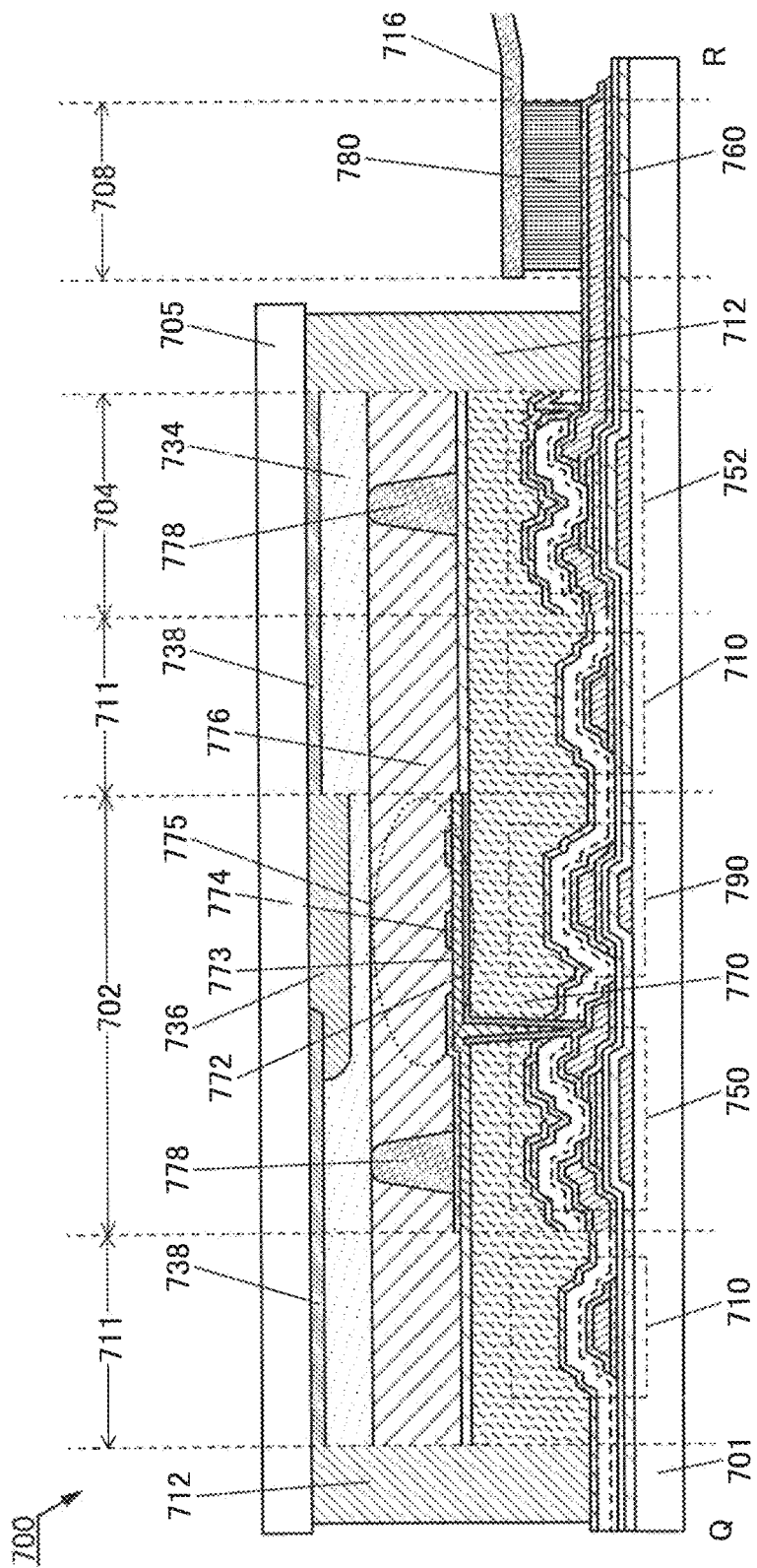
FIG. 23 is a cross-sectional view illustrating one embodiment of a display device.

FIG. 23 illustrates an example of a transmissive color liquid crystal display device. FIG. 23 is a cross-sectional view along the dashed-dotted line Q-R shown in FIG. 19 and shows a structure including a liquid crystal element as a display element. The display device 700 illustrated in FIG. 23 is an example of employing a transverse electric field mode (e.g., an FFS mode) as a driving mode of the liquid crystal element. In the structure illustrated in FIG. 23, an insulating film 773 is provided over the conductive film 772 functioning as a pixel electrode, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 20 and FIG. 23, the conductive film 772 and/or the conductive film 774 may be provided with an alignment film on a side in contact with the liquid crystal layer 776. Although not illustrated in FIG. 20 and FIG. 23, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<3-3. Display Device Including Light-Emitting Element>

The display device 700 illustrated in FIG. 22 includes a light-emitting element 782. The light-emitting element 782 includes a conductive film 772, an EL layer 786, and a conductive film 788. The display device 700 illustrated in FIG. 22 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 22, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 22, in which the coloring film 736 is provided. For example, a structure without the coloring film 736 may also be employed in the case where the EL layer 786 is formed by separate coloring.

<3-4. Structure Example of Display Device Provided with Input/Output Device>

An input/output device may be provided in the display device 700 illustrated in FIG. 22 and FIG. 23. As an example of the input/output device, a touch panel or the like can be given.

Figure 24:
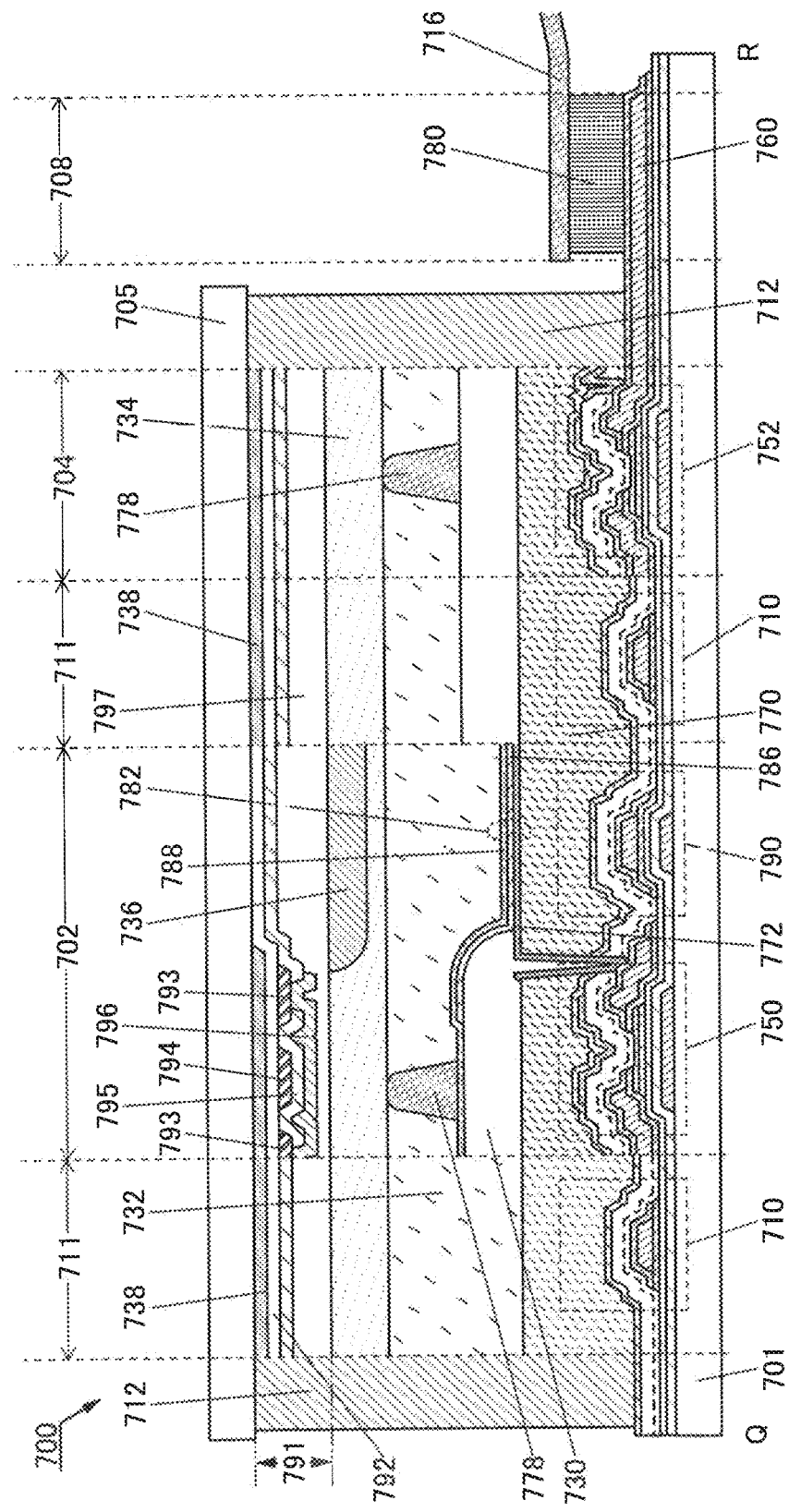
FIG. 24 is a cross-sectional view illustrating one embodiment of a display device.
Figure 25:
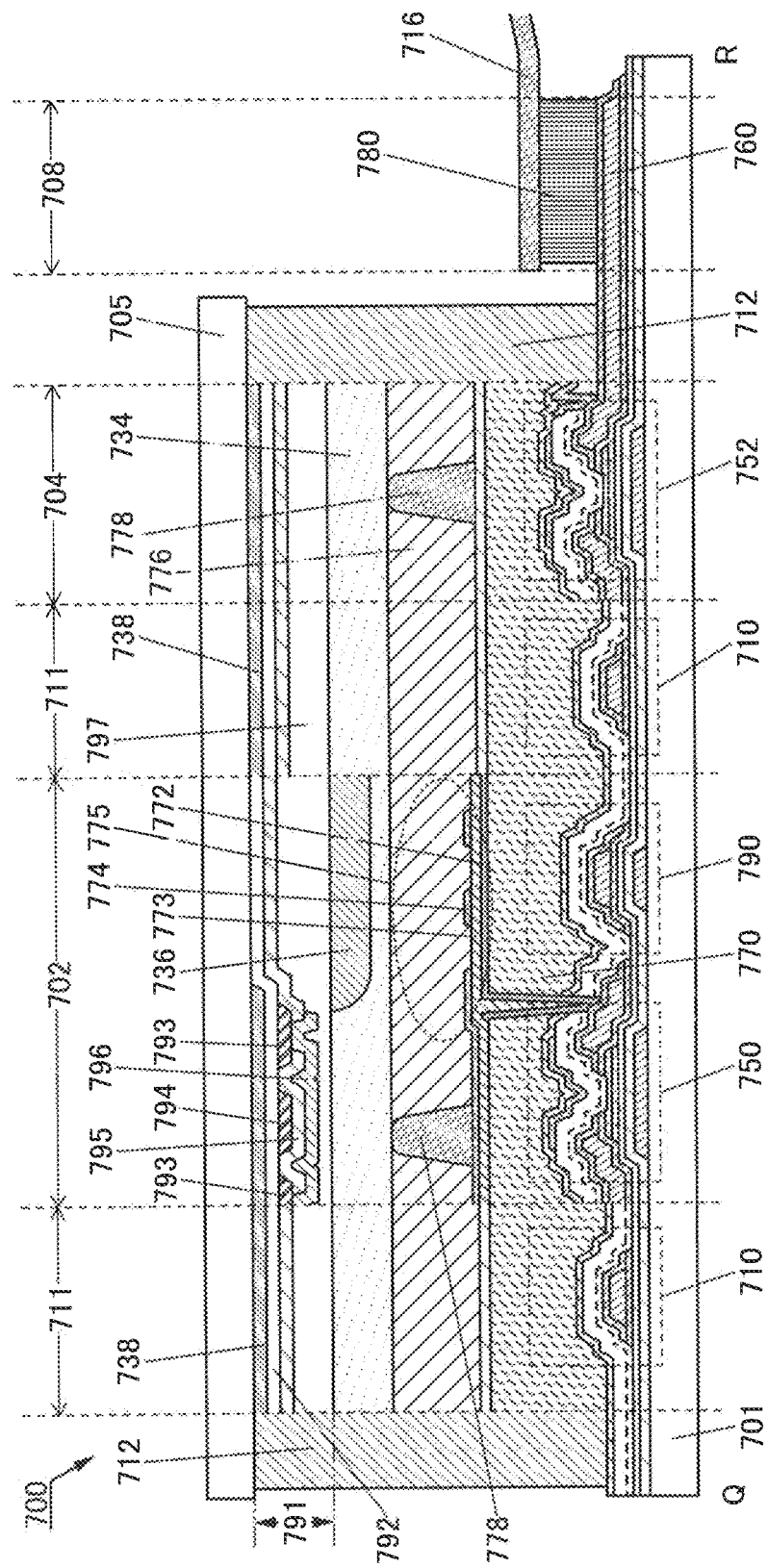
FIG. 25 is a cross-sectional view illustrating one embodiment of a display device.

FIG. 24 illustrates a structure in which the display device 700 illustrated in FIG. 22 includes a touch panel 791. FIG. 25 illustrates a structure in which the display device 700 illustrated in FIG. 23 includes the touch panel 791.

FIG. 24 is a cross-sectional view of the structure in which the touch panel 791 is provided in the display device 700 illustrated in FIG. 22. FIG. 25 is a cross-sectional view of the structure in which the touch panel 791 is provided in the display device 700 illustrated in FIG. 23.

First, the touch panel 791 illustrated in FIG. 24 and FIG. 25 is described below.

The touch panel 791 illustrated in FIG. 24 and FIG. 25 is what is called an in-cell touch panel provided between the second substrate 705 and the coloring film 736. The touch panel 791 is formed on the second substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. A change in the capacitance between the electrodes 793 and 794 can be detected when an object such as a finger or a stylus approaches, for example.

A portion in which the electrode 793 intersects with the electrode 794 is illustrated in the upper portion of the transistor 750 illustrated in FIG. 24 and FIG. 25. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 24 and FIG. 25 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 24, it is preferable that the electrode 793 not overlap with the light-emitting element 782. As illustrated in FIG. 25, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 Ω/sq. and less than or equal to 100 Ω/sq.

Although the structure of the in-cell touch panel is illustrated in FIG. 24 and FIG. 25, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

At least part of this embodiment can be implemented in combination with any of the other embodiments and the other examples described in this specification as appropriate.

Embodiment 4

In this embodiment, a semiconductor device of one embodiment of the present invention is described with reference to FIGS. 26A and 26B and FIG. 27.

<4-1. Structure Example 1 of Semiconductor Device>

Figure 26A:
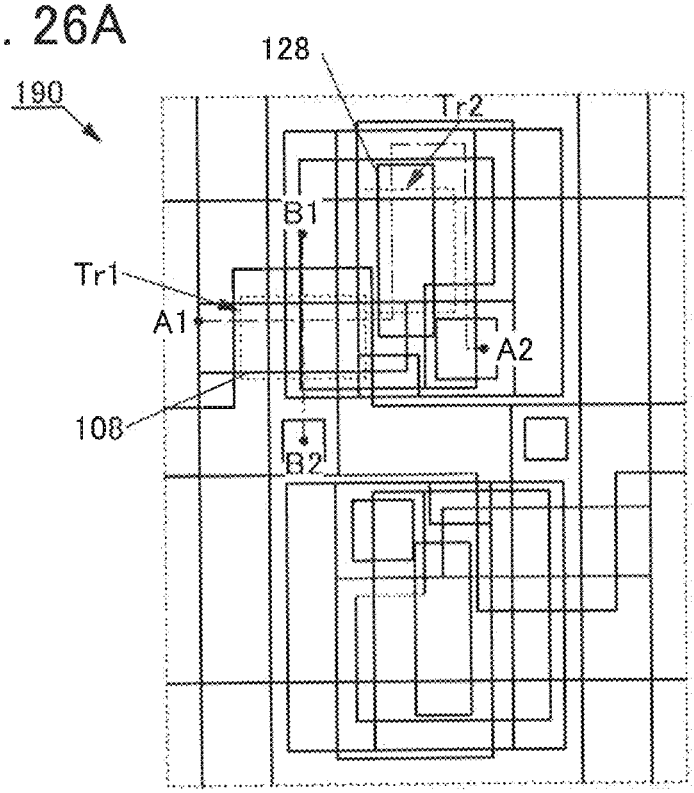
FIGS. 26A and 26B illustrate a top view and a cross-sectional view of a semiconductor device.

FIG. 26A is a top view of a semiconductor device 190 of one embodiment of the present invention. FIG. 26B is a cross-sectional view taken along dashed dotted line A1-A2 in FIG. 26A. Note that cross sections in a channel length (L) direction of a transistor Tr1 and in a channel length (L) direction of a transistor Tr2 are included in FIG. 26B. FIG. 27 is a cross-sectional view taken along dashed dotted line B1-B2 in FIG. 26A. FIG. 27 includes a cross section in a channel width (W) direction of the transistor Tr1.

Note that some components (e.g., an insulating film serving as a gate insulating film) of the semiconductor device 190 and some reference numerals of components are not illustrated in FIG. 26A to avoid complexity. Note that some components and some reference numerals of components are not illustrated as in FIG. 26A in some cases in top views of semiconductor devices described below.

Figure 26B:
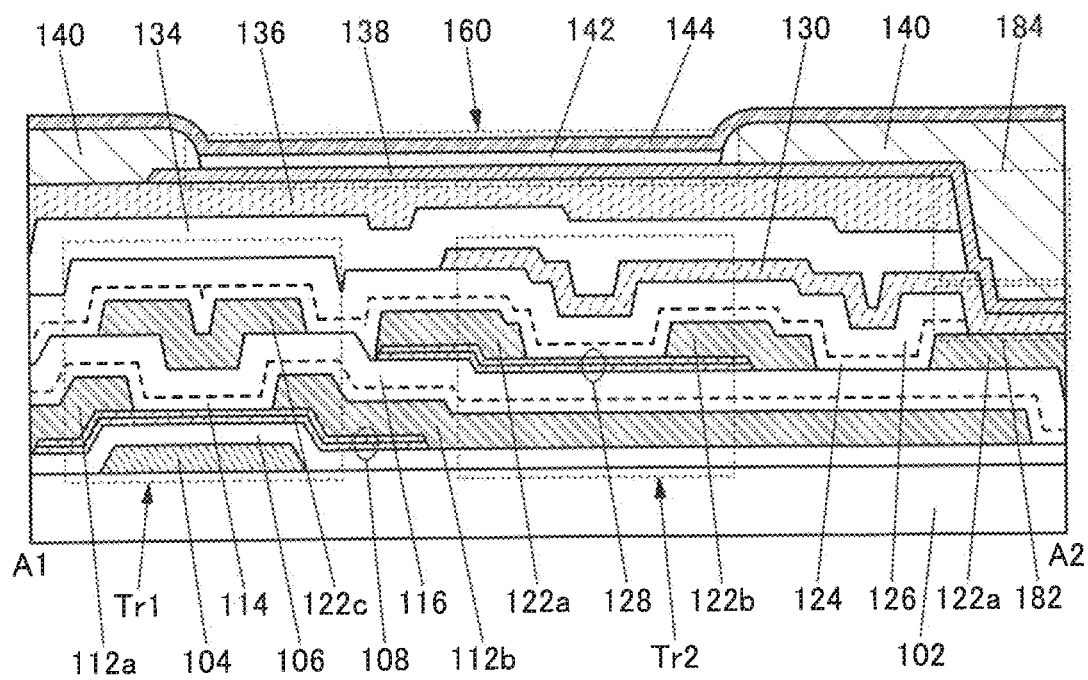

The semiconductor device 190 illustrated in FIGS. 26A and 26B includes the transistor Tr1 and the transistor Tr2 which overlaps at least partly with the transistor Tr1. Note that the transistor Tr1 and the transistor Tr2 are bottom-gate transistors.

Since the transistor Tr1 overlaps at least partly with the transistor Tr2, the transistor area can be reduced.

The transistor Tr1 includes a conductive film 104 over a substrate 102, an insulating film 106 over the substrate 102 and the conductive film 104, an oxide semiconductor film 108 over the insulating film 106, a conductive film 112a over the oxide semiconductor film 108, a conductive film 112b over the oxide semiconductor film 108, an insulating film 114 over the oxide semiconductor film 108, the conductive film 112a, and the conductive film 112b, an insulating film 116 over the insulating film 114, and a conductive film 122c over the insulating film 116.

The transistor Tr2 includes the conductive film 112b, the insulating film 114 over the conductive film 112b, the insulating film 116 over the insulating film 114, an oxide semiconductor film 128 over the insulating film 116, a conductive film 122a over the oxide semiconductor film 128, a conductive film 122b over the oxide semiconductor film 128, an insulating film 124 over the oxide semiconductor film 128, the conductive film 122a, and the conductive film 122b, an insulating film 126 over the insulating film 124, and a conductive film 130 over the insulating film 126. Note that the conductive film 130 is connected to the conductive film 122a through an opening 182 provided in the insulating films 124 and 126.

As illustrated in FIGS. 26A and 26B, the oxide semiconductor film 108 and the oxide semiconductor film 128 partly overlap with each other. Note that it is preferable that, as illustrated in FIGS. 26A and 26B, a channel region formed in the oxide semiconductor film 108 of the transistor Tr1 not overlap with a channel region formed in the oxide semiconductor film 128 of the transistor Tr2.

If the channel region of the transistor Tr1 overlaps with the channel region of the transistor Tr2, one of the transistors which is active might adversely affect the other. In order to avoid the adverse effect, a structure in which the distance between the transistor Tr1 and the transistor Tr2 is increased, a structure in which a conductive film is provided between the transistor Tr1 and the transistor Tr2, or the like can be used. However, the thickness of the semiconductor device is increased when the former structure is used. Thus, for example, when the semiconductor device 190 is formed over a flexible substrate or the like, a problem might arise in the bendability and the like. When the latter structure is used, there is a problem in that a step of forming the conductive film is needed and the thickness of the semiconductor device is increased.

In the semiconductor device 190 of one embodiment of the present invention, however, the transistor Tr1 overlaps with the transistor Tr2 and their channel regions do not overlap with each other. In addition, since parts of their oxide semiconductor films where the channel regions are formed overlap with each other, the transistor area can be favorably reduced.

In addition, the oxide semiconductor film 108 and the oxide semiconductor film 128 each include In, M (M is Al, Ga, Y, or Sn), and Zn. Each of the oxide semiconductor film 108 and the oxide semiconductor film 128 preferably includes a region in which the atomic proportion of In is higher than the atomic proportion of M, for example Note that the semiconductor device of one embodiment of the present invention is not limited thereto: each of them may include a region in which the atomic proportion of In is lower than the atomic proportion of M or may include a region in which the atomic proportion of In is equal to the atomic proportion of M.

It is preferable that the compositions of the oxide semiconductor film 108 and the oxide semiconductor film 128 be the same or substantially the same. When the compositions of the oxide semiconductor film 108 and the oxide semiconductor film 128 are the same, the manufacturing cost can be reduced. Note that the semiconductor device of one embodiment of the present invention is not limited thereto: the compositions of the oxide semiconductor film 108 and the oxide semiconductor film 128 may be different from each other.

When each of the oxide semiconductor film 108 and the oxide semiconductor film 128 includes a region in which the atomic proportion of In is larger than the atomic proportion of M, the field-effect mobilities of the transistor Tr1 and the transistor Tr2 can be increased.

The semiconductor device 190 shown in FIGS. 26A and 26B can be favorably used for a pixel circuit of a display device. The layout shown in FIGS. 26A and 26B can increase the pixel density of the display device. For example, even when the pixel density of a display device exceeds 1000 ppi (pixel per inch) or 2000 ppi, the aperture ratio of pixels can be increased owing to the structure shown in FIGS. 26A and 26B. Note that ppi is a unit for describing the number of pixels per inch.

When the semiconductor device 190 shown in FIGS. 26A and 26B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 26A and 26B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 104 serves as the first gate electrode, the conductive film 112a serves as the source electrode, the conductive film 112b serves as the drain electrode, and the conductive film 122c serves as the second gate electrode. In addition, in the transistor Tr1, the insulating film 106 serves as a first gate insulating film and the insulating films 114 and 116 serve as second gate insulating films. In the transistor Tr2, the conductive film 112b serves as the first gate electrode, the conductive film 122a serves as the source electrode, the conductive film 122b serves as the drain electrode, and the conductive film 130 serves as the second gate electrode. In addition, in the transistor Tr2, the insulating films 114 and 116 serve as first gate insulating films and the insulating films 124 and 126 serve as second gate insulating films.

Note that in this specification and the like, the insulating film 106 may be referred to as a first insulating film, the insulating films 114 and 116 may be collectively referred to as a second insulating film, and the insulating films 124 and 126 may be collectively referred to as a third insulating film.

An insulating film 134 is provided over the conductive film 130. An insulating film 136 is provided over the insulating film 134. An opening 184 is provided in the insulating films 134 and 136 so as to reach the conductive film 130. In addition, a conductive film 138 is provided over the insulating film 136. Note that the conductive film 138 is connected to the conductive film 130 in the opening 184.

In addition, an insulating film 140, an EL layer 150, and a conductive film 144 are provided over the conductive film 138. The insulating film 140 covers part of a side end portion of the conductive film 138 and prevents a short circuit of the conductive films 138 between adjacent pixels. The EL layer 150 emits light. The light-emitting element 160 is composed of the conductive film 138, the EL layer 150, and the conductive film 144. The conductive film 138 serves as one electrode of the light-emitting element 160. The conductive film 144 serves as the other electrode of the light-emitting element 160.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

As shown in FIGS. 26A and 26B, each of the transistor Tr1 and the transistor Tr2 includes two gate electrodes. Here, the effect of two gate electrodes is described with reference to FIGS. 26A and 26B and FIG. 27.

Figure 27:
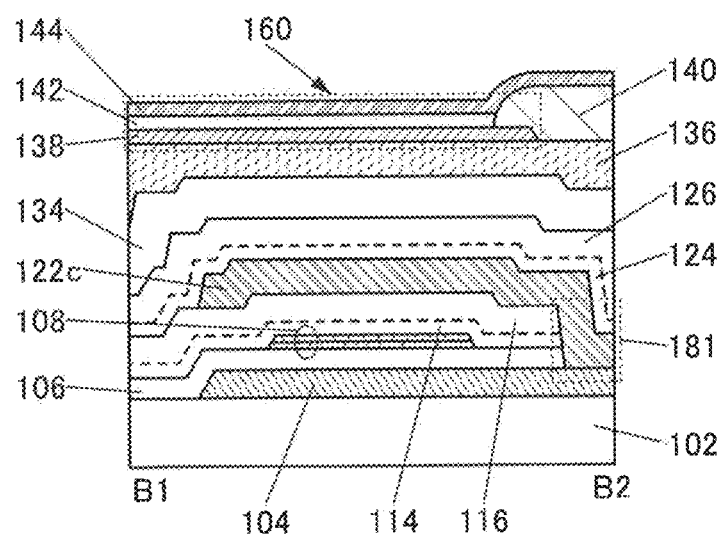
FIG. 27 is a cross-sectional view of a semiconductor device.

As shown in FIG. 27, the conductive film 122c serving as the second gate electrode is electrically connected to the conductive film 104 serving as the first gate electrode in an opening 181. Accordingly, the conductive film 104 and the conductive film 122c are supplied with the same potential. In addition, as shown in FIG. 27, the oxide semiconductor film 108 faces the conductive film 104 and the conductive film 122c and is sandwiched between the conductive films serving as the two gate electrodes. The length in the channel width direction of each of the conductive film 104 and the conductive film 122c is greater than the length in the channel width direction of the oxide semiconductor film 108. The entire oxide semiconductor film 108 overlaps with the conductive film 104 and the conductive film 122c with the insulating films 106, 114, and 116 provided therebetween.

In other words, the conductive film 104 and the conductive film 122c are connected in the opening 181 which is provided in the insulating films 106, 114, and 116 and each include a region located outward from the side end portion of the oxide semiconductor film 108. With such a structure, the oxide semiconductor film 108 included in the transistor Tr1 can be electrically enveloped by electric fields of the conductive film 104 and the conductive film 122c. In other words, the transistor Tr1 has a surrounded-channel (S-channel) structure.

Although the structure in which the first gate electrode is electrically connected to the second gate electrode is described above, one embodiment of the present invention is not limited thereto. For example, as in the transistor Tr2 shown in FIG. 26B, the conductive film 130 serving as the second gate electrode may be electrically connected to the conductive film 122a serving as the source electrode or the drain electrode of the transistor Tr2.

<4-2. Components of Semiconductor Device>

Next, components of the semiconductor device of this embodiment are described in detail. Note that portions that are similar to the portions in Embodiment 1 are denoted by the same reference numerals, and detailed description thereof is omitted.

[Conductive Film]

The conductive film 122a, the conductive film 122b, the conductive film 122c, the conductive film 130, the conductive film 138, and the conductive film 144 can be formed using a material similar to that for the conductive film 104, the conductive film 112a, the conductive film 112b, the conductive film 120a, and the conductive film 120b.

The conductive film 122a, the conductive film 122b, the conductive film 122c, the conductive film 130, the conductive film 138, and the conductive film 144 can each be formed using an oxide conductor (OC) such as an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc.

The above-listed oxide conductors (OCs) are suitable particularly as the conductive film 130.

[Insulating Film]

The insulating film 124, the insulating film 126, and the insulating film 134 can be formed using a material similar to that for the insulating film 106, the insulating film 114, and the insulating film 116.

Note that an insulating film that is in contact with one or both of the oxide semiconductor film 108 and the oxide semiconductor film 128 is preferably an oxide insulating film and preferably includes a region containing oxygen in excess of that in the stoichiometric composition (the oxygen-excess region). In other words, the oxide insulating film including the oxygen-excess region is an insulating film capable of releasing oxygen.

The oxygen-excess region of the oxide insulating film can be formed by any of the following methods, for example: an insulating film is formed in an oxygen atmosphere; an insulating film is formed, and then is subjected to heat treatment in an oxygen atmosphere; or an insulating film is formed, and then oxygen is added to the insulating film. Plasma treatment is preferable for adding oxygen into the formed insulating film.

The insulating film serving as the gate insulating film of each of the transistor Tr1 and the transistor Tr2 may be formed using silicon nitride. When silicon nitride is used for the insulating film serving as the gate insulating film, the following effects are obtained. Silicon nitride has a higher dielectric constant than silicon oxide and needs a larger thickness to obtain capacitance equivalent to that of silicon oxide. Thus, the thickness of the gate insulating film can be increased. This makes it possible to prevent a decrease in withstand voltage of the transistor Tr1 and the transistor Tr2 and to increase the withstand voltage, thereby preventing electrostatic discharge of the transistor Tr1 and the transistor Tr2.

The insulating films 114, 116, 124, and 126 have a function of supplying oxygen to the oxide semiconductor film 108 and/or the oxide semiconductor film 128. That is, the insulating films 114, 116, 124, and 126 contain oxygen. The insulating films 114 and 124 are insulating films which allow passage of oxygen. Note that the insulating film 114 also functions as a film for relieving damage to the oxide semiconductor film 108 at the time of forming the insulating film 116 in a later step. The insulating film 124 also functions as a film for relieving damage to the oxide semiconductor film 128 at the time of forming the insulating film 126 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating films 114 and 124.

In addition, it is preferable that the number of defects in the insulating films 114 and 124 be small, and typically, the spin density of a signal that appears at g=2.001 due to a dangling bond of silicon be lower than or equal to $3\times10^{17}$ spins/cm$^3$ when measured by ESR measurement. This is because if the density of defects in each of the insulating films 114 and 124 is high, oxygen is bonded to the defects and the amount of oxygen that passes through the insulating film 114 is decreased.

The insulating films 114 and 124 can each be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the release amount of ammonia is larger than the release amount of nitrogen oxide in thermal desorption spectroscopy (TDS); the release amount of ammonia is typically greater than or equal to $1\times10^{18}$ cm$^3$ and less than or equal to $5\times10^{19}$ cm$^3$. Note that the release amount of ammonia is the total amount of ammonia released by heat treatment at a temperature in the range of 50° C. to 650° C. or the range of 50° C. to 550° C. in TDS. The release amount of ammonia is the total release amount of ammonia converted into ammonia molecules in TDS.

The insulating film 134 serves as a protective insulating film of each of the transistor Tr1 and the transistor Tr2.

The insulating film 134 contains one or both of hydrogen and nitrogen. Alternatively, the insulating film 134 includes nitrogen and silicon. The insulating film 134 has a function of blocking oxygen, hydrogen, water, an alkali metal, an alkaline earth metal, or the like. It is possible to prevent outward diffusion of oxygen from the oxide semiconductor film 108 and the oxide semiconductor film 128, outward diffusion of oxygen included in the insulating films 114, 116, 124, and 126, and entry of hydrogen, water, or the like into the oxide semiconductor films 108 and 128 from the outside by providing the insulating film 134.

The insulating film 134 can be formed using a nitride insulating film, for example. The nitride insulating film is formed using silicon nitride, silicon nitride oxide, aluminum nitride, aluminum nitride oxide, or the like.

The insulating film 136 and the insulating film 140 each has a function of covering unevenness and the like caused by the transistor or the like. Each of the insulating films 136 and 140 has an insulating property and is formed using an inorganic or organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

[Oxide Semiconductor Film]

The oxide semiconductor film 128 can be formed using a material similar to that of the oxide semiconductor film 108 described above.

[EL Layer]

The EL layer 150 has a function of emitting light and includes at least a light-emitting element. Other than the light-emitting layer, the EL layer 150 includes functional layers such as a hole-injection layer, a hole-transport layer, an electron-transport layer, and an electron-injection layer. A low molecular compound or a high molecular compound can be used for the EL layer 150.

At least part of this embodiment can be implemented in combination with any of the other embodiments and the other examples described in this specification as appropriate.

Embodiment 5

In this embodiment, an example of a display panel which can be used for a display portion or the like in a display device including the semiconductor device of one embodiment of the present invention is described with reference to FIG. 28 and FIG. 29. The display panel described below as an example includes both a reflective liquid crystal element and a light-emitting element and can display an image in both the transmissive mode and the reflective mode.

<5-1. Structure Example of Display Panel>

Figure 28:
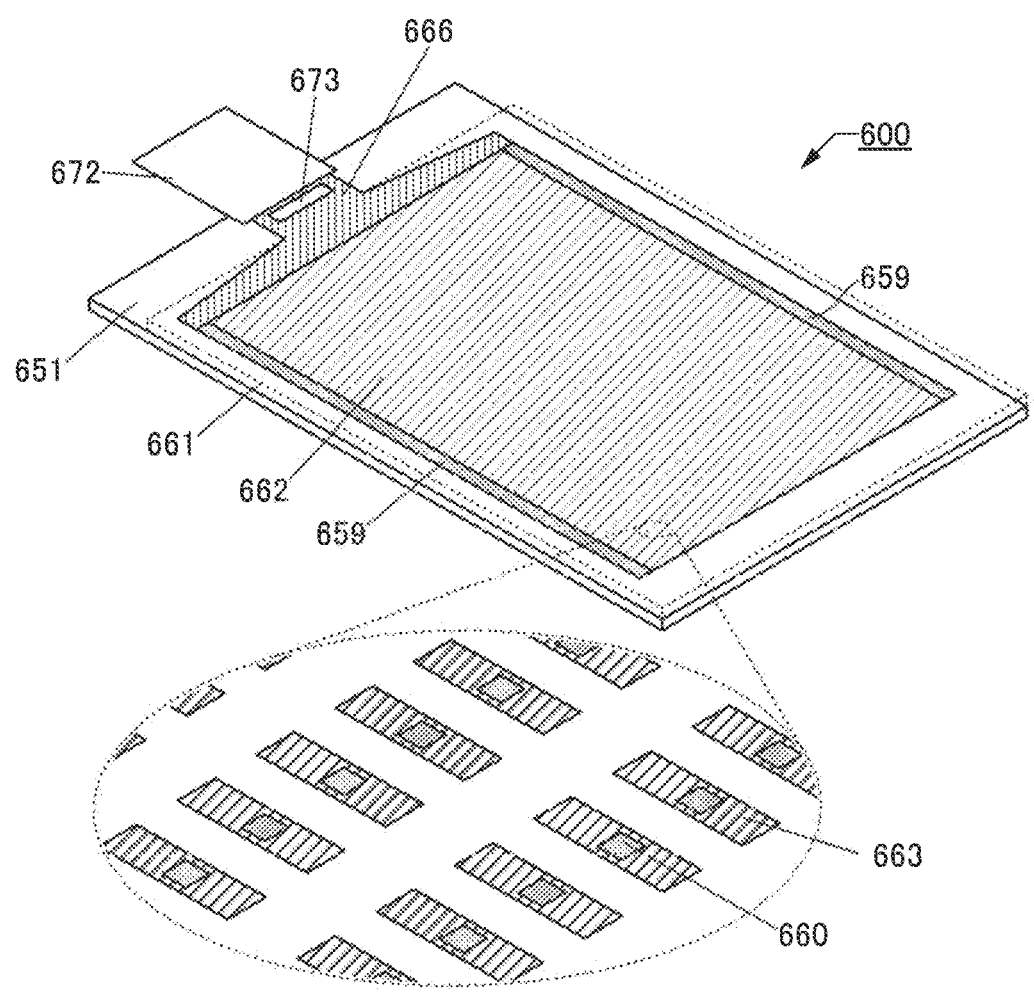
FIG. 28 illustrates a structure example of a display panel.

FIG. 28 is a schematic perspective view illustrating a display panel 600 of one embodiment of the present invention. In the display panel 600, a substrate 651 and a substrate 661 are attached to each other. In FIG. 28, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 28, an IC 673 and an FPC 672 are mounted on the substrate 651. Thus, the structure illustrated in FIG. 28 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion or the circuit 659. The signal or electric power is input to the wiring 666 from the outside through the FPC 672 or from the IC 673.

FIG. 28 shows an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 28 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 28, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<5-2. Cross-Sectional Structure Example>

Figure 29:
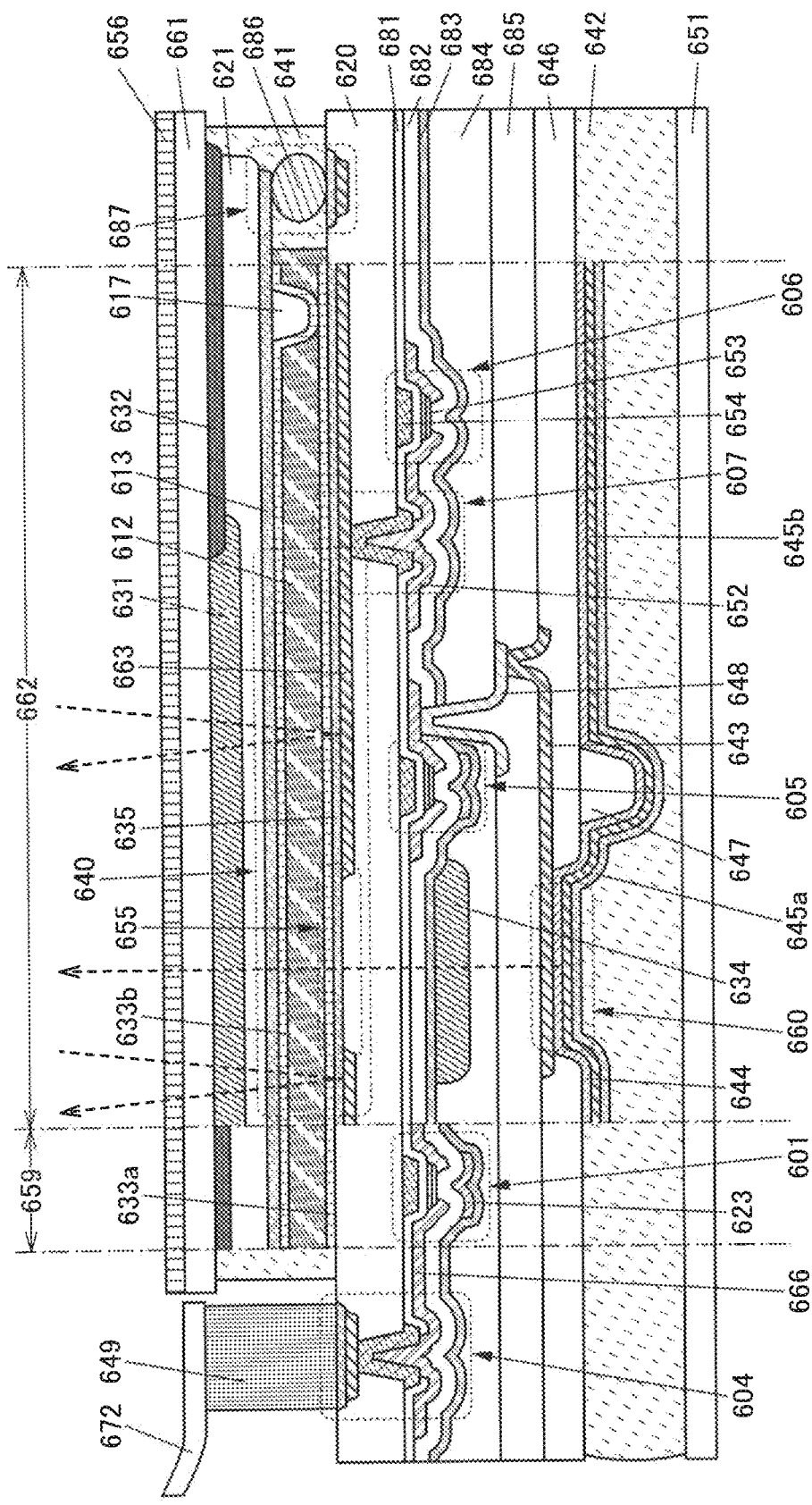
FIG. 29 illustrates a structure example of a display panel.

FIG. 29 shows an example of cross sections of part of a region including the FPC 672, part of a region including the circuit 659, and part of a region including the display portion 662 of the display panel illustrated in FIG. 28.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633*b*, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633*a* is provided between the liquid crystal layer 612 and the conductive film 635 and the alignment film 633*b* is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive film 663, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645b are stacked in this order from the insulating film 620 side. In addition, a conductive film 645a is provided to cover the conductive film 645b. The conductive film 645b contains a material reflecting visible light, and the conductive films 643 and 645a contain a material transmitting visible light. Light is emitted from the light-emitting element 660 to the substrate 661 side through the coloring layer 634, the insulating film 620, the opening 655, the conductive film 613, and the like.

Here, as illustrated in FIG. 29, the conductive film 635 transmitting visible light is preferably provided for the opening 655. Accordingly, the liquid crystal is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645a is formed using a blocking mask (metal mask), the insulating film 647 may have a function of preventing the blocking mask from being in contact with a surface on which the EL layer 644 or the conductive film 645a is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrates 651 and 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 29, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 29 illustrates an example of the circuit 659 in which the transistor 601 is provided.

The structure in which the semiconductor film 653 where a channel is formed is provided between two gates is used as an example of the transistors 601 and 605 in FIG. 29. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, the liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide or a metal nitride is preferably used. In the case of using a metal oxide, a material in which at least one of the concentrations of hydrogen, boron, phosphorus, nitrogen, and other impurities and the number of oxygen vacancies is made to be higher than those in a semiconductor layer of a transistor is used for the conductive film 635.

<5-3. Components>

The above components will be described below. Note that descriptions of structures having functions similar to those in the above embodiments are omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

<5-4. Manufacturing Method Example>

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

At least part of this embodiment can be implemented in combination with any of the other embodiments and the other examples described in this specification as appropriate.

Embodiment 6

In this embodiment, a display device including a semiconductor device of one embodiment of the present invention is described with reference to FIGS. 30A to 30C.

<6. Circuit Configuration of Display Device>

A display device illustrated in FIG. 30A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504*a*.

The source driver 504*b* includes a shift register or the like. The source driver 504*b* receives a signal (image signal) from which a data signal is generated, as well as a signal for driving the shift register, through the terminal portion 507. The source driver 504*b* has a function of generating a data signal to be written to the pixel circuit 501 from the image signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter referred to as data lines DL_1 to DL_Y). Alternatively, the source driver 504*b* has a function of supplying an initialization signal. Without being limited thereto, another signal can be supplied from the source driver 504*b*.

The source driver 504*b* includes a plurality of analog switches, for example. The source driver 504*b* can output, as data signals, time-divided image signals obtained by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504*a*. For example, to the pixel circuit 501 in the m-th row and the n-th column (m is a natural number of X or less, and n is a natural number of Y or less), a pulse signal is input from the gate driver 504*a* through the scan line GL_m, and a data signal is input from the source driver 504*b* through the data line DL_n in accordance with the potential of the scan line GL_m.

Figure 30A:
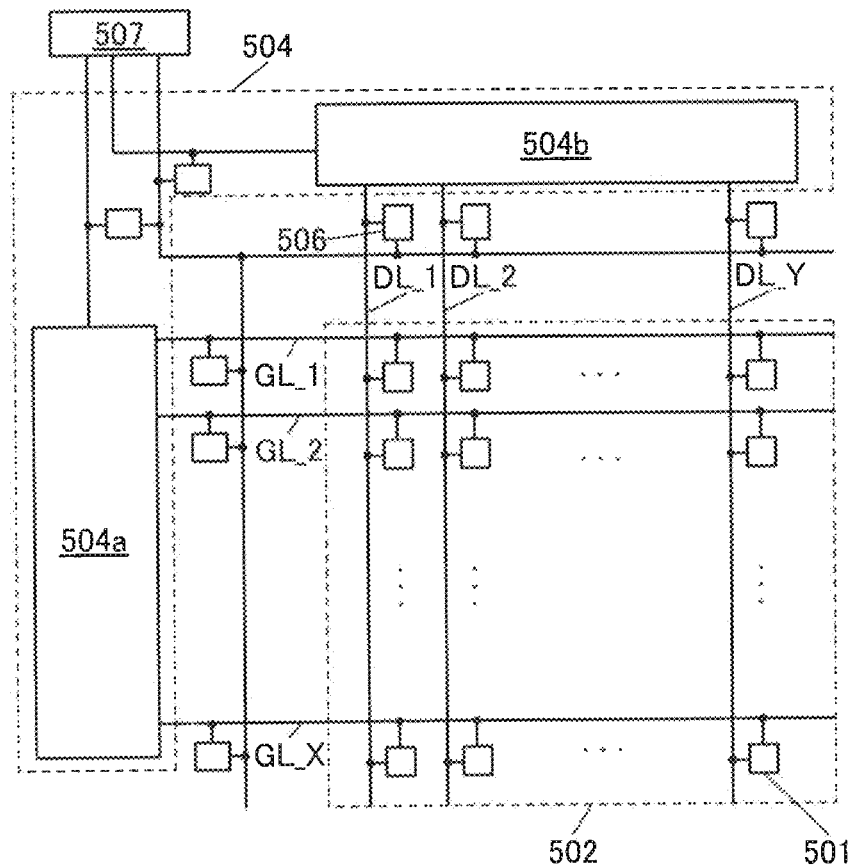
FIGS. 30A to 30C are a block diagram and circuit diagrams illustrating a display device.

The protection circuit 506 in FIG. 30A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 30A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504*a* or the source driver 504*b*. Alternatively, the protection circuit 506 can be connected to the terminal portion 507.

One embodiment of the present invention is not limited to the example in FIG. 30A, in which the driver circuit portion 504 includes the gate driver 504*a* and the source driver 504*b*. For example, only the gate driver 504*a* may be formed, and a separately prepared substrate over which a source driver circuit is formed (e.g., a driver circuit board formed using a single crystal semiconductor film or a polycrystalline semiconductor film) may be mounted.

Figure 30B:
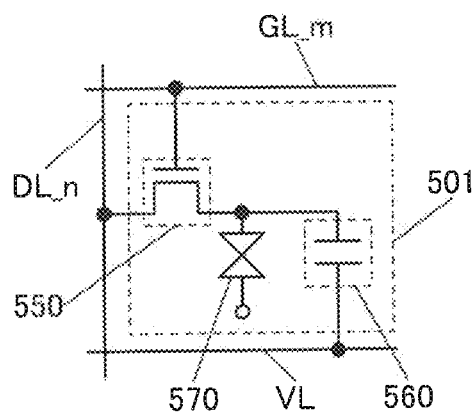

Each of the plurality of pixel circuits 501 in FIG. 30A can have the configuration illustrated in FIG. 30B, for example.

The pixel circuit 501 in FIG. 30B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 30B, the gate driver 504*a* in FIG. 30A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 30C:
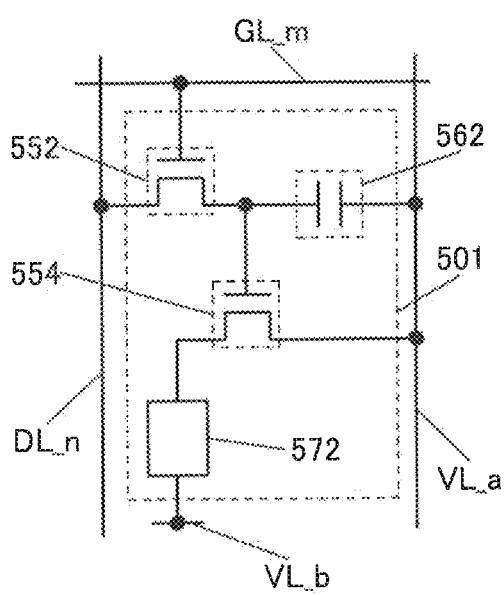

Alternatively, each of the plurality of pixel circuits 501 in FIG. 30A can have the configuration illustrated in FIG. 30C, for example.

The pixel circuit 501 in FIG. 30C includes transistors 552 and 554, a capacitor 562, and a light-emitting element 572.

The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 30C, the gate driver 504a in FIG. 30A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 7

In this embodiment, a display module and electronic devices, each of which includes a semiconductor device of one embodiment of the present invention, are described with reference to FIG. 31 to FIGS. 34A and 34B.

<7-1. Display Module>

Figure 31:
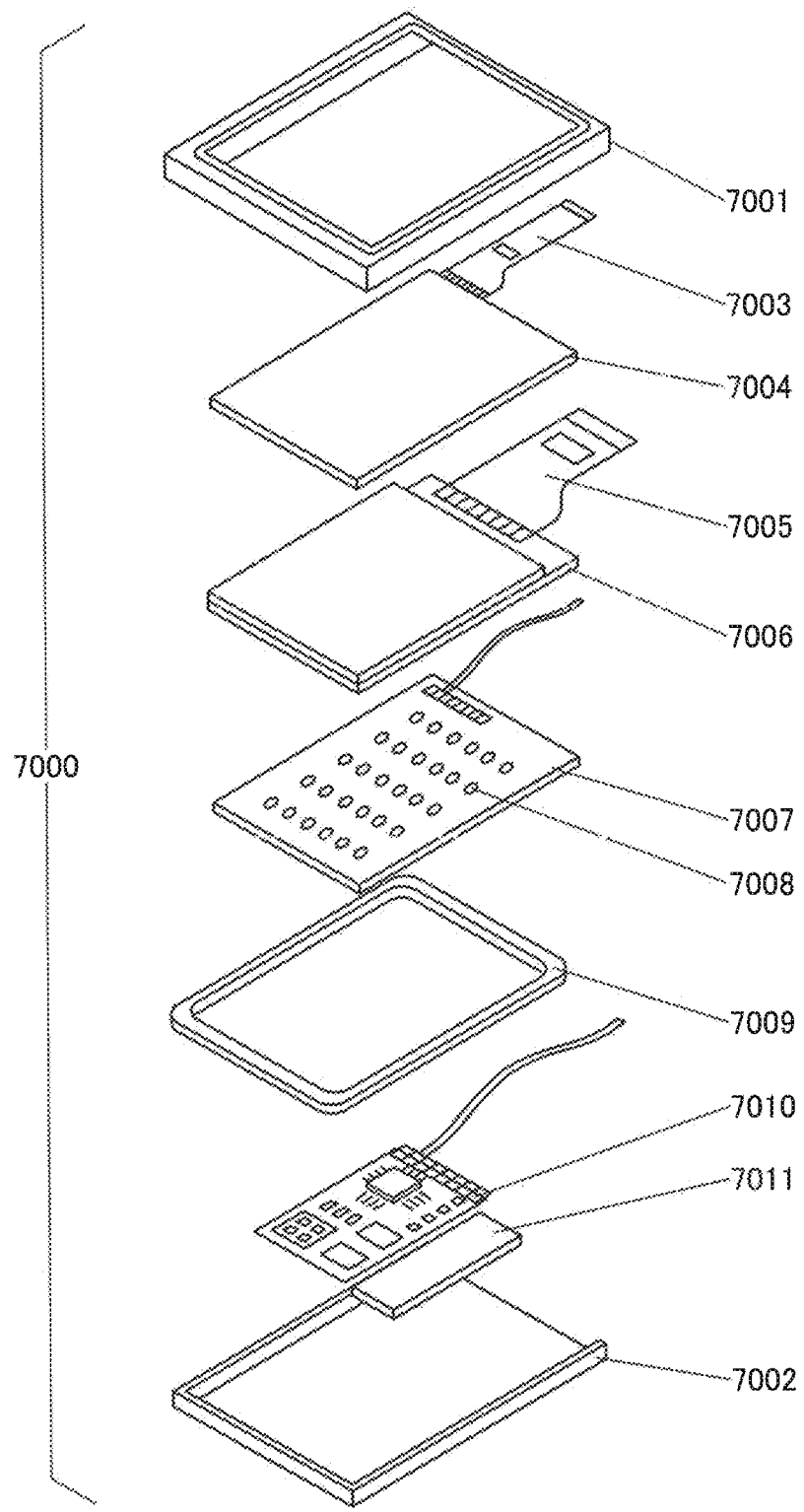
FIG. 31 illustrates a display module.

In a display module 7000 illustrated in FIG. 31, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 31, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<7-2. Electronic Device 1>

Next, FIGS. 32A to 32E illustrate examples of electronic devices.

Figure 32A:
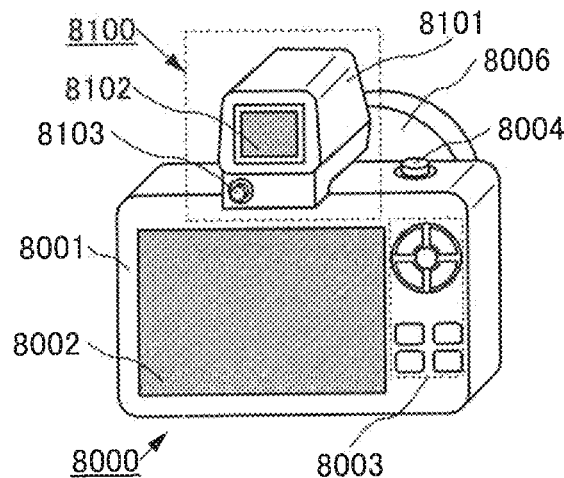
FIGS. 32A to 32E illustrate electronic devices.

FIG. 32A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 32A, the housing 8001 of the camera 8000 may include a finder having a display device.

Figure 32B:
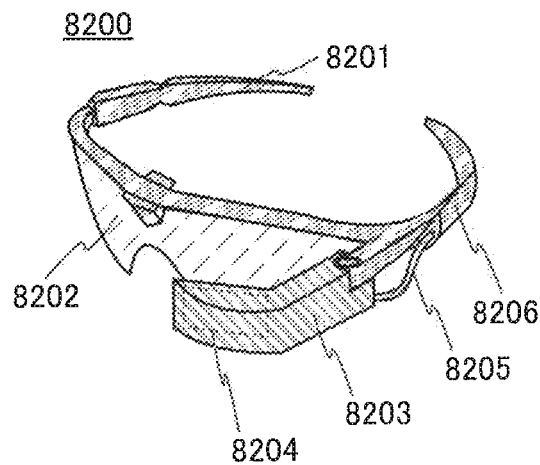

FIG. 32B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 32C:
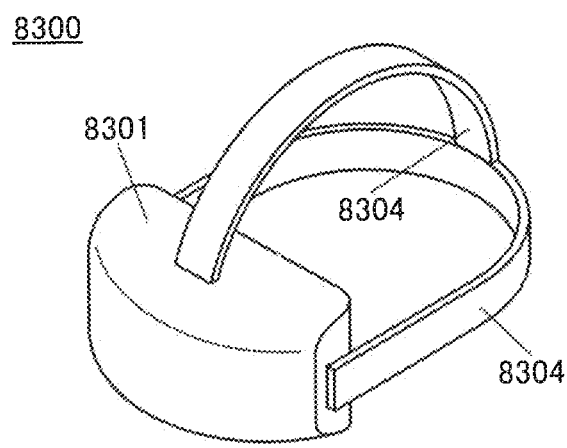
Figure 32D:
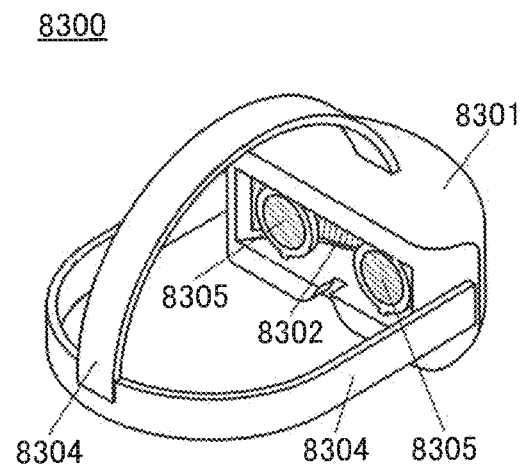
Figure 32E:
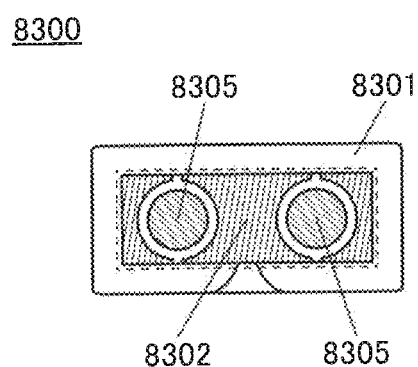

FIGS. 32C to 32E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 32E, the user does not perceive pixels, and thus a more realistic image can be displayed.

<7-3. Electronic Device 2>

Next, FIGS. 33A to 33G illustrate examples of electronic devices that are different from those illustrated in FIGS. 32A to 32E.

Electronic devices illustrated in FIGS. 33A to 33G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 33A to 33G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 33A to 33G are not limited thereto, and the electronic devices can have a variety of functions. Although not illustrated in FIGS. 33A to 33G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 33A to 33G are described in detail below.

Figure 33A:
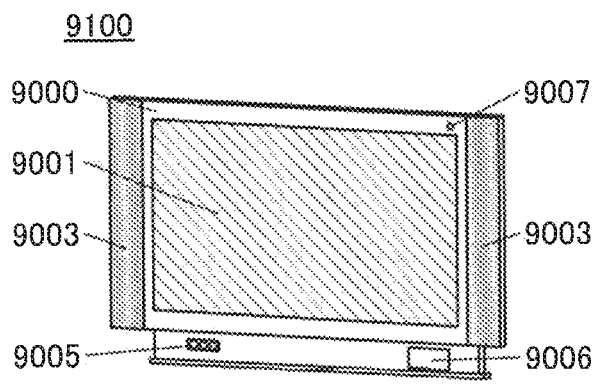
FIGS. 33A to 33G illustrate electronic devices.

FIG. 33A is a perspective view illustrating a television device 9100. The television device 9100 can include the display portion 9001 having a large screen size of, for example, 50 inches or more, or 100 inches or more.

Figure 33D:
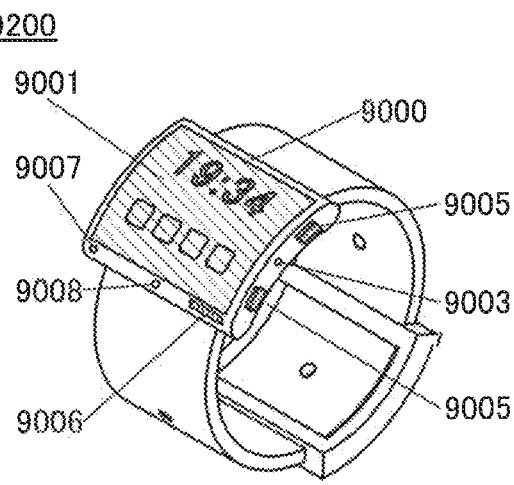
Figure 33B:
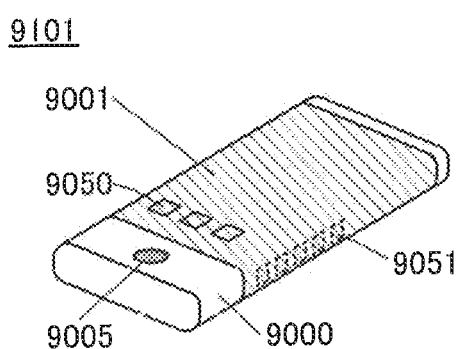

FIG. 33B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 33C:
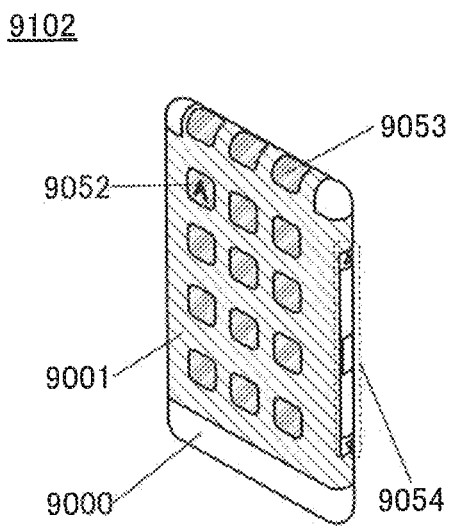

FIG. 33C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 33D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 33E:
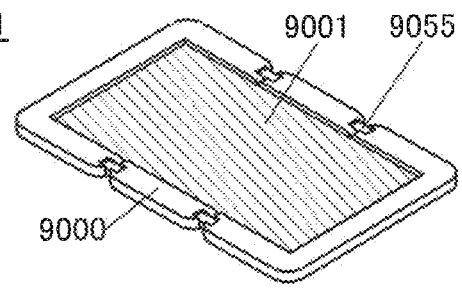
Figure 33F:
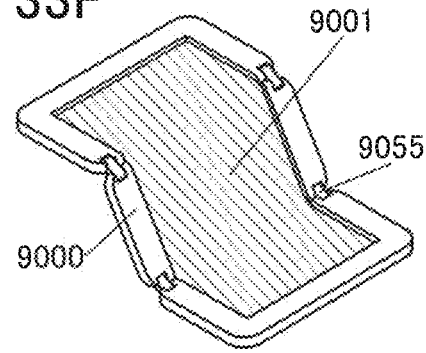
Figure 33G:
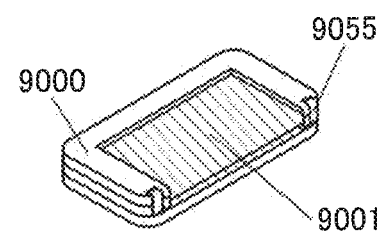

FIGS. 33E, 33F, and 33G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 m.

Figure 34A:
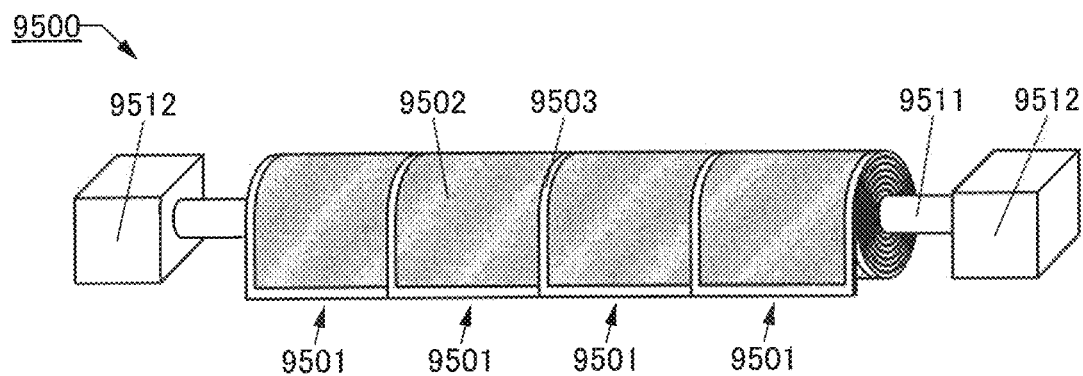
FIGS. 34A and 34B are perspective views illustrating a display device.
Figure 34B:
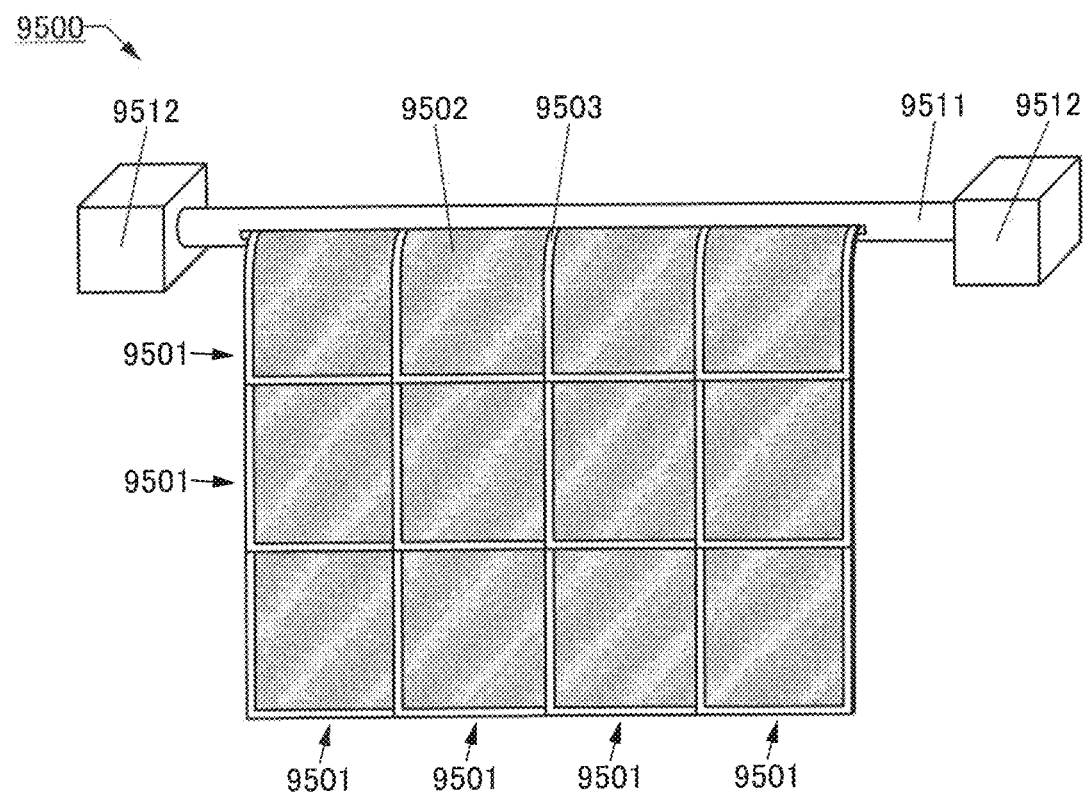

FIGS. 34A and 34B show an example of an electronic device that is different from the electronic devices illustrated in FIGS. 32A to 32E and FIGS. 33A to 33G. FIGS. 34A and 34B are perspective views of a display device including a plurality of display panels. Note that FIG. 34A is a perspective view showing a mode where the plurality of display panels is rolled up, and FIG. 34B is a perspective view of showing a mode where the plurality of display panels is spread.

A display device 9500 illustrated in FIGS. 34A and 34B includes a plurality of display panels 9501, a hinge 9511, and a bearing 9512. Each of the plurality of display panels 9501 includes a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be rolled up depending on its use.

Moreover, although the display regions 9502 of the adjacent display panels 9501 are separated from each other in FIGS. 34A and 34B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments and the other examples described in this specification as appropriate.

Example 1

In this example, transistors of one embodiment of the present invention were fabricated. In addition, Id-Vg characteristics of the transistors were measured. A GBT test was performed.

[Fabrication of Transistor]

Transistors each of which corresponds to the transistor 100E described above were fabricated. The electrical characteristics of the transistors were evaluated. In this example, Samples A1 and A2 described below were fabricated.

Note that Sample A1 and Sample A2 include a transistor whose channel length L is 3 µm and a transistor whose channel length L is 6 µm, respectively. Each of the transistors has a channel width W of 50 µm.

[Fabrication Method of Sample A1 and Sample A2]

First, a 100-nm-thick tungsten film was formed over a glass substrate with a sputtering apparatus. Then, the conductive film was processed by a photolithography process to form the conductive film 104 serving as a first gate electrode.

Next, four insulating films were stacked over the substrate and the conductive film to form the insulating film 106 serving as a first gate insulating film (see FIG. 7A). The insulating film 106 was formed in succession in a vacuum with a plasma-enhanced chemical deposition (PECVD) apparatus. As the insulating film 106, a 50-nm-thick silicon nitride film, a 300-nm-thick silicon nitride film, a 50-nm-thick silicon nitride film, and a 50-nm-thick silicon oxynitride film were stacked in this order.

Next, the oxide semiconductor film 108_1_0 and the oxide semiconductor film 108_2_0 were formed in this order over the insulating film 106 (see FIG. 7C). Then, the stacked oxide semiconductor films were processed into an island shape to form the oxide semiconductor film 108 (see FIG. 8A). A 20-nm-thick In—Ga—Zn film and a 25-nm-thick In—Ga—Zn film were used as the oxide semiconductor film 108_1_0 and the oxide semiconductor film 108_2_0, respectively.

The oxide semiconductor film 108_1_0 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (In:Ga:Zn=4:2:4.1 [atomic ratio]). Note that the proportion of oxygen in the whole deposition gas may be referred to as oxygen flow rate. The oxygen flow rate in forming the oxide semiconductor film 108_1_0 was 10%.

The oxide semiconductor film 108_2_0 was deposited under the deposition conditions for the oxide semiconductor film 108_1_0. Note that the flow rate of the sputtering gas was changed. Specifically, the introduction of an oxygen gas into the chamber was stopped, and an oxygen gas with a flow rate of 200 sccm was introduced into the chamber of the sputtering apparatus. Note that the oxygen flow rate in the deposition of the oxide semiconductor film 108_2_0 was 100%.

Next, heat treatment was performed. The heat treatment was performed at a heating temperature of 350° C. in a nitrogen atmosphere for one hour. Then, the heat treatment was performed at a heating temperature of 350° C. in a mixed gas atmosphere of nitrogen and oxygen for one hour.

Next, a conductive film was formed over the insulating film 106 and the oxide semiconductor film 108 and processed into a desired shape, whereby the conductive films 112a and 112b were formed. For the conductive films, a 30-nm-thick first titanium film and a 200-nm-thick copper film were formed in this order using the sputtering apparatus (see FIG. 8C). Next, the copper film was etched by a photolithography method. After that, a 50-nm-thick second titanium film was formed using the sputtering apparatus. Then, the first titanium film and the second titanium film were etched by a photolithography method to form the conductive films 112a and 112b having a shape shown in FIG. 8C.

Next, a surface of the oxide semiconductor film 108 (on the back channel side) was cleaned using phosphoric acid.

Then, the insulating film 114 was formed over the insulating film 106, the oxide semiconductor film 108, and the conductive films 112a and 112b. Then, the insulating film 116 was formed over the insulating film 114 (see FIG. 9A). The insulating film 114 and the insulating film 116 were formed in succession in a vacuum using a plasma-enhanced chemical vapor deposition (PECVD) apparatus. A 30-nm-thick silicon oxynitride film and a 400-nm-thick silicon oxynitride film were used as the insulating film 114 and the insulating film 116, respectively.

Next, heat treatment was performed. The heat treatment was performed at a heating temperature of 350° C. in a nitrogen atmosphere for one hour.

Next, a conductive film (not shown) was formed over the insulating film 116. As the conductive film, a 6-nm-thick ITSO film was formed using the sputtering apparatus.

Then, oxygen was added to the insulating film 116 by passing through the conductive film by a plasma treatment. In the plasma treatment, plasma was discharged in an atmosphere containing an oxygen gas.

Next, the conductive film was etched.

Next, an insulating film was formed over the insulating film 116. As the insulating film, a 100-nm-thick silicon nitride film was formed using the plasma-enhanced chemical vapor deposition (PECVD) apparatus.

An opening was formed in a desired portion of the insulating film. The opening was formed by a dry etching method.

Then, a conductive film was formed to fill the opening and was processed into an island shape, whereby the conductive film serving as a second gate electrode was formed. As the conductive film, a 100-nm-thick ITSO film was formed using the sputtering apparatus.

Next, another insulating film was formed over the insulating film and the conductive film A 1.5-µm-thick acrylic-based photosensitive resin was used for the insulating film.

Through the above process, Sample A1 and Sample A2 were fabricated.

[Id-Vg Characteristics of Transistors]

Next, Id-Vg characteristics of the fabricated transistors of Sample A1 and Sample A2 were measured. Note that as conditions for measuring the Id-Vg characteristics of each transistor, a voltage applied to the conductive film serving as a first gate electrode (hereinafter the voltage is also referred to as gate voltage (Vg)) and a voltage applied to the conductive film serving as the second gate electrode (hereinafter the voltage is also referred to as back gate voltage (Vbg)) were changed from −10 V to +10 V in increments of 0.25 V. A voltage applied to the conductive film serving as a source electrode (the voltage is also referred to as source voltage (Vs)) was 0 V (comm). A voltage applied to the conductive film serving as a drain electrode (the voltage is also referred to as drain voltage (Vd)) was 0.1 V and 20 V.

Figure 35A:
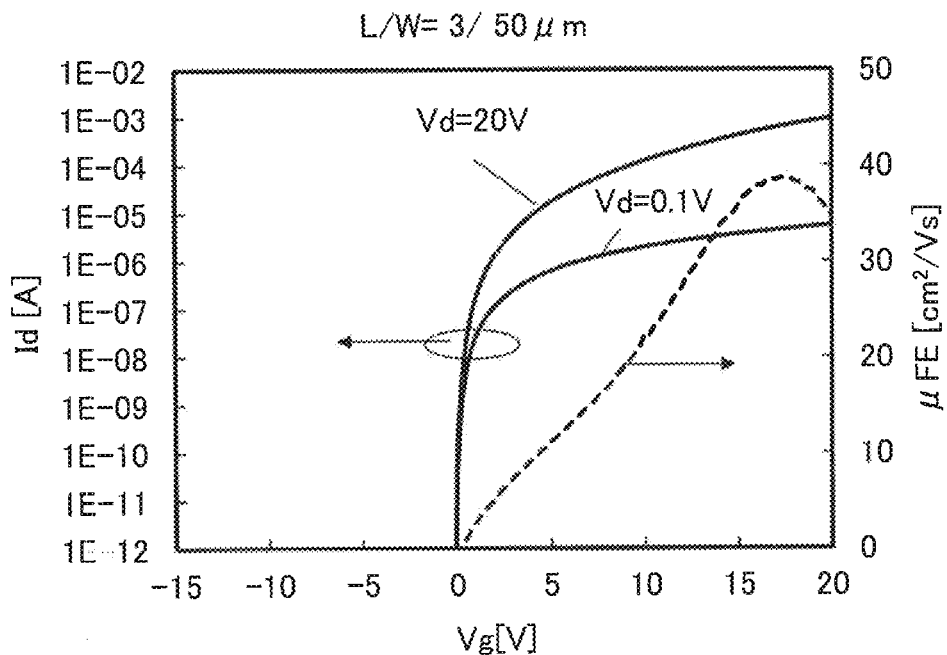
FIGS. 35A and 35B show Id-Vg characteristics of transistors.
Figure 35B:
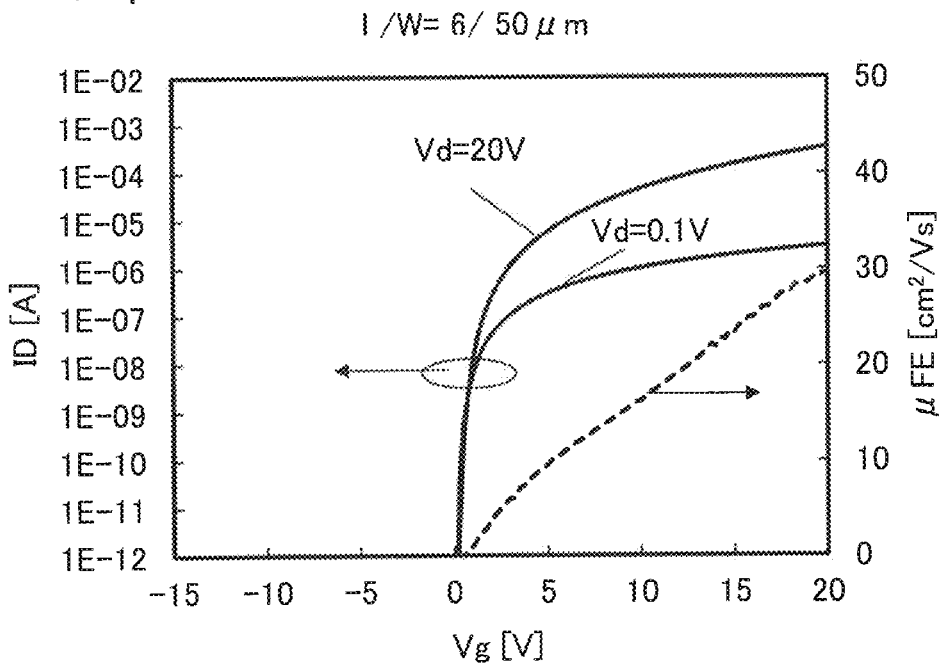

FIGS. 35A and 35B show the results of Id-Vg characteristics of Sample A1 and Sample A2, respectively. Note that in FIGS. 35A and 35B, the first vertical axis represents Id (A), the second vertical axis represents field-effect mobility (µFE) (cm2/Vs), and the horizontal axis represents Vg (V). Note that the field-effect mobility was measured when Vd was 20 V.

As shown in FIGS. 35A and 35B, the transistors each having high field-effect mobility and favorable switching characteristics can be fabricated.

[Gate Bias-Temperature Stress Test (GBT Test)]

Next, the reliability of Sample A2 which was fabricated was evaluated. A GBT test was used for the evaluation of reliability.

The conditions for the GBT test in this example were as follows: a voltage applied to a conductive film serving as a first gate electrode and a conductive film serving as a second gate electrode (hereinafter the voltage is referred to as gate voltage (Vg)) was ±30 V, a voltage applied to a conductive film serving as a source electrode and a drain electrode (hereinafter the voltage is referred to as drain voltage (Vd) and source voltage (Vs)) was 0 V (COMMON), the stress temperature was 60° C., and stress was applied for one hour. The measurement was performed under a dark environment and a photo environment (irradiation with light at approximately 10,000 lx with a white LED). In other words, the source electrode and the drain electrode of the transistor were set at the same potential. A potential different from that of the source and drain electrodes was applied to the first gate electrode and the second gate electrode for a certain time (one hour, here).

When the potential applied to the first gate electrode and the second gate electrode is higher than that of the source and drain electrodes, positive stress is applied. In contrast, when the potential applied to the first gate electrode and the second gate electrode is lower than that of the source and drain electrodes, negative stress is applied. Thus, the evaluation of reliability was performed under four conditions in total: positive GBT stress (Dark), negative GBT stress (Dark), positive GBT stress (Light irradiation), and negative GBT stress (Light irradiation). Note that positive GBT (Dark) can be referred to as PBTS (Positive Bias Temperature Stress), negative GBT (Dark) as NBTS (Negative Bias Temperature Stress), positive GBT (Light irradiation) as PBITS (Positive Bias Illuminations Temperature Stress), negative GBT (Light irradiation) as NBITS (Negative Bias Illuminations Temperature Stress).

Figure 36:
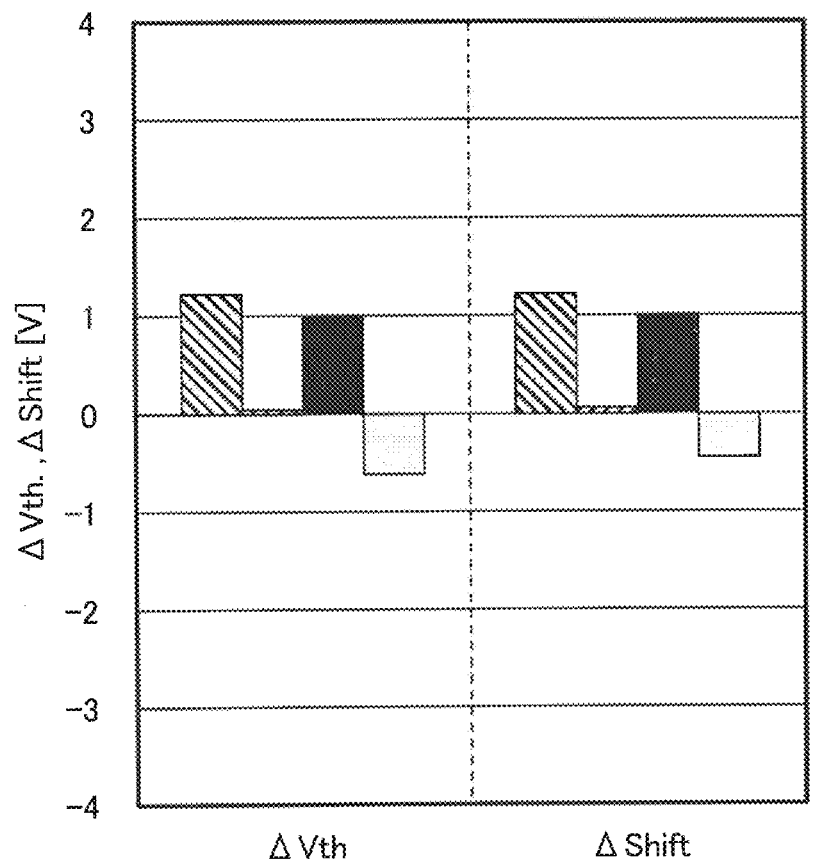
FIG. 36 shows results of GBT tests performed on transistors.

FIG. 36 shows the GBT test results of Sample A2. In FIG. 36, the amount of shift in threshold voltage of a transistor (ΔVth) and the amount of shift in Shift value (ΔShift) are shown on the left and the right, respectively.

The Shift value is, in the drain current (Id)-gate voltage (Vg) characteristics of the transistor, the gate voltage (Vg) at a point of intersection of an axis of $1\times10^{-12}$ A and a tangent line of the logarithm of a drain current (Id) having the highest gradient. Note that ΔShift is the amount of change in the Shift value.

From the results in FIG. 36, the amount of change in threshold voltage (ΔVth) and the amount of change in shift value (ΔShift) were within ±2 V in GBT tests for the transistor included in Sample A2. This means that the transistor included in Sample A2 has high reliability.

Example 2

In this example, transistors were fabricated using one embodiment of the present invention. In addition, the Id-Vg characteristics of the transistors were measured and GBT tests were performed.

[Fabrication of Transistor]

Transistors each of which corresponds to the transistor 100E described above were fabricated. The electrical characteristics of the transistors were evaluated. In this example, Samples B1 and B2 described below were fabricated. Note that Sample B1 and Sample B2 are different from Sample A1 and Sample A2 in that the atomic ratio of In to Zn of the oxide semiconductor film 108_1 is larger than the atomic ratio of In to Zn of the oxide semiconductor film 108_2.

Note that Sample B1 and Sample B2 include a transistor whose channel length L is 3 μm and a transistor whose channel length L is 6 μm, respectively. Each of the transistors has a channel width W of 50 μm.

[Fabrication Method of Sample B1 and B2]

The formation method of an oxide semiconductor film included in each of Sample B1 and Sample B2 is different from that of the oxide semiconductor film included in each of Sample A1 and Sample A2. Specifically, the atomic ratio of a target used for forming the oxide semiconductor film 108_1_0 is different from that of a target used for forming the oxide semiconductor film 108_2_0.

The oxide semiconductor film 108_1_0 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kW was applied to a metal oxide target containing indium, gallium, and zinc (In:Ga: Zn=4:2:4.1 [atomic ratio]). Note that the proportion of oxygen in the whole deposition gas may be referred to as oxygen flow rate. The oxygen flow rate in forming the oxide semiconductor film 108_1_0 is 10%. Note that the In—Ga—Zn oxide film formed using the target with an atomic ratio of In:Ga:Zn=4:2:4.1 has an energy gap of approximately 3.0 eV and an electron affinity of approximately 4.4 eV.

The oxide semiconductor film 108_2_0 was formed under the following conditions: the substrate temperature was 170° C.; an argon gas with a flow rate of 100 sccm and an oxygen gas with a flow rate of 100 sccm were introduced into a chamber of the sputtering apparatus; the pressure was set to 0.6 Pa; and an AC power of 0.5 kW was applied to a metal oxide target containing indium, gallium, and zinc (In:Ga: Zn=1:1:1 [atomic ratio]). Note that the proportion of oxygen in the whole deposition gas may be referred to as oxygen flow rate. The oxygen flow rate in forming the oxide semiconductor film 108_2_0 is 50%. Note that the In—Ga—Zn oxide film formed using the target with an atomic ratio of In:Ga:Zn=1:1:1 has an energy gap of approximately 3.2 eV and an electron affinity of approximately 4.7 eV.

[Id-Vg Characteristics of Transistors]

Next, Id-Vg characteristics of the transistors included in Sample B1 and Sample B2 were measured. Note that the conditions for measuring the Id-Vg characteristics of the transistors were similar to those for Sample A1 and Sample A2.

Figure 37A:
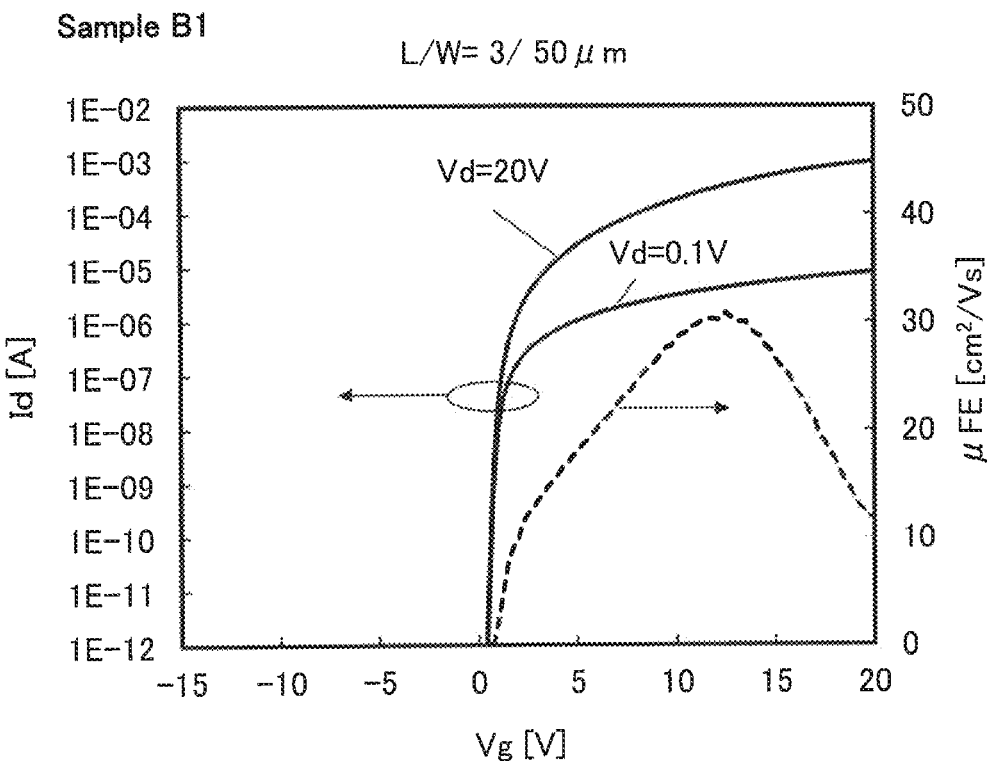
FIGS. 37A and 37B show Id-Vg characteristics of transistors.
Figure 37B:
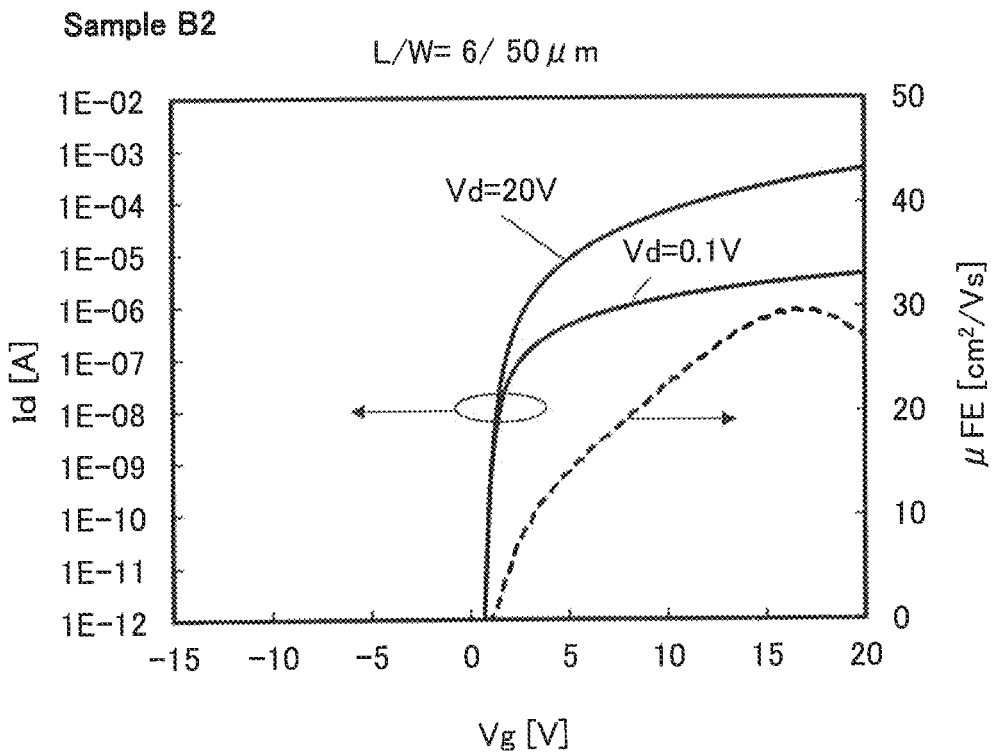

FIGS. 37A and 37B show the results of Id-Vg characteristics of Sample B1 and Sample B2, respectively. Note that in FIGS. 37A and 37B, the first vertical axis represents $I_d$ (A), the second vertical axis represents field-effect mobility (μFE) (cm$^2$/Vs), and the horizontal axis represents $V_g$ (V). Note that the field-effect mobility was measured when $V_d$ was 20 V.

As shown in FIGS. 37A and 37B, the transistors each having high field-effect mobility and favorable switching characteristics can be fabricated.

[Gate Bias-Temperature Stress Test (GBT Test)]

Next, the reliability of Sample B2 which was fabricated was evaluated. A GBT test was used for the evaluation of reliability. Note that the measurement conditions for the GBT test were similar to those for Sample A1 and Sample A2.

Figure 38:
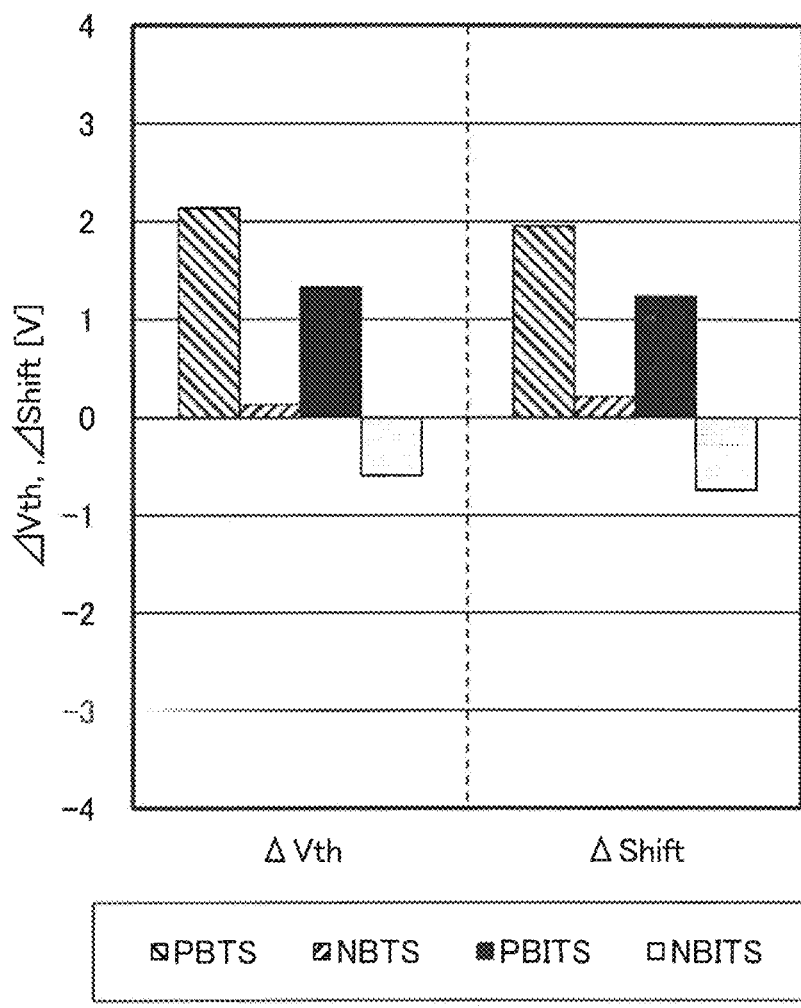
FIG. 38 shows results of GBT tests performed on transistors.

FIG. 38 shows the GBT test results of Sample B2. In FIG. 38, the amount of shift in threshold voltage of a transistor (ΔVth) and the amount of shift in Shift value (ΔShift) are shown on the left and the right, respectively.

The Shift value is, in the drain current (Id)-gate voltage (Vg) characteristics of the transistor, the gate voltage (Vg) at a point of intersection of an axis of $1\times10^{-12}$ A and a tangent line of the logarithm of a drain current (Id) having the highest gradient. Note that ΔShift is the amount of change in the Shift value.

From the results in FIG. 38, the amount of change in threshold voltage (ΔVth) and the amount of change in shift value (ΔShift) were within ±3 V in GBT tests for the transistor included in Sample B2. This means that the transistor included in Sample B2 has high reliability.

At least part of this example can be implemented in combination with any of the embodiments described in this specification as appropriate.

EXPLANATION OF REFERENCE

100: transistor, 100A: transistor, 100B: transistor, 100C: transistor, 100D: transistor, 100E: transistor, 102: substrate, 104: conductive film, 106: insulating film, 108: oxide semiconductor film, 1081: oxide semiconductor film, 108_1_0: oxide semiconductor film, 108_2: oxide semiconductor film, 108_2_0: oxide semiconductor film, 1092: oxide semiconductor film, 112: conductive film, 112a: conductive film, 112a_1: conductive film, 112a_2: conductive film, 112a_3: conductive film, 112b: conductive film, 112b_1: conductive film, 112b_2: conductive film, 112b_3: conductive film, 114: insulating film, 116: insulating film, 118: insulating film, 120: conductive film, 120a: conductive film, 120b: conductive film, 122a: conductive film, 122b: conductive film, 122c: conductive film, 124: insulating film, 126: insulating film, 128: oxide semiconductor film, 130: conductive film, 134: insulating film, 136: insulating film, 138: conductive film, 140: insulating film, 141a: opening, 141b: opening, 142a: opening, 142b: opening, 144: conductive film, 150: EL layer, 160: light-emitting element, 181: opening, 182: opening, 184: opening, 190: semiconductor device, 191: target, 192: plasma, 193: target, 194: plasma, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 600: display panel, 601: transistor, 604: contact portion, 605: transistor, 606: transistor, 607: contact portion, 612: liquid crystal layer, 613: conductive film, 617: insulating film, 620: insulating film, 621: insulating film, 623: conductive film, 631: coloring layer, 632: light-blocking film, 633*a*: alignment film 633*b*: alignment film, 634: coloring layer, 640: liquid crystal element, 641: bonding layer, 642: bonding layer, 643: conductive film, 644: EL layer, 645*a*: conductive film, 645*b*: conductive film, 646: insulating film, 647: insulating film, 648: conductive film, 649: connection layer, 651: substrate, 652: conductive film, 653: semiconductor film, 654: conductive film, 655: opening, 656: polarizing plate, 659: circuit, 660: light-emitting element, 661: substrate, 662: display portion, 663: conductive film, 664: electrode, 665: electrode, 666: wiring, 667: electrode, 672: FPC, 673: IC, 681: insulating film, 682: insulating film, 683: insulating film, 684: insulating film, 685: insulating film, 686: connector, 687: contact portion, 700: display device, 701: substrate, 702: pixel portion, 704: driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 777: conductive film, 778: structure, 780: anisotropic conductive film, 782: light-emitting element, 786: EL layer, 788: conductive film, 790: capacitor, 791: touch panel, 792: insulating film, 793: electrode, 794: electrode, 795: insulating film, 796: electrode, 797: insulating film, 2190: plasma, 2192: cation, 2501: deposition chamber, 2502*a*: target, 2502*b*: target, 2504: segregation region, 2504*a*: sputtered particle, 2506: segregation region, 2506*a*: sputtered particle, 2510*a*: backing plate, 2510*b*: backing plate, 2520: target holder, 2520*a*: target holder, 2520*b*: target holder, 2530*a*: magnet unit, 2530*b*: magnet unit, 2530N1: magnet, 2530N2: magnet, 2530S: magnet, 2532: magnet holder, 2542: member, 2560: substrate, 2570: substrate holder, 2580*a*: magnetic line of force, 2580*b*: magnetic line of force, 6651: substrate, 7000: display module, 70001: upper cover, 7002: lower cover, 7003: FPC, 7004: touch panel, 7005: FPC, 7006: display panel, 7007: backlight, 7008: light source, 7009: frame, 7010: printed board, 7011: battery, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing bands, 8305: lenses, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal, 9500: display device, 9501: display panel, 9502: display region, 9503: region, 9511: hinge, 9512: bearing.

This application is based on Japanese Patent Application serial No. 2016-080066 filed with Japan Patent Office on Apr. 13, 2016 and Japanese Patent Application serial No. 2016-080137 filed with Japan Patent Office on Apr. 13, 2016, the entire contents of which are hereby incorporated by reference.

The invention claimed is:

1. A method for manufacturing a semiconductor device comprising:
forming a gate electrode;
forming a gate insulating film over the gate electrode;
forming a first oxide semiconductor film over the gate insulating film; and
forming a second oxide semiconductor film over and in direct contact with the first oxide semiconductor film,
forming an oxide insulating film over and in direct contact with the second oxide semiconductor film,
wherein percentage of a flow rate of an oxygen gas in entire flow rate of a deposition gas for forming the second oxide semiconductor film is higher than percentage of a flow rate of an oxygen gas in entire flow rate of a deposition gas for forming the first oxide semiconductor film,
wherein each of the first oxide semiconductor film and the second oxide semiconductor film comprises indium, gallium, and zinc,
wherein a proportion of the indium is higher than a proportion of gallium in the first oxide semiconductor film,
wherein a proportion of the indium is higher than a proportion of gallium in the second oxide semiconductor film, and
wherein the first oxide semiconductor film comprises a region having lower crystallinity than the second oxide semiconductor film.

2. A method for manufacturing a semiconductor device comprising:
forming a gate electrode;
forming a gate insulating film over the gate electrode;
forming a first oxide semiconductor film over the gate insulating film; and
forming a second oxide semiconductor film over and in direct contact with the first oxide semiconductor film,
forming an oxide insulating film over and in direct contact with the second oxide semiconductor film,
wherein percentage of a flow rate of an oxygen gas in entire flow rate of a deposition gas for forming the first oxide semiconductor film is higher than or equal to 5% and lower than or equal to 15%, and
wherein percentage of a flow rate of an oxygen gas in entire flow rate of a deposition gas for forming the second oxide semiconductor film is higher than or equal to 70% and lower than or equal to 100%,
wherein each of the first oxide semiconductor film and the second oxide semiconductor film comprises indium, gallium, and zinc,
wherein a proportion of the indium is higher than a proportion of gallium in the first oxide semiconductor film,
wherein a proportion of the indium is higher than a proportion of gallium in the second oxide semiconductor film, and
wherein the first oxide semiconductor film comprises a region having lower crystallinity than the second oxide semiconductor film.

3. A method for manufacturing a semiconductor device comprising:

forming a gate electrode;

forming a gate insulating film over the gate electrode;

forming a first oxide semiconductor film over the gate insulating film; and forming a second oxide semiconductor film over and in direct contact with the first oxide semiconductor film, forming an oxide insulating film over and in direct contact with the second oxide semiconductor film, wherein percentage of a flow rate of an oxygen gas in entire flow rate of a deposition gas for forming the first oxide semiconductor film is 10%, and wherein percentage of a flow rate of an oxygen gas in entire flow rate of a deposition gas for forming the second oxide semiconductor film is 100%, wherein each of the first oxide semiconductor film and the second oxide semiconductor film comprises indium, gallium, and zinc, wherein a proportion of the indium is higher than a proportion of gallium in the first oxide semiconductor film, wherein a proportion of the indium is higher than a proportion of gallium in the second oxide semiconductor film, and wherein the first oxide semiconductor film comprises a region having lower crystallinity than the second oxide semiconductor film.

4. The method for manufacturing the semiconductor device according to claim 1, wherein the first oxide semiconductor film is formed by a sputtering target, and wherein the second oxide semiconductor film is formed by the sputtering target.

5. The method for manufacturing the semiconductor device according to claim 1, wherein the proportion of the gallium is higher than or equal to 1.5 and lower than or equal to 2.5 and a proportion of the zinc is higher than or equal to 2 and lower than or equal to 4 when the proportion of the indium is 4.

6. The method for manufacturing the semiconductor device according to claim 1, wherein a thickness of the second oxide semiconductor film is larger than a thickness of the first oxide semiconductor film.

7. The method for manufacturing the semiconductor device according to claim 1, wherein the second oxide semiconductor film includes a crystal part, and wherein the crystal part has a c-axis alignment.

8. The method for manufacturing the semiconductor device according to claim 2, wherein the first oxide semiconductor film is formed by a sputtering target, and wherein the second oxide semiconductor film is formed by the sputtering target.

9. The method for manufacturing the semiconductor device according to claim 2, wherein the proportion of the gallium is higher than or equal to 1.5 and lower than or equal to 2.5 and a proportion of the zinc is higher than or equal to 2 and lower than or equal to 4 when the proportion of the indium is 4.

10. The method for manufacturing the semiconductor device according to claim 2, wherein a thickness of the second oxide semiconductor film is larger than a thickness of the first oxide semiconductor film.

11. The method for manufacturing the semiconductor device according to claim 2, wherein the second oxide semiconductor film includes a crystal part, and wherein the crystal part has a c-axis alignment.

12. The method for manufacturing the semiconductor device according to claim 3, wherein the first oxide semiconductor film is formed by a sputtering target, and wherein the second oxide semiconductor film is formed by the sputtering target.

13. The method for manufacturing the semiconductor device according to claim 3, wherein the proportion of the gallium is higher than or equal to 1.5 and lower than or equal to 2.5 and a proportion of the zinc is higher than or equal to 2 and lower than or equal to 4 when the proportion of the indium is 4.

14. The method for manufacturing the semiconductor device according to claim 3, wherein a thickness of the second oxide semiconductor film is larger than a thickness of the first oxide semiconductor film.

15. The method for manufacturing the semiconductor device according to claim 3, wherein the second oxide semiconductor film includes a crystal part, and wherein the crystal part has a c-axis alignment.

16. The method for manufacturing the semiconductor device according to claim 1, wherein a substrate temperature in forming the second oxide semiconductor film is higher than a substrate temperature in forming the first oxide semiconductor film.

17. The method for manufacturing the semiconductor device according to claim 2, wherein a substrate temperature in forming the second oxide semiconductor film is higher than a substrate temperature in forming the first oxide semiconductor film.

18. The method for manufacturing the semiconductor device according to claim 3, wherein a substrate temperature in forming the second oxide semiconductor film is higher than a substrate temperature in forming the first oxide semiconductor film.

19. The method for manufacturing the semiconductor device according to claim 1, wherein the second oxide semiconductor film comprises a depression; and wherein the oxide insulating film is in direct contact with the depression of the second oxide semiconductor film.

20. The method for manufacturing the semiconductor device according to claim 2, wherein the second oxide semiconductor film comprises a depression; and wherein the oxide insulating film is in direct contact with the depression of the second oxide semiconductor film.

21. The method for manufacturing the semiconductor device according to claim 3, wherein the second oxide semiconductor film comprises a depression; and wherein the oxide insulating film is in direct contact with the depression of the second oxide semiconductor film.

* * * * *